(12) United States Patent
Sicola et al.

(10) Patent No.: US 10,572,186 B2
(45) Date of Patent: Feb. 25, 2020

(54) RANDOM ACCESS MEMORY (RAM)-BASED COMPUTER SYSTEMS, DEVICES, AND METHODS

(71) Applicant: FORMULUS BLACK CORPORATION, Jersey City, NJ (US)

(72) Inventors: Stephen J. Sicola, Monument, CO (US); Yaojie Lu, Springfield, NJ (US); Seyedamin Rooholamin, Aberdeen, NJ (US); William Pagano, Colorado Springs, CO (US)

(73) Assignee: Formulus Black Corporation, Jersey City, NJ (US)

( * ) Notice: Subject to any disclaimer, the term of this patent is extended or adjusted under 35 U.S.C. 154(b) by 0 days.

(21) Appl. No.: 16/222,543

(22) Filed: Dec. 17, 2018

(65) Prior Publication Data

US 2019/0187934 A1 Jun. 20, 2019

Related U.S. Application Data

(60) Provisional application No. 62/607,206, filed on Dec. 18, 2017, provisional application No. 62/667,333, filed on May 4, 2018.

(51) Int. Cl.
*G06F 12/00* (2006.01)
*G06F 3/06* (2006.01)

(52) U.S. Cl.
CPC .......... *G06F 3/0659* (2013.01); *G06F 3/0604* (2013.01); *G06F 3/064* (2013.01); *G06F 3/0673* (2013.01)

(58) Field of Classification Search
CPC ...... G06F 3/0659; G06F 3/064; G06F 3/0673; G06F 3/0604
See application file for complete search history.

(56) References Cited

U.S. PATENT DOCUMENTS

| 3,016,527 A | 1/1962 | Gilbert et al. |
| 3,739,410 A | 6/1973 | Fortin |

(Continued)

FOREIGN PATENT DOCUMENTS

| CA | 2327998 A1 | 6/2001 |
| CA | 2638672 A1 | 2/2009 |

(Continued)

OTHER PUBLICATIONS

Prosecution history of US 2018/0129572. (Year: 2018).*

(Continued)

*Primary Examiner* — Arvind Talukdar
(74) *Attorney, Agent, or Firm* — Knobbe, Martens, Olson & Bear, LLP

(57) ABSTRACT

In some embodiments, systems, methods, and devices disclosed herein are directed to RAM-based computer systems, methods, and devices that offer improved performance over conventional computer systems. In some embodiments, the RAM-based computer systems, devices, and methods described herein can function without reliance on conventional storage devices and thus are not subject to the bottleneck in processing speed associated with conventional storage devices. Rather, in some embodiments, the RAM-based computer systems, devices, and methods described herein include and/or utilize a processor and RAM, wherein the RAM is used for mass data storage, without reliance on a conventional hard drive, solid state drive, or any other peripheral storage device.

20 Claims, 11 Drawing Sheets

(56) References Cited

U.S. PATENT DOCUMENTS

| | | |
|---|---|---|
| 3,926,346 A | 12/1975 | Dub et al. |
| 4,183,464 A | 1/1980 | Babb |
| 4,286,256 A | 8/1981 | Langdon, Jr. et al. |
| D264,844 S | 6/1982 | Tuck |
| 4,420,767 A | 12/1983 | Hodge et al. |
| 4,560,977 A | 12/1985 | Murakami et al. |
| 4,625,710 A | 12/1986 | Harada et al. |
| 4,635,141 A | 1/1987 | Coulter |
| D304,193 S | 10/1989 | Lotz |
| D308,671 S | 6/1990 | Aderman et al. |
| 4,931,340 A | 6/1990 | Baba et al. |
| D319,765 S | 9/1991 | McCord |
| 5,168,171 A | 12/1992 | Tracewell |
| D341,866 S | 11/1993 | Ross |
| 5,300,930 A | 4/1994 | Burger et al. |
| D353,182 S | 12/1994 | Rubin |
| D357,461 S | 4/1995 | Zaplatynsky et al. |
| D362,243 S | 9/1995 | Spechts et al. |
| D366,246 S | 1/1996 | Simek et al. |
| D372,909 S | 8/1996 | Naufel |
| D377,482 S | 1/1997 | Geck |
| D382,880 S | 8/1997 | Cienkus et al. |
| D391,938 S | 3/1998 | D'Agaro |
| D393,455 S | 4/1998 | D'Agaro et al. |
| 5,748,921 A | 5/1998 | Lambrecht et al. |
| 5,751,549 A | 5/1998 | Eberhardt et al. |
| 5,784,611 A | 7/1998 | Thantrakul |
| 5,785,799 A | 7/1998 | Culnane et al. |
| D396,690 S | 8/1998 | Fryers |
| D397,097 S | 8/1998 | McNally |
| 5,797,143 A | 8/1998 | Buxton |
| 5,818,877 A | 10/1998 | Tsai et al. |
| 5,867,180 A | 2/1999 | Katayama et al. |
| 5,872,530 A | 2/1999 | Domyo et al. |
| D407,079 S | 3/1999 | Wu |
| 5,878,240 A | 3/1999 | Tomko |
| 5,890,794 A | 4/1999 | Abtahi et al. |
| D409,171 S | 5/1999 | Wu |
| 5,923,860 A | 7/1999 | Olarig |
| D415,747 S | 10/1999 | Wu |
| D421,428 S | 3/2000 | Wu |
| D422,993 S | 4/2000 | Storti et al. |
| D423,479 S | 4/2000 | Alo et al. |
| 6,052,785 A | 4/2000 | Lin et al. |
| 6,067,227 A | 5/2000 | Katsui et al. |
| D431,241 S | 9/2000 | Armstrong et al. |
| 6,182,601 B1 | 2/2001 | Baatz |
| D439,566 S | 3/2001 | Ohanian |
| 6,243,831 B1 | 6/2001 | Mustafa et al. |
| 6,275,173 B1 | 8/2001 | Wu |
| D447,484 S | 9/2001 | Reznikov et al. |
| 6,297,742 B1 | 10/2001 | Canada et al. |
| 6,297,753 B1 | 10/2001 | Hayami |
| 6,310,564 B1 | 10/2001 | Fujimoto |
| 6,326,781 B1 | 12/2001 | Kunde et al. |
| 6,373,695 B1 | 4/2002 | Cheng |
| 6,396,027 B1 | 5/2002 | Wu |
| 6,401,807 B1 | 6/2002 | Wyler et al. |
| D462,075 S | 8/2002 | Hillyard et al. |
| 6,430,351 B1 | 8/2002 | Takahashi et al. |
| 6,442,031 B1 | 8/2002 | Liu |
| 6,465,969 B1 | 10/2002 | Murasko et al. |
| 6,483,439 B1 | 11/2002 | Vukosic |
| 6,494,780 B1 | 12/2002 | Norbury, Jr. |
| D471,912 S | 3/2003 | Camarota et al. |
| 6,541,921 B1 | 4/2003 | Luciano, Jr. et al. |
| D475,061 S | 5/2003 | Huang |
| 6,560,599 B1 | 5/2003 | Boa et al. |
| 6,605,778 B2 | 8/2003 | Dorfler et al. |
| 6,614,369 B1 | 9/2003 | Widmer |
| 6,621,935 B1 | 9/2003 | Xin et al. |
| 6,626,557 B1 | 9/2003 | Taylor |
| 6,644,481 B2 | 11/2003 | Dean et al. |
| D483,374 S | 12/2003 | Hung |
| D483,378 S | 12/2003 | Mundt |
| 6,658,435 B1 | 12/2003 | McCall |
| 6,674,908 B1 | 1/2004 | Aronov |
| 6,683,545 B2 | 1/2004 | Strasser |
| D490,083 S | 5/2004 | Wu |
| 6,737,299 B1 | 5/2004 | Jiang |
| 6,785,133 B2 | 8/2004 | Barringer et al. |
| 6,785,815 B2 | 8/2004 | Serret-Avila et al. |
| 6,829,695 B1 | 12/2004 | Ross |
| 6,844,824 B2 | 1/2005 | Vukosic |
| D503,717 S | 4/2005 | Kawamura |
| 6,904,484 B1 | 6/2005 | Nelson |
| 6,905,228 B1 | 6/2005 | Takeyasu et al. |
| 6,926,972 B2 | 8/2005 | Jakobi et al. |
| 6,956,745 B2 | 10/2005 | Kerrigan et al. |
| D513,751 S | 1/2006 | Alo et al. |
| 6,999,319 B2 | 2/2006 | Wu et al. |
| 7,030,837 B1 | 4/2006 | Vong et al. |
| 7,064,265 B2 | 6/2006 | Cochrane |
| 7,111,961 B2 | 9/2006 | Trenchard et al. |
| D529,915 S | 10/2006 | Scicluna et al. |
| D530,052 S | 10/2006 | Berti |
| D530,343 S | 10/2006 | Maruyama et al. |
| D530,704 S | 10/2006 | Cortes |
| 7,145,776 B2 | 12/2006 | King, Jr. et al. |
| D535,298 S | 1/2007 | Cochrane |
| 7,164,581 B2 | 1/2007 | Carullo et al. |
| 7,174,436 B1 | 2/2007 | Langendorf et al. |
| 7,231,560 B2 | 6/2007 | Lai et al. |
| 7,246,037 B2 | 7/2007 | Evans |
| 7,290,116 B1 | 10/2007 | Grohoski et al. |
| D555,159 S | 11/2007 | Cox et al. |
| D556,204 S | 11/2007 | Tosh et al. |
| 7,298,535 B2 | 11/2007 | Kuutti |
| D565,573 S | 4/2008 | Alo |
| 7,356,679 B1 | 4/2008 | Le et al. |
| 7,357,530 B2 | 4/2008 | Wang et al. |
| 7,363,331 B2 | 4/2008 | Karasudani et al. |
| D570,851 S | 6/2008 | Gundogan et al. |
| 7,371,975 B2 | 6/2008 | Oettinger et al. |
| D579,455 S | 10/2008 | Chu |
| 7,463,163 B2 | 12/2008 | Wu |
| 7,485,510 B2 | 2/2009 | Zhu et al. |
| 7,492,607 B2 | 2/2009 | Nguyen et al. |
| D590,831 S | 4/2009 | Evans |
| 7,515,413 B1 | 4/2009 | Curtis |
| 7,516,272 B2 | 4/2009 | Felton et al. |
| 7,539,026 B2 | 5/2009 | Finnerty et al. |
| D593,565 S | 6/2009 | Dearborn et al. |
| 7,587,408 B2 | 9/2009 | Snapp et al. |
| 7,620,784 B2 | 11/2009 | Panabaker |
| D609,236 S | 2/2010 | Matsumoto et al. |
| 7,726,837 B2 | 6/2010 | Ewert |
| 7,731,180 B2 | 6/2010 | Ohnishi |
| D619,108 S | 7/2010 | Lin |
| 7,794,124 B2 | 9/2010 | Hulsey et al. |
| 7,822,946 B2 | 10/2010 | Sharma |
| D631,480 S | 1/2011 | Vaughan |
| D631,630 S | 1/2011 | Berti |
| 7,921,088 B1 | 4/2011 | Mittal |
| 7,925,389 B2 | 4/2011 | Bradicich et al. |
| 7,930,473 B2 | 4/2011 | Rajan |
| D643,434 S | 8/2011 | Grady, IV et al. |
| 7,991,941 B2 | 8/2011 | Fortin |
| 7,996,361 B1 | 8/2011 | Shah et al. |
| 8,001,079 B2 | 8/2011 | Lu et al. |
| 8,006,108 B2 | 8/2011 | Brey et al. |
| 8,009,069 B2 | 8/2011 | Chen et al. |
| D646,954 S | 10/2011 | Azelton et al. |
| 8,078,789 B2 | 12/2011 | Hinrichs |
| 8,117,028 B2 | 2/2012 | Murashima |
| D656,250 S | 3/2012 | Forster et al. |
| D656,502 S | 3/2012 | Cacioppo et al. |
| 8,129,742 B2 | 3/2012 | Lin et al. |
| 8,139,945 B1 | 3/2012 | Amir et al. |
| 8,164,490 B2 | 4/2012 | Itani |
| D659,136 S | 5/2012 | Matsumoto |
| D659,137 S | 5/2012 | Matsumoto |
| D659,653 S | 5/2012 | Lin |
| D661,696 S | 6/2012 | Takada |

(56) References Cited

U.S. PATENT DOCUMENTS

| | | |
|---|---|---|
| D662,501 S | 6/2012 | Lohman |
| D662,504 S | 6/2012 | Lohman |
| 8,200,923 B1 | 6/2012 | Healey et al. |
| D663,299 S | 7/2012 | Corke et al. |
| 8,214,425 B2 | 7/2012 | Provencal |
| 8,229,898 B1 | 7/2012 | Pype |
| 8,237,594 B2 | 8/2012 | Suzuki et al. |
| 8,238,091 B2 | 8/2012 | Chang et al. |
| 8,238,840 B2 | 8/2012 | Lio et al. |
| 8,245,235 B1 * | 8/2012 | Belady ............... G06F 11/008 706/21 |
| 8,265,323 B2 | 9/2012 | Stiehl et al. |
| 8,281,013 B2 | 10/2012 | Mundkur et al. |
| 8,290,160 B1 | 10/2012 | Steeger |
| 8,310,830 B2 | 11/2012 | Zheng et al. |
| 8,314,555 B2 | 11/2012 | Huang et al. |
| 8,322,040 B2 | 12/2012 | Jimenez |
| 8,334,838 B2 | 12/2012 | Sadahiro et al. |
| D676,039 S | 2/2013 | Wallace et al. |
| D676,852 S | 2/2013 | Lohman |
| 8,366,464 B1 | 2/2013 | Figuerado et al. |
| D678,273 S | 3/2013 | Kuehn et al. |
| D681,635 S | 5/2013 | Wang |
| D682,267 S | 5/2013 | Mase |
| 8,458,696 B2 | 6/2013 | Park et al. |
| 8,470,388 B1 | 6/2013 | Zsinko et al. |
| D685,373 S | 7/2013 | Santos et al. |
| 8,474,994 B2 | 7/2013 | Campman |
| 8,508,928 B2 | 8/2013 | Killen et al. |
| 8,547,825 B2 | 10/2013 | Armstrong et al. |
| 8,560,501 B2 | 10/2013 | Deetz |
| 8,566,288 B1 | 10/2013 | Deetz |
| 8,570,738 B2 | 10/2013 | Fan et al. |
| D694,240 S | 11/2013 | Cho |
| 8,583,194 B2 | 11/2013 | Lio et al. |
| 8,589,643 B2 | 11/2013 | Meyer et al. |
| D694,758 S | 12/2013 | Muller |
| 8,601,201 B2 | 12/2013 | Scannell et al. |
| 8,639,849 B2 | 1/2014 | Achler |
| D699,212 S | 2/2014 | Tanaka |
| D702,650 S | 4/2014 | Reed et al. |
| 8,701,108 B2 | 4/2014 | Sekiguchi et al. |
| 8,704,771 B2 | 4/2014 | Shigeta |
| D705,836 S | 5/2014 | Huschka |
| 8,715,127 B2 | 5/2014 | Beutler et al. |
| 8,717,764 B2 | 5/2014 | Sun |
| D706,780 S | 6/2014 | Abdollahi et al. |
| 8,782,463 B1 | 7/2014 | Singh |
| 8,793,684 B2 | 7/2014 | Breitgand et al. |
| D711,382 S | 8/2014 | Eriksen |
| 8,806,480 B2 | 8/2014 | Araujo, Jr. et al. |
| 8,832,352 B2 | 9/2014 | Tsirkin et al. |
| 8,839,112 B2 | 9/2014 | Neerudu et al. |
| 8,847,797 B1 | 9/2014 | Barr |
| 8,856,255 B2 | 10/2014 | Ramakrishnan et al. |
| 8,868,860 B2 | 10/2014 | Beeken |
| 8,880,470 B2 | 11/2014 | Mashtizadeh et al. |
| D719,128 S | 12/2014 | Teulie |
| D719,571 S | 12/2014 | Sugilhara et al. |
| D720,353 S | 12/2014 | Nakamura |
| D720,357 S | 12/2014 | Kwon et al. |
| 8,904,383 B2 | 12/2014 | Bash et al. |
| 8,909,884 B2 | 12/2014 | Fleming et al. |
| 8,930,647 B1 | 1/2015 | Smith |
| 8,938,643 B1 | 1/2015 | Karmarkar et al. |
| D722,060 S | 2/2015 | Kwon et al. |
| D722,995 S | 2/2015 | Moreau |
| 8,954,645 B2 | 2/2015 | North et al. |
| 8,964,385 B2 | 2/2015 | Lam et al. |
| D723,554 S | 3/2015 | Choo et al. |
| D723,555 S | 3/2015 | Choo et al. |
| 8,988,821 B2 | 3/2015 | Li |
| D726,180 S | 4/2015 | Roat et al. |
| 9,003,144 B1 | 4/2015 | Hayes et al. |
| D729,242 S | 5/2015 | Kim et al. |
| D729,809 S | 5/2015 | Akana et al. |
| D730,307 S | 5/2015 | Tang et al. |
| 9,035,786 B2 | 5/2015 | Clifford et al. |
| D731,010 S | 6/2015 | Levitt et al. |
| D731,484 S | 6/2015 | Olsson et al. |
| D733,137 S | 6/2015 | Kawai |
| 9,053,068 B2 | 6/2015 | Tsirkin et al. |
| D734,754 S | 7/2015 | Ficacci |
| D735,726 S | 8/2015 | Chen |
| 9,106,020 B2 | 8/2015 | Cohen et al. |
| 9,141,625 B1 | 9/2015 | Thornewell et al. |
| D740,817 S | 10/2015 | Ignomirello |
| D740,818 S | 10/2015 | Ignomirello |
| D741,333 S | 10/2015 | Aoyagi et al. |
| 9,170,831 B2 | 10/2015 | Robinson et al. |
| D742,876 S | 11/2015 | Ignomirello |
| D742,883 S | 11/2015 | Akana et al. |
| D742,887 S | 11/2015 | Ignomirello |
| D743,404 S | 11/2015 | Ignomirello |
| 9,183,158 B2 | 11/2015 | O'Loughlin et al. |
| 9,195,401 B2 | 11/2015 | Li et al. |
| 9,195,491 B2 | 11/2015 | Zhang et al. |
| 9,201,674 B2 | 12/2015 | Rogel et al. |
| 9,280,380 B2 | 3/2016 | Tsirkin |
| 9,304,703 B1 | 4/2016 | Ignomirello |
| 9,317,326 B2 | 4/2016 | Ramanathan et al. |
| 9,336,042 B1 | 5/2016 | Brennerman et al. |
| 9,336,050 B2 | 5/2016 | Nakata et al. |
| 9,354,918 B2 | 5/2016 | Gupta et al. |
| 9,377,963 B2 | 6/2016 | Colbert et al. |
| 9,389,937 B2 | 7/2016 | Ackaret et al. |
| 9,438,534 B2 | 9/2016 | Xia et al. |
| D768,135 S | 10/2016 | Ignomirello |
| D768,136 S | 10/2016 | Ignomirello |
| 9,467,294 B2 | 10/2016 | Ignomirello |
| 9,552,217 B2 | 1/2017 | Tarasuk-Levin et al. |
| 9,558,005 B2 | 1/2017 | Sathyanarayana |
| 9,582,303 B2 | 2/2017 | Shu et al. |
| 9,582,319 B2 | 2/2017 | Ayala et al. |
| 9,584,312 B2 | 2/2017 | Ignomirello |
| 9,603,251 B1 | 3/2017 | Ignomirello |
| 9,628,108 B2 | 4/2017 | Ignomirello |
| D786,258 S | 5/2017 | Ignomirello |
| 9,672,054 B1 | 6/2017 | Gupta et al. |
| 9,715,347 B2 | 7/2017 | Ryu et al. |
| 9,753,768 B2 | 9/2017 | Chandrasekaran |
| 9,766,945 B2 | 9/2017 | Gaurav et al. |
| 9,870,834 B2 | 1/2018 | Li et al. |
| 10,061,514 B2 | 8/2018 | Ignomirello |
| 10,120,607 B2 | 11/2018 | Ignomirello |
| 10,133,636 B2 | 11/2018 | Ignomirello |
| 10,346,047 B2 | 7/2019 | Ignomirello |
| 2002/0056031 A1 | 5/2002 | Skiba et al. |
| 2002/0122597 A1 | 9/2002 | Kikuchi et al. |
| 2002/0145545 A1 | 10/2002 | Brown |
| 2002/0172203 A1 | 11/2002 | Ji et al. |
| 2003/0018759 A1 | 1/2003 | Baumann |
| 2003/0115447 A1 | 6/2003 | Pham et al. |
| 2003/0122694 A1 | 7/2003 | Green |
| 2003/0212883 A1 * | 11/2003 | Lee ............... G06F 9/5077 713/1 |
| 2004/0017651 A1 | 1/2004 | Gan et al. |
| 2004/0143733 A1 | 7/2004 | Ophir et al. |
| 2004/0262409 A1 | 12/2004 | Crippen et al. |
| 2005/0091440 A1 | 4/2005 | Isa et al. |
| 2005/0099319 A1 | 5/2005 | Hutchison et al. |
| 2005/0191520 A1 | 9/2005 | Guntermann et al. |
| 2005/0198076 A1 | 9/2005 | Stata et al. |
| 2005/0210314 A1 | 9/2005 | Iguchi |
| 2005/0288800 A1 | 12/2005 | Smith et al. |
| 2006/0006517 A1 | 1/2006 | Lee et al. |
| 2006/0049956 A1 | 3/2006 | Taylor et al. |
| 2006/0171050 A1 | 8/2006 | Hanson et al. |
| 2006/0174140 A1 | 8/2006 | Harris et al. |
| 2006/0212644 A1 | 9/2006 | Acton et al. |
| 2006/0212692 A1 | 9/2006 | Ueno et al. |
| 2006/0248273 A1 | 11/2006 | Jernigan, IV |
| 2006/0256866 A1 | 11/2006 | Ziauddin et al. |
| 2006/0285287 A1 | 12/2006 | Chen et al. |

(56) References Cited

U.S. PATENT DOCUMENTS

| | | |
|---|---|---|
| 2007/0081320 A1 | 4/2007 | Gilbert |
| 2007/0087586 A1 | 4/2007 | Karamooz |
| 2007/0101074 A1 | 5/2007 | Patterson |
| 2007/0164875 A1 | 7/2007 | Fredericks et al. |
| 2007/0180207 A1 | 8/2007 | Garfinkle |
| 2007/0206375 A1 | 9/2007 | Piepgras et al. |
| 2007/0236334 A1 | 10/2007 | Borovoy et al. |
| 2007/0291934 A1 | 12/2007 | Volkovs et al. |
| 2008/0005380 A1 | 1/2008 | Kawasaki et al. |
| 2008/0054845 A1 | 3/2008 | Wang |
| 2008/0059702 A1 | 3/2008 | Lu et al. |
| 2008/0062020 A1 | 3/2008 | Lakbecker |
| 2008/0077586 A1 | 3/2008 | Lam |
| 2008/0133835 A1 | 6/2008 | Zhu et al. |
| 2008/0148254 A1* | 6/2008 | Hofer ............... G06F 9/5077 717/174 |
| 2008/0243992 A1 | 10/2008 | Jardetzky et al. |
| 2008/0291664 A1 | 11/2008 | Pesenti |
| 2008/0307128 A1 | 12/2008 | Amron et al. |
| 2008/0310628 A1 | 12/2008 | Fujioka et al. |
| 2009/0006640 A1 | 1/2009 | Brouwer et al. |
| 2009/0040032 A1 | 2/2009 | Gerber |
| 2009/0055593 A1 | 2/2009 | Satoyama et al. |
| 2009/0061756 A1 | 3/2009 | Germagian |
| 2009/0100236 A1 | 4/2009 | Puig |
| 2009/0112880 A1 | 4/2009 | Oliveira et al. |
| 2009/0115646 A1 | 5/2009 | Duxbury |
| 2009/0119468 A1 | 5/2009 | Taylor et al. |
| 2009/0129691 A1 | 5/2009 | Luttmer et al. |
| 2009/0141435 A1 | 6/2009 | Kreiner et al. |
| 2009/0169001 A1 | 7/2009 | Tighe et al. |
| 2009/0193161 A1 | 7/2009 | Yoshida |
| 2009/0208221 A1 | 8/2009 | Sasai |
| 2009/0231153 A1 | 9/2009 | Hauenstein et al. |
| 2009/0300301 A1 | 12/2009 | Vaghani |
| 2009/0303709 A1 | 12/2009 | Weatherley |
| 2009/0307251 A1 | 12/2009 | Heller et al. |
| 2010/0076527 A1 | 3/2010 | Hammond et al. |
| 2010/0162039 A1 | 6/2010 | Goroff et al. |
| 2010/0169287 A1 | 7/2010 | Klose |
| 2010/0211737 A1 | 8/2010 | Flynn et al. |
| 2010/0245665 A1 | 9/2010 | Chrnega et al. |
| 2010/0250501 A1 | 9/2010 | Mandagere et al. |
| 2010/0253617 A1 | 10/2010 | Lio et al. |
| 2010/0257269 A1 | 10/2010 | Clark |
| 2010/0306294 A1 | 12/2010 | Schneider |
| 2011/0035361 A1 | 2/2011 | Soga |
| 2011/0107112 A1 | 5/2011 | Resch |
| 2011/0137519 A1 | 6/2011 | Christie |
| 2011/0170872 A1 | 7/2011 | Shin et al. |
| 2011/0276771 A1 | 11/2011 | Tajima et al. |
| 2011/0289294 A1 | 11/2011 | Maeda et al. |
| 2012/0076298 A1 | 3/2012 | Bolotov et al. |
| 2012/0124282 A1 | 5/2012 | Frank et al. |
| 2012/0131293 A1 | 5/2012 | Benhase et al. |
| 2012/0159282 A1 | 6/2012 | Ito |
| 2012/0166448 A1 | 6/2012 | Li et al. |
| 2012/0166757 A1 | 6/2012 | Volvovski et al. |
| 2012/0191982 A1 | 7/2012 | Levin |
| 2012/0209448 A1 | 8/2012 | Brower |
| 2012/0209559 A1 | 8/2012 | Brower |
| 2012/0239860 A1 | 9/2012 | Atkisson et al. |
| 2012/0246472 A1 | 9/2012 | Berengoltz |
| 2012/0278382 A1 | 11/2012 | Faith |
| 2012/0278553 A1 | 11/2012 | Mudhiganti et al. |
| 2012/0285738 A1 | 11/2012 | Cochrane et al. |
| 2012/0303359 A1 | 11/2012 | Mizuguchi et al. |
| 2012/0330894 A1 | 12/2012 | Slik |
| 2013/0013618 A1 | 1/2013 | Heller et al. |
| 2013/0019076 A1 | 1/2013 | Amidi et al. |
| 2013/0106297 A1 | 5/2013 | Yeh |
| 2013/0111166 A1 | 5/2013 | Resch et al. |
| 2013/0138764 A1 | 5/2013 | Satapathy |
| 2013/0148457 A1 | 6/2013 | Sweere et al. |
| 2013/0211608 A1 | 8/2013 | Farrell et al. |
| 2013/0212161 A1 | 8/2013 | Ben-Shaul et al. |
| 2013/0268812 A1 | 10/2013 | Liu et al. |
| 2013/0283038 A1 | 10/2013 | Kulkarni et al. |
| 2014/0062307 A1 | 3/2014 | Spencer et al. |
| 2014/0082324 A1 | 3/2014 | Elhamias et al. |
| 2014/0119028 A1 | 5/2014 | Sato et al. |
| 2014/0146514 A1 | 5/2014 | Yahata |
| 2014/0211423 A1 | 7/2014 | Nguyen et al. |
| 2014/0223118 A1 | 8/2014 | Ignomirello |
| 2014/0223196 A1 | 8/2014 | Ignomirello |
| 2014/0258533 A1 | 9/2014 | Antony |
| 2014/0259014 A1 | 9/2014 | Watanabe et al. |
| 2014/0279911 A1 | 9/2014 | Ignomirello |
| 2014/0281257 A1 | 9/2014 | Hochberg et al. |
| 2014/0297938 A1 | 10/2014 | Puthiyedath et al. |
| 2014/0313043 A1 | 10/2014 | Heydron |
| 2014/0313700 A1 | 10/2014 | Connell et al. |
| 2014/0333449 A1 | 11/2014 | Thiesfeld et al. |
| 2015/0015405 A1 | 1/2015 | Bark et al. |
| 2015/0026516 A1 | 1/2015 | Yong et al. |
| 2015/0052282 A1 | 2/2015 | Dong |
| 2015/0058543 A1 | 2/2015 | Chan et al. |
| 2015/0084270 A1 | 3/2015 | Lo et al. |
| 2015/0095443 A1 | 4/2015 | Yang et al. |
| 2015/0098205 A1 | 4/2015 | Keranen et al. |
| 2015/0117019 A1 | 4/2015 | Kuenzler et al. |
| 2015/0131965 A1 | 5/2015 | Yoshioka |
| 2015/0163060 A1 | 6/2015 | Tomlinson et al. |
| 2015/0211916 A1 | 7/2015 | McGinn et al. |
| 2015/0212263 A1 | 7/2015 | Tzeng |
| 2015/0254092 A1* | 9/2015 | Chandrasekaran ........................ G06F 9/45558 718/1 |
| 2015/0309839 A1 | 10/2015 | Lu |
| 2015/0324388 A1 | 11/2015 | Benke et al. |
| 2016/0011802 A1 | 1/2016 | Berke |
| 2016/0043484 A1 | 2/2016 | Brodsky et al. |
| 2016/0085022 A1 | 3/2016 | Yang et al. |
| 2016/0092203 A1 | 3/2016 | Filali-Adib et al. |
| 2016/0196158 A1 | 7/2016 | Nipane et al. |
| 2016/0217047 A1 | 7/2016 | Ignomirello et al. |
| 2016/0218737 A1 | 7/2016 | Ignomirello |
| 2016/0232839 A1 | 8/2016 | Ignomirello |
| 2016/0283390 A1 | 9/2016 | Coulson |
| 2016/0378547 A1 | 12/2016 | Brouwer et al. |
| 2017/0026172 A1 | 1/2017 | Ignomirello |
| 2017/0220498 A1 | 8/2017 | Ignomirello |
| 2017/0221322 A1 | 8/2017 | Ignomirello |
| 2018/0129572 A1* | 5/2018 | Ignomirello ........ G06F 11/1469 |
| 2018/0267865 A1 | 9/2018 | Ignomirello et al. |
| 2019/0146881 A1 | 5/2019 | Ignomirello |

FOREIGN PATENT DOCUMENTS

| | | |
|---|---|---|
| CN | 201426214 Y | 3/2010 |
| CN | 102611560 A | 7/2012 |
| CN | 203327301 U | 12/2013 |
| EP | 0403232 A2 | 12/1990 |
| EP | 2393009 A1 | 12/2011 |
| EP | 2897018 A1 | 7/2015 |
| GB | 2407427 A | 4/2005 |
| JP | H07-504541 A | 5/1995 |
| JP | 2000-31831 A | 1/2000 |
| JP | 2007-272826 | 10/2007 |
| JP | 2007-281763 A | 10/2007 |
| JP | 2008-107615 A | 5/2008 |
| JP | 2008-165293 | 7/2008 |
| JP | 2009-059096 | 3/2009 |
| JP | 2009-524882 | 7/2009 |
| JP | 2009-251725 | 10/2009 |
| JP | 2010-512057 A | 4/2010 |
| JP | 2010072740 | 4/2010 |
| JP | 2011-203842 | 10/2011 |
| JP | 2012-027587 | 2/2012 |
| JP | 2012-80470 A | 4/2012 |
| JP | 2012-129785 A | 7/2012 |
| WO | WO 2006/042019 A2 | 4/2006 |
| WO | WO 2006/042041 A2 | 4/2006 |
| WO | WO 2009/009719 | 1/2009 |

(56) References Cited

FOREIGN PATENT DOCUMENTS

| WO | WO 2010/138824 A2 | 12/2010 |
|----|-------------------|---------|
| WO | WO 2012/117658    | 7/2012  |
| WO | WO 2014/121102 A2 | 8/2014  |
| WO | WO 2014/170617 A1 | 10/2014 |
| WO | WO 2015/039181 A1 | 3/2015  |
| WO | WO 2016/168007 A1 | 10/2016 |
| WO | WO 2017/176523 A1 | 10/2017 |

OTHER PUBLICATIONS

International Search Report and Written Opinion dated Apr. 26, 2019, issued in connection with corresponding International Application No. PCT/US2018/066076 (9 pages total).
"CleanSync 2.0", CleanSync Team, retrieved from http://www.top4download.com/cleansync/xfliyozl.html, dated Feb. 25, 2012, 3 pages.
"Disk Cloning and Mass System Deployment" retrieved from http://www.drive-image.com/Disk_Cloning_and_Mass_System_Deployment.shtml, 21 pages.
"Enabling Memory Reliability, Availability, and Serviceability Features on Dell PowerEdge Servers," http://citeseerx.ist.psu.edu/viewdoc/download?doi=10.1.1.692.4199&rep=rep1&type=pdf, Dell Power Solutions, Aug. 2015.
"IBM TotalStorage Enterprise Server Model 800", IBM, retrieved from http://ps-2.kev009.com/rs6000/manuals/SAN/ESS/ESS800_Product_Data_sheet.pdf, dated 2003, 6 pages.
"Lenovo Servers RAS Features," https://youtu.be/zZyDxnCUE4c, Jan. 11, 2016.
"Memory RAS technologies for HPE ProLiant/Synergy/Blade Gen10 servers with Intel Xeon scalable processors", retrieved from https://www.hpe.com/h20195/V2/GetPDF.aspx/4AA4-3490ENW.pdf, Hewlett Packard Enterprises, Oct. 2017, 9 pages.
"Ntfsclone-Efficiently clone, image, restore or rescue an NTFS", Ubuntu, retrieved from http://manpages.ubuntu.com/manpages/gutsy/man8/ntfsclone.8.html, 4 pages.
"Restore a System Image BackUp to Computer with Dissimilar Hardware", AOMEI, retrieved from http://www.backup-utility.com/features/dissimilar-hardware-restore.html, 5 pages.
"Revisiting Memory Errors in Large-Scale Production Data Centers: Analysis and Modeling ofNew Trends from the Field" by Justin Meza, Qiang Wu, Sanjeev Kumar, and Onur Mutlu,Carnegie Mellon University and Facebook, Inc., 2015 {Facebook fleet analysis over 14 months}.
Alibaba, "new arrival fashion design zinc alloy metal U shap handle for leather of bag accessories qifeng f-994", retrieved on Jul. 18, 2015 from http://alibaba.com/product-detail/new-arrival-fasion-design-zinc-alloy_1402892576.html?smToken=f4543babcb5440fda870ba4c2a621f1c&smSign=2q%Bp5jXRBjWkFnOu62%2Fy%2Fw%3D%3D, 1 page.
Aliexpress, "F238F 3.5" Hot-Swap SAS/SATA Hard Disk Drive Caddy/Tray, retrieved on Jul. 14, 2015 from http://www.aliexpress.com/store/product/F238F-3-5-Hot-Swap-SAS-SATA-Hard-Disk-Drive-Caddy-Tray/1129178_1677183967.html, 1 Page.
All Data Parts, "ICY DOCK ToughArmor MB992SK", retrieved on Jan. 29, 2016 from http://www.alldataparts.com/index.php?main_page=product_info&cPath=59_699_714&products_id=65914&zenid=c7a2e4f22f81deb6482a7df9318ad922, 2 pages.
American Standard Circuits, Inc., "High Temperature Organic Adhesive Bonding Films", retrieved from http://www.asc-i.com/preview/technology/thermal-management/, on May 26, 2015, 5 pages.
Anonymous: "Find Seed from Random Numbers", Blitz Research Programming Forums, Dec. 4, 2011 (Dec. 4, 2011), XP055297586, retrieved from the Internet: http://web.archive.org/web/20111204053405/http://blitzbasic.com/Community/posts.php?topic=61025 (5 pages total).
Anonymous: "Huffman Coding", Wikipedia, the free encyclopedia, Jan. 18, 2013 (Jan. 18, 2013), pp. 1-10, XP055303125, Retrieved from the Internet: http://en.wikipedia.org/w/index.phptitle=Huffmancoding&oldid=533661878 [retrieved on Sep. 15, 2016] (10 pages total).
Anonymous: "Zero suppression", Wikipedia, the free encyclopedia, Jul. 25, 2012 (Jul. 25, 2012), XP055303438, Retrieved from the Internet: http://en.wikipedia.org/w/index.php?title=Zero suppression &oldid=504088023 (retrieved on Sep. 16, 2016) (2pages total).
Backblaze, "Backblaze Faceplates", Sep. 8, 2015, retrieved on Jan. 29, 2016 from hllps://www.backblaze.com/blog/the-next-backblaze-face-plate/, 9 pages.
CCLonline, "COUGAR MX300 Gamer Case, ATX, No PSU, Max 7 Fans, 7 PCI Cards, USB 3.0, Honeycomb Front", retrieved on Jul. 14, 2015 from http://www.cclonline.com/product/167472/MX300/Cases/COUGAR-MX300-Gamer-Case-ATX-No-PSU-Max-7-Fans-7-PCI-Cards-USB-3-0-Honeycomb-Front/CAS1679/, 2 pages.
Chapter 15. "Cooling of Electronic Equipment", retrieved from http://highered.mheducation.com/sites/dl/free/0073398128/835451/Chapter15.pdf, 70 pages.
Checkline Europe, "ZT-DPU Digital Force Guage with luminescent display & remote sensor," retrieved on Jul. 17, 2015 from http://www.checkline-eurpe.co.uk/digital_force_gauges1/ZT-DPU, 6 pages.
Chung et al., "Low Tg Epoxy Adhesives for Thermal Management", retrieved from www.aitechnology.com/uploads/pdf/WHITE%20PAPER/lowTgEpoxy.pdf, 14 pages.
Cisco, "10 Gigabit Ethernet Switching for High-Performance, Rack-Optimized Server Switiching", retrived on Jul. 18, 2015 from http://www.cisco.com/c/en/us/products/collateral/switches/catalyst-4900-series-switches/product_data_sheet0900aecd80246552.html, 14 pages.
Cisco, "Cisco Catalyst 4948 10 Gigabit Ethernet Switch Data Sheet", retrieved on Jul. 20, 2015 from http://www.cisco.com/c/en/us/products/collateral/switches/catalyst-4900-series-switches/product_data_sheet0900aecd80246552.html, 14 pages.
Cisco, "Cisco HDT Network Storage Hard Drive Trays Cisco Small Business Network Storage Systems", retrieved on Jul. 20, 2015 from http://www.cisco.com/c/en/us/products/collateral/storage-networking/hdt-network-storage-hard-drive-trays/data_sheet_c78-502733.pdf, 3 pages.
Cisco, "Replacing Cisco ASR 9000 Series Router Components", retrieved on Jan. 29, 2016 from http://www.cisco.com/c/en/us/td/docs/routers/asr9000/hardware/installation/guide/asr9kHIGbk/asr9klGmaintaining.html, 15 pages.
Cisco, "Replacing the Cisco 3745 Faceplate/Fan Tray", manual, retrieved on Jul. 14, 2015 from http://www.cisco.com/public/scc/compass/3700/tasks-task_3745_faceplate_replace.htm, 1 Page.
Colo Advisor, "High Density Colocation—Planning Pays Off", retrieved on Jul. 18, 2015 from http://www.coloadvisor.com/blog/high-density-colocation-planning-pays-off/, 5 Pages.
D. Tang et al., "Assessment of the Effect of Memory Page Retirement on System RAS Against Hardware Faults," DSN, 2006.
Delcom Products, "USB Visual Signal Indicator Rgb", retrieved on Apr. 4, 2016 from https://www.delcomproducts.com/productdetails.asp?prodcutnum=804000, 2 pages.
Dell, "Hard Disk Drive Caddy or Tray", retrieved on Jan. 29, 2016 from http://www.aliexpress.com/store/producl/F238F-3-5-Hot-Swap-SAS-SATA-Hard-Disk-Drive-Caddy-Tray/1129178_1677183967.html, 4 Pages.
Dell, "Installing Enclosure Components", retrieved on Jul. 18, 2015 from http://ftp.respmech.com/pub/MD3000/en/ MD3000_0wners_Manual/install.htm, 11 Pages.
DHGate, 120mm Apexi 3 in 1 Guage hu's Store Dhgate, retrieved on Jul. 17, 2015 from http://webcache.googleusercontent.com/search?q=cache:YpQK9gy7APQJ:www.dhgate.com/store/product/120mm-apexi-3-in-1-guage-tachometer-rpm-water/141993290.html+&cd=6&hl=en&ct=clnk&gl=in, 3 pages.
Dictionary Techniques, C.M. Liu, National Chiao-Tung University Website, Dec. 31, 2010, website: http://people.cs.nctu.edu.tw/~cmliu/Courses/Compression/chap5.pdf, 137 pages.
DRAM errors in the wild: a large-scale field study, Bianca Schroeder, Eduardo Pinheiro, Wolf-Dietrich Weber, Sigmetrics/Performance'09, Jun. 15-19, 2009, Seattle, WA, USA {largescale Google study for 2.5 years}.

(56) References Cited

OTHER PUBLICATIONS

Ebay, "Dell PowerEdge M610 Server 2XQUAD Core 2.8GHz/ X5560 64GB 2X300GB RAID RAILS", retrieved on Jul. 18, 2015 from http://www.ebay.ca/itm/271899179228?rmvSB=true, 3 pages.
Ebay, "Vintage VGC CHROME Chevron Boomerang DRAWER Cabinet Door Pulls Washington", retrieved on Jul. 18, 2015 from http://www.ebay.com/itmNintage-VGC-CHROME-Chevron-Boomerang-DRAWER-Cabinet-Door-Pulls-Washington/ 200818869564? trksid=p204 7675.c100005.m 1851&_trkparms= aid%3D222007%26algo%3DSIC.MBE% D26ao%3D1%26asc% 3D32298%26meid%3D3280c5c9af794a00afd5a 1 a69fc33f59% 26pid%3D, 1 Page.
Edwards Signaling, "125XBRi Series XTRA-BRITE", Data Sheet ES001-0114, No. 1, retrieved on Apr. 4, 2016 from https://edwards-signals.com/files/125XBRI_Series_datasheet_v10.pdf, 2 pages.
EZ-PC, "Infrastructure and Networking", retrieved on Jul. 18, 2015 from http://www.ez-pc.org/services/infrastruture, 3 pages.
Frostytech, "Copper Honeycomb Concept Heatsink—BBHS Thermal Solutions Corp", retrieved on Jul. 14, 2015 from http://www.frostytech.com/permalinkArch.cfm?NewsID=88219, 1 Page.
Gilbert, "The Bus (PCI and PCI-Express)", retrieved from hppt:// www.yale.edu/pclt/PCHW/BUS.HTM on Apr. 28, 2015 dated Jan. 4, 2008, 5 pages.
Hague Registration No. DM/056877, retrieved on Jul. 18, 2015 from http://www.wipo.int/designdb/hague/en/showData.jsp?SOURCE= HAGUE&KEY=DM056877, 3 page.
Hardware Secrets, "Everything You Need to Know About the PCI Express", retrieved from http://www.hardwaresecrets.com/article/ EverythingYouNeedtoKnowAboutthePCIExpress/190 on Jul. 12, 2012, 3 pages.
Hewlett Packard (HP), "Best Practices for HP BladeSystem Deployments using HP Serviceguard Solutions for HP-UX 11i", HP Publication No. 5697-0470, May 2010, pp. 1-26.
Highly Relable Systems, "RAIDFrame DAS 5000", retrieved on Jan. 29, 2016 from https://www.high-rely.com/products/ raidframe5bay/ 1 page.
Highly Reliable Systems, "MPac-G2 Media Tray", retrieved on Jan. 29, 2016 from https:/lwww.high-rely.com/products/mpac-media/, 1 page.
IDOTPC, "BR-0804 4pc/set Rackmount Half-1 U Joint Plate Kit", retrieved on Jul. 18, 2015 from http://www.idotpc.com, thestore/ pc/BR-0804-4pc-set-Rackmount-Half-1U-Joint-Plate-Kit-p1343. htm, 1 Page.
Intel, "Intel 64 and IA-32 Architectures Optimization Reference Manual", Manual, Sep. 2014, 642.
International Computer Concepts Inc, "PCI & PCIe Overview/ Comparision", retrieved from http://www.iccusa.com/comparepci/ on Apr. 28, 2015, 5 pages.
Koike et al. Analyse validity of dedup technology, Information Processing Association Reports, 2011, 6, "DVD-ROM", Japan, General Legal Entity, Information Processing Society, May 1, 2012, vol. 2012-EVA-37, No. 1, pp. 1 to 6.
Lillibridge, M., Eshghi, K., Bhagwat, D., Deolalikar, V., Trezise, G., and Camble, P. 2009. Sparse indexing: Large scale, inline deduplication using sampling and locality. In Proceedings of the 7th USENIX Conference on File and Storage Technologies (FAST). USENIX Association, Berkely, CA, 111-123.
Mactech, "NES Cartridge External Hard Drive", retrieved on Jul. 18, 2015 from http://www.mactech.com/category/ type-article/ macmod-web-site/miscellaneous-mods, 2 Pages.
Makatos, Thano, et al., ZBD: Using Transparent Compression at the Block Level to Increase Storage Space Efficiency, IEEE Computer Society pp. 61-70 (2010).
McCabe, "How to Add a Hard Drive to Your Windows Home Server", Information Week Network Computing, retrieved on Jul. 14, 2015 from http://www.networkcomputing.com/storage/how-to-add-a-hard-drive-to-your-windows-home-server-/d/d-id/1098397?, 3 Pages.

Oracle Corp, "I/O Domains and PCI Express Buses", retrieved from docs.oracle.com/cd/E1960401/8210406/ configurepciexpressbusesacrossmultipledoms/index.html on Apr. 28, 2015, 3 pages.
Philips, "Philips AZ302/98 CD Sound Machine", retrieved on Feb. 5, 2016 from http://www.naaptol.com/portable-speakers/philips-az302/p/641367.html, 3 pages.
Saduqulla et al., "Threshold Proxy Re-Encryption in Cloud Storage System", International Journal of Advanced Research in Computer Science and Software Engineering, vol. 3, Issue 11, retrieved from http://www.ijarcsse.com/docs/papers/Volume_3/11_November2013N3/ 11-0332.pdf, dated Nov. 2013, 5 pages.
Samsung Memory DDR4 SDRAM, http://www.samsung.com/us/ dell/pdfs/DDR4_Brochure_2015.pdf, Samsung Electronic Co., 2 pages, 2015.
Seagate, SCSI Commands Reference Manual (Feb. 14, 2006).
Smith, Steven W. Data Compression Tutorial: Part 1,: EE Times, Jun. 14, 2007.
Startech, "Hot Swap Hard Drive Tray for SATSASBAY3BK", retrieved on Feb. 1, 2016 from http://www.startech.com/HDD/ Mobile-Racks/Extra-25inch-or-35inch-Hot-Swap-Hard-Drive-Tray-for-SATSASBAY3BK~SATSASTRAYBK, 3 pages.
Sun Microsystems, Best Practices for Sun StorEdge 6920 System (Nov. 2004).
Symbolic IO Corporation, International Search Report and Written Opinion dated May 3, 2016, for PCT/US16/25988, 8 pages.
Tate, Jon, et al., Real-time Compression in SAN Volume Controller and the Storwize V 7000, IBM (Aug. 17, 2012).
Weil, Sage A., CRUSH: Controlled, Scalable, Decentralized Placement of Replicated Data; IEEE—2006; p. 1-12.
Wylie et al., "Selecting the right data distribution scheme for a survivable storage system", CMU-CS-01-120, Carnegie Mellon University, retrieved from http://www.pdl.cmu.edu/PDL-FTP/Storage/ CMU-CS-01-120.pdf, dated May 2001, 23 pages.
XILINX, Inc., Virtex-5 Family Overview, Feb. 6, 2009, 13 pages.
"Elastic Online Analytical Processing on RAMCloud4," Tinnefeld et al., EDBT/ICDT (Mar. 18-22, 2013), available at https:// openproceedings.org/2013/conf/edbt/TinnefeldKGBRSP13.pdf.
"RamCloud Project", accessed Apr. 3, 2018, available at https:// ramcloud.atlassian.net/wiki/spaces/RAM/overview.
"Breakthrough Nonvalatile Memory Technology," Micron, 3D Xpoint Technology, accessed Apr. 3, 2018, available at https://www.micron. com/products/advanced-solutions/3d-xpoint-technology.
European Search Report issued Sep. 5, 2016 in connection with corresponding EP Patent Application No. 16165443.9 (9 pages total).
Extended European Search Report dated Sep. 19, 2016 issued in connection with corresponding EP Application No. 14745861.6 (9 pages total).
Extended European Search Report dated Aug. 10, 2016 issued in connection with corresponding EP Application No. 14745756.8 (9 pages total).
International Preliminary Report on Patentability dated Aug. 13, 2015 issued in connection with International Application No. PCT/ US2014/014209, 8 pages.
International Preliminary Report on Patentability dated Aug. 13, 2015 issued in connection with International Application No. PCT/ US2014/014225, 7 pages.
International Search Report and Written Opinion dated Apr. 14, 2017, issued in connection with corresponding International Application No. PCT/US2017/015544 (13 pages total).
International Search Report and Written Opinion dated Aug. 20, 2014 issued in connection with International Application No. PCT/ US2014/014209, 5 pages.
International Search Report and Written Opinion dated Jan. 16, 2015 issued in connection with International Application No. PCT/ US2014/014225, 2 pages.
International Search Report for International Application No. PCT/ US17/24692 dated Jul. 27, 2017.
Japanese Office Action dated Sep. 20, 2016, issued in connection with corresponding Japanese Patent Application No. 2016-080683 (8 pages total).

(56) References Cited

OTHER PUBLICATIONS

Japanese Office Action dated Mar. 14, 2017, issued in connection with corresponding JP Application No. 2016-080683 (9 pages total).

* cited by examiner

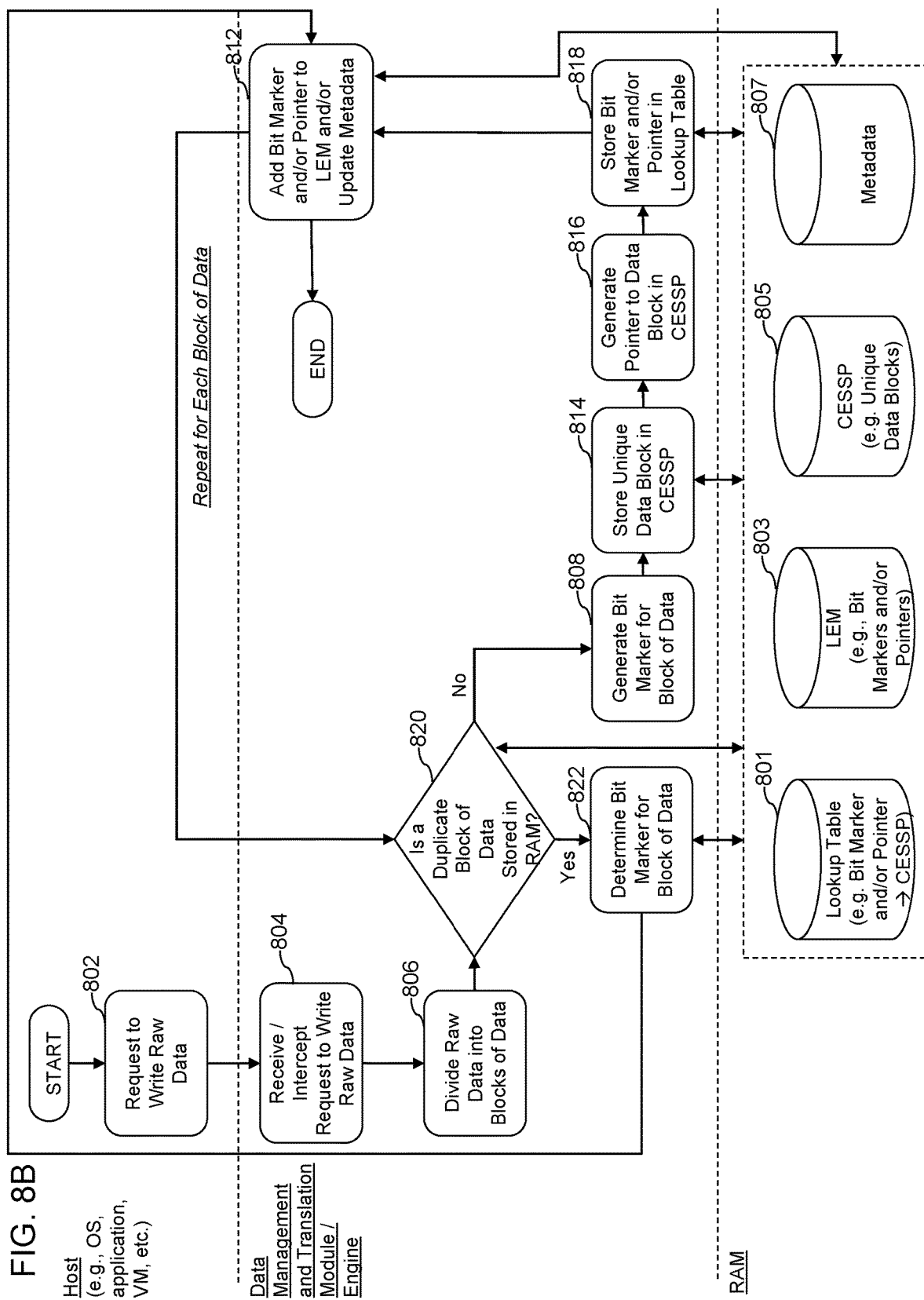

RANDOM ACCESS MEMORY (RAM)-BASED COMPUTER SYSTEMS, DEVICES, AND METHODS

CROSS-REFERENCE TO RELATED APPLICATIONS

This application claims the benefit of U.S. Provisional Application No. 62/607,206, filed Dec. 18, 2017, and titled SYSTEMS, DEVICES AND METHODS DIRECTED TO BIT MARKER AND/OR MEMORY SWITCH BASED COMPUTING SYSTEMS, and claims the benefit of U.S. Provisional Application No. 62/667,333, filed May 4, 2018, and titled RANDOM ACCESS MEMORY (RAM)-BASED COMPUTER SYSTEMS. Each of the foregoing applications is hereby incorporated by reference in their entirety.

BACKGROUND

Field

This application relates to computer systems, devices, and methods, and in particular, to random access memory (RAM)-based computer systems, devices, and methods that may primarily rely on RAM for data storage, allowing a processor of the computer systems to store and access data in a highly efficient manner.

Description

In recent years, most computer systems have been based on the Von Neumann architecture and have included a processor connected to a main (or primary) memory and a peripheral bus allowing connection to additional components, such as mass storage devices. Generally, the main memory stores data that is directly accessed by the processor over a high-speed memory bus, and the peripheral bus, which is generally much slower than the memory bus, allows access to data on the mass or peripheral storage devices. The main memory can include RAM, which is generally volatile, while the mass or peripheral storage devices accessed over the peripheral bus can include conventional storage devices, such as hard disk drives (HDDs), solid state drives (SSDs), and the like. In general, the main memory can store active data being used by the processor, and the mass or peripheral storage devices can store passive data for long term data storage. The main memory is generally smaller and faster than the mass storage devices which are generally larger and slower.

Peripheral buses can allow almost infinite expansion but with slower access based on the amount of mass storage devices connected thereto. Main memory is typically smaller because it is much more expensive than peripheral storage. Since the advent of dynamic random access memory (DRAM), peripheral storage has been intimately involved in the running of applications for random IO. Previously, peripheral storage was only used for streaming in raw data and streaming out derived information from the application. This is all because DRAM is volatile and loses its contents upon power loss.

SUMMARY

Various embodiments described herein relate to systems, methods, and devices random access memory (RAM)-based computer systems, devices, and methods that may primarily rely on RAM for data storage, allowing a processor of the computer systems to store and access data in a highly efficient manner.

In particular, in some embodiments, a computing system comprises: a processor; a random access memory storage; a conventional storage device, wherein the conventional storage device is hard disk drive or a solid state disk; the processor electrically connected to the random access memory storage and the conventional storage device; the processor configured to primarily store data in the random access memory storage using a plurality of bit markers stored in the random access memory storage, wherein the stored data in the random access memory is lost when power is not supplied to the random access memory storage; the processor configured to process data by only reading and writing data from and to the random access memory storage; the processor configured to only copy data from the random access memory storage to store as a backup in the conventional storage device, the bit markers configured to enable storage of more data in the random access memory storage than storage of data in the random access memory storage without the use of the plurality of bit markers.

In some embodiments of the foregoing computing system, the random access memory storage is further configured to store a plurality of unique blocks of data corresponding to the plurality of bit markers stored in the random access memory storage. In some embodiments of the foregoing computing system, the random access memory storage comprises a capacity efficient shared storage pool (CESSP) for storing the plurality of unique blocks of data corresponding to the plurality of bit markers stored in the random access memory storage. In some embodiments of the foregoing computing system, the random access memory storage comprises a table comprising mapping data of the plurality of unique blocks of data to the corresponding plurality of bit markers stored in the random access memory storage. In some embodiments of the foregoing computing system, the random access memory storage comprises a logical extended memory (LEM) comprising the plurality of bit markers and a plurality of pointers, wherein the plurality of pointers comprise location data of the plurality of unique blocks of data stored in the random access memory storage.

Some embodiments of the foregoing computing system, further comprises a data management module, wherein the data management module is configured to intercept and process read and write requests from the processor. In some embodiments of the foregoing computing system, the data management module is configured to divide raw data of a write request from the processor into a plurality of blocks of raw data and determine whether each of the plurality of blocks of raw data are pre-stored in the random access memory storage. In some embodiments of the foregoing computing system, the data management module is further configured to store in the random access memory a first block of raw data that was determined not to be pre-stored in the random access memory and assign a first bit marker corresponding to the first block of raw data. In some embodiments of the foregoing computing system, the data management module is further configured to retrieve a second bit marker from the random access memory corresponding to a second block of raw data that was determined to be pre-stored in the random access memory, wherein the second bit marker corresponds to the second block of raw data. In some embodiments of the foregoing computing system, the data management module is configured to intercept and process read and write requests from the processor without knowledge of an operating system operating on the computing system. In some embodiments of the foregoing computing system, the data management module is part of an operating system operating on the computing system. In some embodiments of the foregoing computing system, the data management module is separate from an operating system operating on the computing system.

In some embodiments, a computer-implemented method for writing data onto a random access memory of a computer system comprises: intercepting, by a data management module of the computer system, a request to write raw data onto a conventional storage device from a host operating on the computer system; receiving, by the data management module of the computer system, the raw data of the request to write data onto the conventional storage device from the host operating on the computer system; dividing, by the data management module of the computer system, the raw data into a plurality of blocks of divided raw data, wherein the plurality of blocks of divided raw data comprises a first block of divided raw data and a second block of divided raw data; generating, by the data management module of the computer system, a plurality of bit markers corresponding to the plurality of blocks of divided raw data, wherein each of the plurality of bit markers are smaller in data size compared to each of the corresponding plurality of blocks of divided raw data, where the plurality of bit markers comprises a first bit marker corresponding to the first block of divided raw data and a second bit marker corresponding to the second block of divided raw data; determining, by the data management module of the computer system, whether the first bit marker and the second bit marker is pre-stored on a random access memory storage of the computer system; updating, by the data management module of the computer system, meta data of the first bit marker, wherein the first bit marker is determined to be pre-stored on the random access memory storage of the computer system; storing, by the data management module of the computer system, the second bit marker and the second block of divided raw data in the random access memory storage of the computer system, wherein the second bit marker is determined not to be pre-stored on the random access memory storage of the computer system; and generating, by the data management module of the computer system, a pointer comprising location data of where the second block of divided raw data is stored in the random access memory storage, wherein the computer system comprises the processor, the random access memory storage, and the conventional storage device, wherein the conventional storage device comprises a hard disk drive or a solid state disk, and wherein the conventional storage device is used by the computer system only to store back-up data of data stored in the random access memory storage.

In some embodiments of the foregoing computer-implemented method, the host comprises an operating system of the computer system. In some embodiments of the foregoing computer-implemented method, the data management module is configured to intercept the request to write raw data onto the conventional storage device from the host without knowledge of the host. In some embodiments of the foregoing computer-implemented method, the data management module is part of an operating system operating on the computing system. In some embodiments of the foregoing computer-implemented method, the data management module is separate from an operating system operating on the computing system.

In some embodiments of the foregoing computer-implemented method, the second bit marker and the second block of divided raw data are stored in a capacity efficient shared storage pool (CESSP) of the random access memory storage, wherein the CESSP comprises all unique blocks of divided raw data stored on the random access memory storage. In some embodiments of the foregoing computer-implemented method, the second bit marker and the second block of divided raw data are stored in a table of the random access memory storage, wherein the table comprises mapping data of all bit markers and all corresponding unique blocks of divided raw data stored on the random access memory storage. In some embodiments of the foregoing computer-implemented method, the pointer comprising location data of where the second block of divided raw data is stored in a logical extended memory (LEM) of the random access memory storage, wherein the LEM comprises a plurality of pointers representing a storage location of all unique blocks of divided raw data stored on the random access memory storage.

For purposes of this summary, certain aspects, advantages, and novel features of the invention are described herein. It is to be understood that not necessarily all such advantages may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

All of these embodiments are intended to be within the scope of the invention herein disclosed. These and other embodiments will become readily apparent to those skilled in the art from the following detailed description having reference to the attached figures, the invention not being limited to any particular disclosed embodiment(s).

BRIEF DESCRIPTION OF THE DRAWINGS

The features of the present disclosure will become more fully apparent from the following description, taken in conjunction with the accompanying drawings. Understanding that these drawings depict only some embodiments in accordance with the disclosure and are, therefore, not to be considered limiting of its scope, the disclosure will be described with additional specificity and detail through use of the accompanying drawings.

FIG. 8B is a flowchart illustrating another example method(s) for writing data utilizing RAM-based computer systems, devices, and methods.

DETAILED DESCRIPTION

Figure 1:
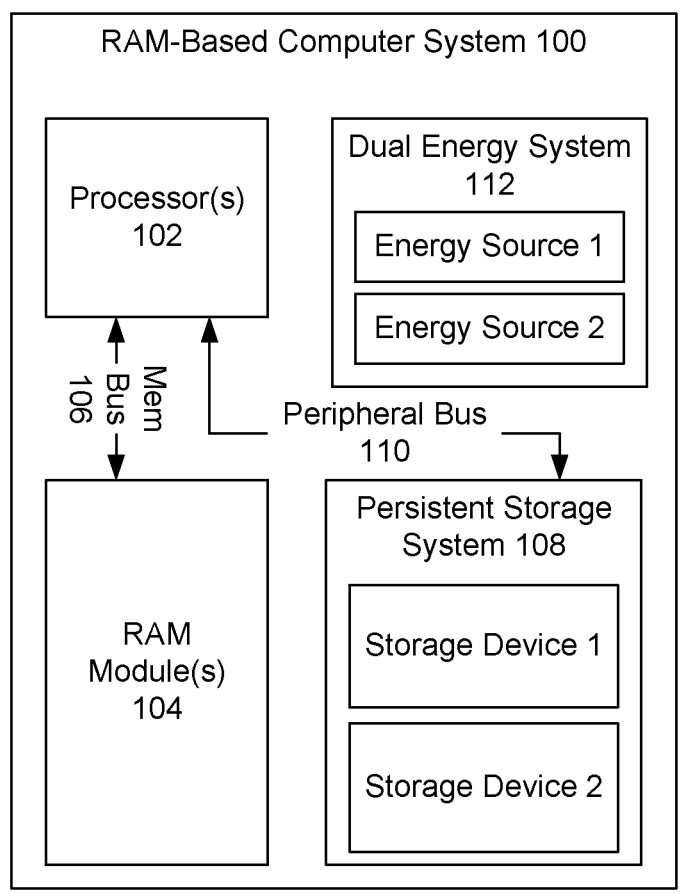
FIG. 1 is a block diagram illustrating an embodiment of a RAM-based computer system.

This detailed description discusses features and advantages of random access memory (RAM)-based computer systems, devices, and methods in relation to certain described embodiments, some of which are illustrated in the figures. Although several embodiments, examples, and illustrations are disclosed below, it will be understood by those of ordinary skill in the art that the inventions described herein extend beyond the specifically disclosed embodiments, examples, and illustrations and includes other uses of the inventions and obvious modifications and equivalents thereof. Embodiments of the inventions are described with reference to the accompanying figures, wherein like numerals refer to like elements throughout. The terminology used in the description presented herein is not intended to be interpreted in any limited or restrictive manner simply because it is being used in conjunction with a detailed description of certain specific embodiments of the inventions. In addition, embodiments of the inventions can comprise several novel features and no single feature is solely responsible for its desirable attributes or is essential to practicing the inventions herein described.

Introduction

In recent decades, computer systems, e.g., personal computers (such as desktops and laptops), servers, mobile devices (such as tablets and mobile phones), and the like, have generally included a processor connected to a main (or primary) memory (often RAM), and a peripheral bus connected to peripheral or mass storage devices. Generally, the main memory is used to store data that can be quickly accessed by the processor over a high-speed memory bus, and the peripheral data bus allows access to data stored on the peripheral or mass storage devices. The peripheral data bus, however, is much slower than the memory bus.

Conventionally, computer systems have utilized RAM, commonly in the form of dynamic RAM (DRAM), as the main memory. RAM can be directly connected to the processor by a high speed memory bus, such that read and write operations to and from the RAM can occur very quickly. For example, in some computer systems the I/O speed for reading and writing data to and from RAM can be as high as 56.7 GB/s, but in others slower or much higher depending on the number of CPU's and complexity of the computer being designed. The high I/O speed associated with RAM can make it ideal for main memory, which must be readily available and quickly accessible by the processor. However, in conventional computer systems, there are some disadvantages associated with the use of RAM. For example, RAM capacity (size, density, etc.) is limited (e.g., relatively smaller) when compared with capacities of other storage devices, such as HDDs and SSDs. RAM capacity has been limited by several key factors, first being cost, then including processor design, nanometer density limitations of silicon, and power dissipation. Today, the largest RAM module commonly available is only 128 GB in capacity, although 256 GB RAM modules will likely be available soon. Another disadvantage associated with the use of RAM in conventional computer systems is that RAM is generally volatile, meaning that data is only stored while power is supplied to the RAM. When the computer system or the RAM lose power, the contents of the RAM are lost. Additionally, RAM, especially larger RAM modules, is quite expensive when compared with other types of storage (e.g., on a dollars per gigabyte scale).

It is generally because of the limited capacity, volatility, and high cost associated with RAM that conventional computer systems have also included a peripheral bus for accessing peripheral devices such as peripheral or mass storage devices. In conventional computer systems, peripheral or mass storage devices (also referred to herein as conventional storage devices) can be any of a number of conventional persistent storage devices, such as hard disk drives (HDDs), solid state drives (SSDs), flash storage devices, and the like. These conventional storage devices, are generally available with capacities that are much larger than RAM modules. For example, HDDs are commonly available with capacities of 6 TB or even larger. Further, these conventional storage devices are generally persistent, meaning that data is retained even when the devices are not supplied with power. Additionally, these conventional storage devices are generally much cheaper than RAM. However, there are also disadvantages associated with the use of these conventional storage devices in conventional computer systems. For example, I/O transfer speeds over the peripheral bus (e.g., to and from conventional storage devices) are generally much slower than the I/O speeds to and from main memory (e.g., RAM). This is because, for example, conventional storage devices are connected to the processor over the slower peripheral bus. In many computers, the peripheral bus is a PCI bus. Then there is typically an adapter to the actual bus that the peripheral storage device is attached to. For storage devices, such as HDDs and SSDs, the connector is often SAS, SATA, Fiber Channel, and most recently Ethernet. There are also some storage devices that can attach to PCI directly such as NVMe Drives. However, in all cases speeds for accessing devices over the peripheral bus are about 1000 times slower than speeds for accessing RAM (e.g. DRAM).

Thus, in conventional computer systems, devices, and methods a limited amount of RAM has generally been provided that can be accessed at high transfer speeds, and a larger amount of peripherally attached conventional storage is provided for long term and mass data storage. However, in these conventional systems, the difference in the I/O transfer speeds associated with the RAM and the conventional storage devices creates a bottleneck that can affect the overall performance of the systems. Under heavy computing loads, for example, this bottleneck will eventually slow the entire computing system to the speed of the conventional storage device.

This application describes new and improved computer systems, devices, and methods that can overcome or alleviate the above-noted and other issues associated with conventional computer systems, devices, and methods that are reliant on both RAM and conventional storage devices. In particular, this application describes RAM-based computer systems, devices, and methods that offer improved performance over conventional computer systems, devices, and methods.

As will be described in greater detail below, in some embodiments, the RAM-based computer systems, devices, and methods described herein can function without reliance on conventional storage devices (and thus are not subject to the bottleneck described above) and/or provide solutions to one or more of the conventionally-viewed drawbacks associated with RAM (e.g., volatility and limited capacity). Stated another away, in some embodiments, the RAM-based computer systems, devices, and methods described herein include and/or utilize a processor and RAM, wherein the RAM is used for mass data storage, without reliance on a conventional hard drive, solid state drive, or any other peripheral storage device.

In some embodiments, the RAM-based computer systems, devices, and methods can be configured to provide and/or utilize storage capacities in RAM generally only associated with conventional storage devices (e.g., HDDs and SSDs), and that can be accessed at the high I/O transfer speeds associated with RAM. Further, certain systems, devices, and methods can be configured such that the data is generally non-volatile, such that data will not be lost if the systems lose power. In some embodiments, the RAM-based computer systems, devices, and methods utilize specialized computer architectures. In some embodiments, the RAM-based computer systems, devices, and methods utilize specialized software operating on a system with traditional computer architecture. These and other features and advantages of the RAM-based computer systems, devices, and methods described herein will become more fully apparent from the following description.

Overview—RAM-based Computer Systems, Devices, and Methods

As used herein, the term "RAM-based computer system," "RAM-based computer device," and "RAM-based computer method" refers to a computer system, device, and method that is configured to process and store data wholly or substantially using only a processor and RAM, regardless of whether the system includes a conventional storage device (such as an HDD or SSD). RAM-based computer systems, devices, and methods can be configured such that the RAM is used to perform the functions traditionally associated with both main memory (e.g., quick access to currently or frequently used data) and conventional storage devices accessible over a peripheral bus (e.g., long term storage of mass amounts of data). In some embodiments, RAM-based computer systems, devices, and methods may include and/or utilize a data reduction engine or module that can employ bit marker or other technologies as discussed herein that allow the system to process and store data wholly or substantially using only a processor and RAM.

In some embodiments, a RAM-based computer system and one or more features thereof as described herein can be implemented on a computer system having specialized computer system architecture as described in more detail below. In some embodiments, a RAM-based computer system and one or more features thereof as described herein can be implemented on a computer system having conventional computer system architecture by utilizing one or more computer-implemented methods via computer software for achieving the same. For example, in some embodiments, a system having conventional computer system architecture can be reconfigured through software such that the system generally operates using only RAM and a computer processor. In some embodiments, a conventional architecture computer system can be reconfigured through software such that the RAM is used to perform the functions traditionally associated with both main memory and conventional storage devices accessible over a peripheral bus. In some embodiments, a conventional storage device of the system can be used rather for back-up purposes only as will be described in more detail below.

Without the use of bit marker technology, typical computing systems would require peripheral devices such as hard, or solid-state disk drives for permanent memory storage; however, the use of peripheral devices generally require sending of data over bus channels, which adds latency and slows down the processing power of the computing system. The most latency added is that of small transfers to/from these hard or solid state disk drives, called 'random-IO,' which RAM is made for and closest to the CPU. Other usage during typical computing is to do sequential (large or small contiguous transfers to/from external drives, which still adds latency, but less.

As described herein, in some embodiments, the RAM-based computer systems, devices, and methods, by utilizing only a processor and RAM without the need for peripheral storage as part of the running of the application, a computing system can dramatically increase the processing power of the computing system. For example, in some embodiments, external storage can be used for ingress of large amounts raw data for an application to operate upon, and egress of data to write computed information from the raw data back to external persistent storage.

In some embodiments, RAM-based computer systems, devices, and methods can be configured to utilize bit marker technology in conjunction with only a processor and RAM in order to achieve 20× amplification of RAM in terms of storage capacity, and 20× improvement over conventional servers in terms of processing speed and capacity. In some embodiments, the foregoing technical improvements, can be achieved through the system using only a processor and RAM because the system is utilizing bit marker technology to amplify the RAM storage capacity and the system is configured with backup power supply in order to make the RAM storage non-volatile, thereby allowing the system to do more work using the processor and the faster RAM memory instead of wasting time in accessing peripheral devices in order to read and write data using random IO, sequential, IO, and in general any access to peripheral devices while the application is running on raw data.

In some embodiments, the systems, devices, and methods disclosed herein are configured to guarantee no loss or substantially no loss of data in using a computing system primarily storing all data in RAM. In some embodiments, the systems, devices, and methods disclosed herein can be configured to not have 100% availability and/or have less than 100% no data loss, for example, such systems could be potentially useful in situations where the applications operating on such system can recreate data and/or tolerate having data that is not updated in real-time or data is a little behind schedule, such as in media processing contexts.

In some embodiments, the computing systems, devices, and methods described herein are configured to operate with only a processor and RAM without the need for use of a conventional storage device. In some embodiments, a conventional storage device is a hard disk drive (HDD) or hard disk or a fixed disk that uses magnetic storage to store and retrieve digital information using one or more rigid rapidly rotating disks (platters) coated with magnetic material. In some embodiments, a conventional storage device is a solid-state drive (SSD) or solid-state disk that uses integrated circuit assemblies as memory to store data persistently, and typically uses flash memory, which is a type of non-volatile memory that retains data when power is lost. In contrast to flash memory, RAM or DRAM (dynamic random access memory) can refer to a volatile memory that does not store memory permanently without a constant power source. However, generally speaking, writing and reading data to and from RAM can be much faster than writing and reading data to and from flash memory. In some embodiments, flash memory is 100 times slower than RAM.

In some environments, systems, devices, and methods described herein operate by using a processor and RAM only without the need for a persistent conventional storage drive, which can allow the system to process data at 20 times the speed of conventional computer systems, thereby allowing a single system to do the work of 20 conventional computer systems. By utilizing the technology disclosed herein, users of such computer systems, devices, and methods can utilize fewer computer systems to do the same amount of work, thereby avoiding server sprawl. By avoiding server sprawl, managers of server farms can reduce complexity and expense in managing such computer systems. Furthermore, conventional computer systems utilizing conventional storage devices, such as HDD and or SSD, can be prone to failure at some point in time because the conventional storage devices fail or break with usage or over-usage in the case of server farms. However, with the use of some systems, devices, and methods disclosed herein, managers of server farms may not need to replace the systems, because such systems would be less prone to breakage given that there is no or less reliance on conventional storage devices, such as SSDs or HDDs. Accordingly, managers of server farms can reduce time and expense and complexity by avoiding the need to constantly replace servers that are broken or nonfunctional due to hardware failures, not to mention reduce the amount of network infrastructure, power, space, and personnel required to maintain a data center. In some embodiments, systems, devices, and methods herein can still comprise and/or utilize external storage as a piece for ingress of raw data for an application as well as egress of computed information by the application to external storage.

In some embodiments, the systems, devices, and methods disclosed herein comprise and/or utilize a specialized computer architecture that enables the computer system to operate and process data using only a processor and random access memory, while only using the same or substantially the same amount of RAM in conventional computing systems, for example, 16 gigabytes, 32 gigabytes, 64 gigabytes, 78 gigabytes, 128 gigabytes, 256 gigabytes, 512 gigabytes, 1024 gigabytes, 2 terabytes, or more. In some embodiments, the specialized computing architecture of the systems disclosed herein enable the system to store an equivalent of raw data that is many times that of the physically memory size of the random access memory, for example, 2×, 3×, 4×, 5×, 6×, 7×, 8×, 9×, 10×, 11×, 12×, 13×, 14×, 15×, 16×, 17×, 18×, 19×, 20×, 21×, 22×, 23×, 24×, 25×, 26×, 27×, 28×, 29×, 30×, 31×, 32×, 33×, 34×, 35×, 36×, 37×, 38×, 39×, 40×, or more, resulting in the ability to store an equivalent of, for example, 320 gigabytes, 640 gigabytes, 1 terabyte, 2 terabytes, 3 terabytes, 4 terabytes, 5 terabytes, 6 terabytes, 7 terabytes, 8 terabytes, 9 terabytes, 10 terabytes, 11 terabytes, 12 terabytes, 13 terabytes, 14 terabytes, 15 terabytes, 16 terabytes, 17 terabytes, 18 terabytes, 19 terabytes, 20 terabytes, 30 terabytes, 40 terabytes, or more of raw data. In some embodiments, the systems, devices, and methods disclosed herein comprise and/or utilize a specialized computer architecture that enables the computer system to operate and process data using only a processor and random access memory to permanently store data while not requiring the use of a conventional storage device, unlike conventional computer systems which rely on conventional storage devices to operate, because the random access memory provides an equivalent storage capacity that is similar to that of a conventional storage device in a conventional computing system.

In some embodiments, systems, devices, and methods described herein can be configured to perform computer processing of data by using only a processor and random access memory (RAM) without the need for a conventional peripheral storage device. In some embodiments, the use of bit marker technology can dramatically increase the amount of data that can be stored in RAM. Accordingly, in some embodiments, systems, devices, and methods described herein can comprise and/or utilize an amount of RAM that is typically provided in most computers today; however, the amount of data that can be stored in the RAM is, in some embodiments, 2×, 3×, 4×, 5×, 6×, 7×, 8×, 9×, 10×, 11×, 12×, 13×, 14×, 15×, 16×, 17×, 18×, 19×, 20×, 21×, 22×, 23×, 24×, 25×, 26×, 27×, 28×, 29×, 30×, 31×, 32×, 33×, 34×, 35×, 36×, 37×, 38×, 39×, 40×, more than what can be stored in the RAM without using bit marker technology. This hardware system and/or software configuration can be advantageous because it can change the cost model for memory in computing systems, in particular, the need to conventional storage drives, such as HDD or SSD. In conventional systems, the main cost driver can be the cost of RAM, and therefore a conventional storage device can be required to store memory because it is too costly to configure a computer with enough RAM to equal the amount of data storage that can be made available through less costly convention storage devices. For example, 128 gigabyte of DRAM can cost as much as $16,000. However, with the use of bit marker technology, in some embodiments described herein, it can be possible to configure a computing system with a conventional amount of RAM that can store a substantially equivalent amount of data as conventional storage devices, and at a virtual lower cost per GB for what is known to the industry as the most expensive type of storage.

Embodiments with Specialized Computer Architecture for RAM-Based Computer Systems In some embodiments, RAM-based computer systems, devices, and methods may include and/or utilize specialized computer architectures. Specialized computer architectures may enable or facilitate one or more of the advantages associated with RAM-based computer systems, devices, and methods. For example, in some embodiments, specialized computer architectures can virtually increase the storage capacity of the RAM such that the RAM-based computer system, device, or method can store in RAM an equivalent amount of raw data that is greater than, and in many cases, substantially greater than the actual capacity of the RAM. In some embodiments, this can allow the RAM to be used as the primary storage for the entire system and allow all of the data to be accessed at high speeds over the memory bus. As another example, in some embodiments, specialized computer architectures can allow the data to be stored in a non-volatile manner such that if the system loses power, the data will be preserved. Additionally, in some embodiments, specialized computer architectures can allow the RAM-based computer system systems to be fault tolerant and highly available.

In some embodiments, a specialized architecture for RAM-based computer system can comprise a single node system. In some embodiments, a specialized architecture for RAM-based computer system can comprise a multi-node system.

Example Specialized Computer Architecture Embodiments of a Single Node System

In some embodiments, a specialized computer architecture of a single node RAM-based computer system can comprise a fault tolerant, RAM-based computer architecture. FIG. 1 is a block diagram representing one embodiment of a RAM-based computer system 100. In the illustrated embodiment, the system 100 includes one or more processors 102 and one or more RAM modules 104. In some embodiments, the processors 102 are connected to the RAM modules by a memory bus 106. In some embodiments, the system 100 also includes a persistent storage system 108. In some embodiments, the persistent storage system 108 can include one or more persistent storage devices. In the illustrated embodiment, the persistent storage system 108 includes two storage devices: storage device 1 and storage device 2. In some embodiments, the persistent storage system 108 is connected to the processors 102 by a peripheral bus 110. In some embodiments, the peripheral bus is a Peripheral Component Interconnect Express (PCIe) bus, although other types of peripheral buses may also be used. In some embodiments, the system 100 also includes a dual energy system 112. The dual energy system 112 can include at least two energy sources, for example, as illustrated energy source 1 and energy source 2. In some embodiments, the energy sources can each be a battery, a super capacitor, or another energy source.

In some embodiments, the system 100 can be configured to store substantially all of the data of the system 100 in the RAM modules 104. By way of comparison, conventional computer systems generally store a limited amount of data in RAM and rely on conventional storage devices for mass data storage. The system 100 can be configured to use the RAM modules 104 for even the mass data storage. In some embodiments, this advantageously allows all of the data to be quickly accessible to the processor over the high-speed memory bus 106 and dramatically increases the operating speed of the system 100.

Some types of RAM modules (e.g., DRAM) are generally volatile. Accordingly, to prevent data loss and make data storage non-volatile, in some embodiments, the system 100 includes the persistent storage system 108 and the dual energy system 112. In some embodiments, these components work together to make the system 100 essentially non-volatile. For example, the dual energy system 112 can be configured to provide backup power to the system 100 in case of power loss. The backup power provided by the dual energy system 112 can hold up the system for sufficient time to copy the contents of the RAM modules 104 to the persistent storage system 108. The persistent storage system 108 can include non-volatile, persistent storage devices (e.g., SSDs or HDDs) that safely store the data even with no power.

In some embodiments, the system 100 constantly mirrors the contents of the RAM modules 104 into the persistent storage system 108. In some embodiments, such mirroring is asynchronous. For example, the contents of the persistent storage system 108 can lag slightly behind the contents of the RAM modules 104. In some embodiments, in the event of power failure, the dual energy system 112 can hold up the system 100 for long enough to allow the remaining contents of the RAM modules 104 to be mirrored to the persistent storage system 108. In some embodiments, the system 100 only transfers the contents of the RAM modules to the persistent storage system 108 in the event of a power failure.

Although the illustrated embodiment of the system 100 includes both RAM modules 104 and a persistent storage system 108 that includes persistent storage devices, such as HDDs and SSDs, in some embodiments, the system 100 uses these components in a substantially different way than conventional computer systems. For example, as noted previously, conventional computer systems rely on RAM to quickly access a small portion of the data of the system and rely on conventional storage devices for long term and persistent data storage. Thus, in general, the entire amount of data used by conventional systems is only stored in the conventional storage devices. In contrast, in some embodiments of the system 100, substantially all of the data of the system 100 is stored in the RAM. This can allow all of the data to be quickly accessible by the processors 102 over the high speed memory bus 106. In some embodiments, a second copy of the data (or an asynchronous copy of the data) can be provided in the persistent storage system 108 with the purpose of preserving the data in case of power loss to the system 100. Thus, through use of the persistent storage system 108 and the dual energy system 112 the system 100 can provide a solution to one of the disadvantages generally associated with RAM: its data volatility.

In some embodiments, the system 100 can provide a solution to another of the disadvantages generally associated with RAM: its limited capacity. In some embodiments, the system 100 can include a data reduction engine that can greatly reduce the data actually stored on the system 100. In some embodiments, the data reduction engine can use various techniques and methods for reducing the amount of data stored, including utilizing bit marker technology. The data reduction engine and data reduction methods will be described in greater detail below. In the system 100, in some embodiments, the data reduction engine can be executed on the one or more processors 102. In some embodiments, the data reduction engine is executed on an additional circuit of the system 100, such as an FPGA, ASIC, or other type of circuit. In some embodiments, the data reduction engine can use bit marker technology.

In some embodiments, the data reduction engine intercepts write requests comprising raw data to be written to a storage medium. In some embodiments, the data reduction engine can compress, de-duplicate, and/or encode the raw data such that it can be represented by a smaller amount of reduced or encoded data. In some embodiments, the smaller amount of reduced or encoded data can then be written to the RAM module(s). In some embodiments, the data reduction engine also intercepts read requests. For example, upon receipt of a read request, the data reduction engine can retrieve the smaller amount of compressed or encoded data from the RAM modules 104 and convert it back into its raw form.

In some embodiments, through implementation of the data reduction engine, the system 100 can be able to store an equivalent or raw data that exceeds, and in some instances, greatly exceeds the physical size of the RAM modules. In some embodiments, because of the data reduction engine, reliance on conventional storage devices for mass data storage can be eliminated or at least substantially reduced and mass data storage can be provided in the RAM modules 104.

In some embodiments, because the mass data storage is provided in the RAM modules 104, all of the data is quickly accessible over the high speed memory bus 106. This can provide a solution to the disadvantage that is common in conventional computer systems that data retrieved from mass data storage must go over a slower peripheral bus. Because, in some embodiments, the system 100 does not need to access data from a conventional storage device over the peripheral bus, the overall speed of the system can be greatly increased.

In some embodiments, the system 100 includes a single processor 102. In some embodiments, the system 100 includes more than one processor 102, for example, two, three, four, or more processors. In some embodiments, the system can include one or more sockets. In some embodiments, the one or more processors 102 comprise multiple cores. In some embodiments, the processors comprise Intel processors, such as Intel's, Skylake or Kaby Lake processors, for example. Other types of processors can also be used, e.g., AMD processors, ARM processors, or others. In general, the system 100 can be configured for use with any type of processors currently known or that will come to be known without limitation.

In some embodiments, the system comprises one or more RAM modules 104. In some embodiments, the RAM modules 104 can be DIMMs (dual in-line memory modules) configured to connect to DIMM slots on a motherboard or on other components of the system 100. In some embodiments, the system 100 may include the maximum amount of RAM supported by the processors 102. This need not be the case in all embodiments, for example, the system 100 can include anywhere between 1 GB and the maximum amount of RAM supportable by the processors 102. In some embodiments, one or more individual RAM modules 104 in the system 100 can be the largest size RAM modules available. Currently, this is 128 GM or 256 GB. As larger sized RAM modules are developed, the system 100 can use the larger sized modules. In some embodiments, the system 100 can use smaller sized individual RAM modules, e.g., 1 GB, 2 GB, 4 GB, 8 GB, 16 GB, 32 GB, or 64 GB RAM modules. In some embodiments, the system includes between 1 GB and 3 TB or 6 TB of RAM. In some embodiments, the more memory (RAM) the system includes, the greater the possibility of greater data reduction, more processing power, and overall computer value.

In some embodiments, the RAM modules comprise DRAM, although other types of RAM modules can also be used. In some embodiments, the system uses NV-DRAM. In some embodiments in which NV-DRAM is used, the persistent storage system 108 and the dual energy system 112 can be omitted as the NV-DRAM is already non-volatile.

In some embodiments, the computing system is configured to operate with only a processor and NVDIMMs (or NVRAMs or RERAMs) without the need for use of a conventional storage device. In some embodiments, the NVDIMMs utilizes cross-point memory (a faster version of flash memory based storage but still only accessible in block format, vs RAM which is random access down to bytes; further there are other versions of this faster flash being developed as well as others, but none are as fast, dense, or capable of small byte access such as RAM which is required by all applications and CPUs). In some embodiments, the NVDIMMMs are block addressable and/or can be configured to be inserted into a DIMM socket. In general, DIMMs can refer to the form factor of the memory in how such memory plugs into a motherboard or other interface. In some embodiments, the NVDIMMs comprise RAM (volatile memory) and flash memory (non-volatile memory) wherein the NVDIMMs use volatile memory during normal operation for speed and dump the data contents into non-volatile memory if the power fails, and does so by using an on-board backup power source to be described in more detail below. In some embodiments, the foregoing system operates at a slower processing speed than a computing system configured to operate with only a processor and RAM. In some embodiments, the computing system operating a processor with NVDIMMs can be more expensive to manufacturer due in part to the expense of NVDIMMs. In some embodiments, NVDIMMs require super caps and/or modification to the mother board to provide energy to the NVDIMMs such that when the power goes down or while it was alive, it would basically then be able to retire the RAM to the flash without losing data. In some embodiments, NVDIMMs, using bit marker technology, can only store much less than, e.g., about $1/10^{th}$ to $1/4^{th}$, the amount of data that RAM (and at slower speeds than DRAM) is capable of storing by using bit marker technology. In some embodiments, NVDIMMs do not have very high storage density as compared to RAM or DRAM.

In some embodiments, utilizing only a processor and RAM, the system can comprise RAM that is configured to be plugged into an interface mechanism that can be coupled to a DIMM slot, wherein the interface mechanism comprises a power source. In some embodiments, the interface mechanism having a power source enables the data that is stored in the RAM to be persistently stored in the RAM in the event that there is a disruption in the supply of power to the RAM. In some embodiments, the back-up power source is not integrated into the interface mechanism, in which there would be some cases where there would be no need for an interface mechanism, but rather there is a power source(s) integrated into and/or coupled to the motherboard (or main CPU/RAM board) to supply back-up power to the entire motherboard which in turn would supply power to the RAM in the event there is a disruption in the supply of power to the computer system. Supplying power to the motherboard and/or RAM, in some embodiments, can ensure that the data stored in RAM persists in the event there is a disruption to the power supply.

In particular, referring back to FIG. 1, in some embodiments, the system 100 can be considered a merger of a server and an array controller with regard to data protection, high availability, and fault tolerance. In some embodiments, the system 100 fuses or combines two generally separated computer system functions: compute and storage. In some embodiments, the system 100 makes the RAM modules 100 the only storage media for applications to run against and thus all I/O requests remain on the very fast memory bus. Further, in some embodiments, the persistent storage system 108 and the dual energy system 112 provide that the data is nonvolatile. The persistent storage system 108 and the dual energy system 112 will now be described in greater detail.

Dual Energy System

Referring again to FIG. 1, in some embodiments, the system 100 can include a dual energy system 112 configured to provide sufficient backup power to allow the data stored in the RAM modules 104 to be copied to the persistent storage system 108 in the event of a power event, such as a loss of power to the system 100. Thus, the dual energy system 112 can be configured to provide that the data stored in the system 100 is effectively nonvolatile. In some embodiments, the dual energy system 112 provides sufficient energy to hold up the RAM modules 104 and/or the entire system 100 for a period of time after a power failure. In some embodiments, the period of time is at least 1 minute, at least 5 minutes, at least 10 minutes, at least 15 minutes, at least 30 minutes, at least 45 minutes, at least 1 hour, at least 1.5 hours, at least 2 hours, at least 2.5 hours, at least 3 hours, at least 3.5 hours, at least 4 hours, at least 5 hours, at least 8 hours, at least 12 hours, or longer.

In some embodiments, the dual energy system 112 is configured to provide power to the system 100 to save the contents of the RAM to persistent storage (e.g., persistent storage system 108). In some embodiments, transferring the data from the RAM to persistent storage can take 1 minute, 5 minutes, 10 minutes, 15 minutes, 30 minutes, 45 minutes, 1 hour, 1.5 hours, 2 hours, 2.5 hours, 3 hours, 3.5 hours, 4 hours, 5 hours, 8 hours, 12 hours, or longer, and as such, the dual energy system can be configured to provide enough power to keep the system powered on to allow for the data transfer, for example, at least 1 minute, ate least 5 minutes, at least 10 minutes, at least 15 minutes, at least 30 minutes, at least 45 minutes, at least 1 hour, at least 1.5 hours, at least 2 hours, at least 2.5 hours, at least 3 hours, at least 3.5 hours, at least 4 hours, at least 5 hours, at least 8 hours, at least 12 hours, or longer.

In some embodiments, the dual energy system 112 includes two energy sources: for example, energy source 1 and energy source 2 as illustrated in the example embodiment of FIG. 1. In some embodiments, more than two energy sources are provided. In some embodiments, providing at least two energy sources increases the fault tolerance of the system 100. For example, it can avoid having a single point of failure for the system 100. In some embodiments, if one of the energy sources fails, the other can continue to provide power to the system 100. This can allow the system 100 to have a high availability, data protection, and fault tolerance.

In some embodiments, the energy sources 1 and 2 comprise batteries, super capacitors, or any other type of energy source configured to supply power or back up power to the system. For example, the batteries could be lead- acid batteries or any other type of battery. In some embodiments, the super capacitors could be supercapacitors, electric double-layer capacitors (EDLCs), ultracapacitors or Goldcaps, for example.

In some embodiments, the energy sources 1 and 2 are built within the system 100 itself, for example, attached to the motherboard or some other internal component of the system. In some other embodiments, the system 100 includes two power supplies and the power supplies are connected to external energy sources. In some embodiments, the external energy sources can comprise uninterruptable power supplies (UPSs) connected to the power supplies of the system 100. The uninterruptable power supplies may include backup energy sources, such as batteries, super capacitors, flywheels, etc. for providing backup energy in the event of a power loss.

Figure 2A:
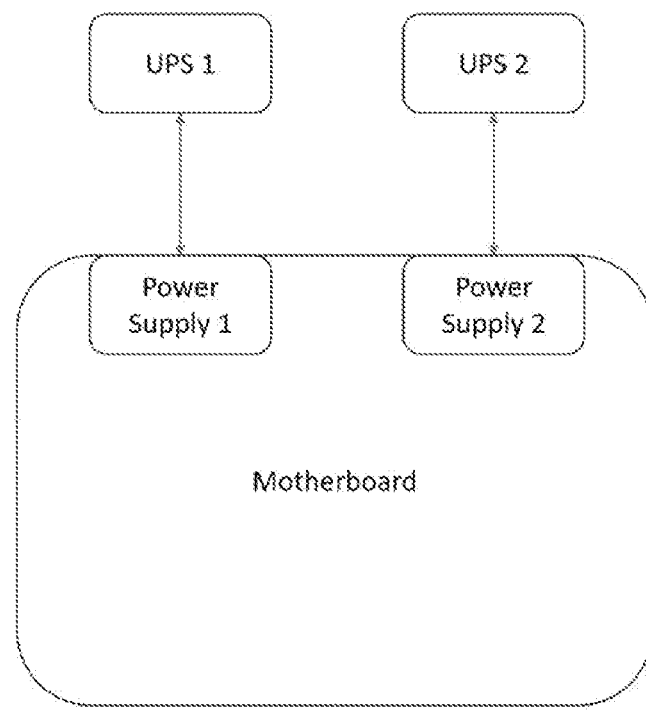
FIG. 2A is a block diagram illustrating a first embodiment for connecting to uninterruptable power supplies to a RAM-based computer system as part of a dual energy system of the RAM-based computer system.

FIG. 2A illustrates an example embodiment showing two external UPSs connected to the system. In this example embodiment, the system includes two power supplies. In some embodiments, each UPS is connected to one of the power supply. In some embodiments, each power supply and each UPS is configured to supply power to the entire system in the case of a power failure to allow the data RAM modules 104 to be copied to the persistent storage system 108. In some embodiments, the two UPSs are provided by way of redundancy so that if one fails, the other can take over. In some embodiments, fault tolerance still achieved as there is not a single point of failure or common mode failure.

Figure 2B:
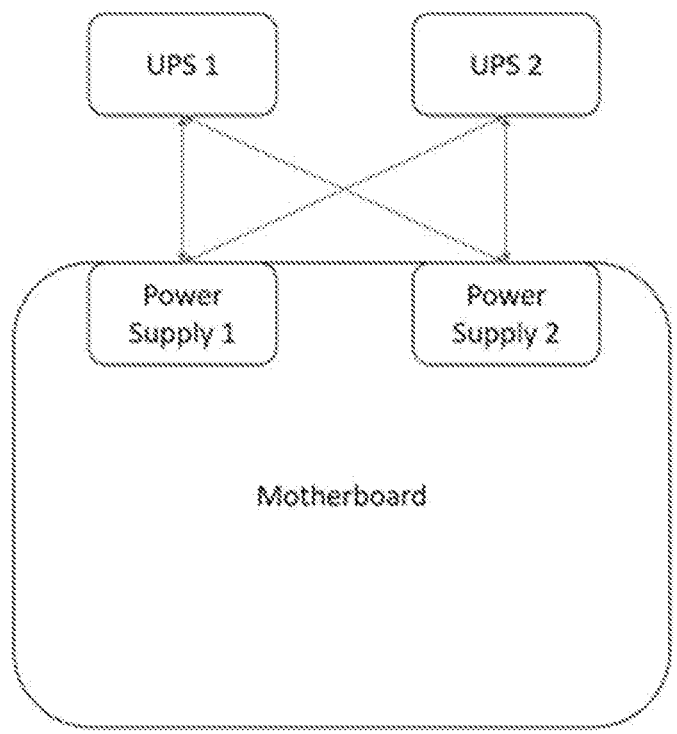
FIG. 2B is a block diagram illustrating a second embodiment for connecting to uninterruptable power supplies to a RAM-based computer system as part of a dual energy system of the RAM-based computer system.

FIG. 2B illustrates another example embodiment showing two external UPSs connected to the system. In this example embodiment, the system again includes two power supplies. However, in this example, each UPS is connected to both power supplies. In some embodiments, to implement this configuration, an AC switcher could also be provided to allow the cross-coupling. In some embodiments, the AC switch could be a high, availability, fault tolerant AC switcher.

In some embodiments, each of energy sources 1 and 2 can include features for remanufacturing and recalibrating the energy sources in some situations. For example, these features can be provided in UPSs, such as the UPSs shown in FIGS. 2A and 2B. The features may be implemented in software running on the UPSs. In some embodiments, these features may be controlled based on commands received from the system 100 or another system (e.g., a manager). In some embodiments, the commands can be sent to the UPS for example, over a network connection, such as an ethernet connection.

In some embodiments, the dual energy 108 are configured to be able to remanufacture/recalibrate one of the energy sources while the other back up energy source remains engaged to protect the system from power loss. In some embodiments, the ability to remanufacture/recalibrate the energy source allows the energy source to last longer and/or be more accurate in the information that provides the system as to its charge level. For example, in some embodiments, system 100 or the dual energy system 112 is configured to allow and/or instruct one backup energy sources to go through the remanufacture/recalibration process and be taken offline.

In some embodiments, the remanufacture/recalibration process can comprise discharging the backup energy source (for example a lead-acid battery) to a threshold level, for example, 10%, 15%, 20%, 21%, 22%, 23%, 24%, 25% or the like. In some embodiments, the remanufacture/recalibration process can comprise performing a recalibration of the energy source such that when device comes back online, it not only extends the life of the backup energy source, but also it ensures that the backup energy source's health meter or charge meter is accurate. In some embodiments, this can be particularly advantageous because if a backup energy source inaccurately informs the system that it has a higher percentage of available energy in the system than it actually has, then the system could be in danger of not having enough energy to copy or mirror data from the RAM into a conventional storage device and/or other computing system during a power supply failure situation.

In some embodiments, the system (e.g., the system 100, the dual energy system 112, or another system) is configured to send an electronic communications signal to the backup energy source device to perform the remanufacture/recalibration process. In some embodiments, the backup energy source device itself (e.g., without receiving a command from another device.

In some embodiments, the remanufacture/recalibration process is performed on a periodic basis (for example, every several hours, every several days, every several months, or every several years). In some embodiments, the remanufacture/recalibration process is preformed when an energy source reaches a threshold level (for example, number of days since last remanufacture, or a low percentage of available energy in the energy source device, or any other threshold level). In some embodiments, the remanufacture/recalibration process is after detection of a power event (for example, a loss of power or a power surge). In some embodiments, the energy sources themselves (e.g., the UPSs), the dual energy system 112, the system 100, or another system is configured to detect power events. In some embodiments, detection of a power event may also cause the system 100 to copy the contents of the RAM 104 to the persistent storage system 108.

In some embodiments, when the remanufacture/recalibration process is performed, it is first performed on one of the energy sources while the other remains online. In some embodiments, when the remanufacture/recalibration process is complete on the first energy source, the second energy source may perform the remanufacture/recalibration process.

Although this disclosure makes reference to a "dual" energy system, it will be appreciated that, in some embodiments, a system can include only a single power source. For example, a system could include a single power supply connected to an AC power outlet. In such a system, in the event of a power loss, data in the RAM modules 104 may be lost. To alleviate the risk of data loss, in some embodiments, the system may continuously asynchronously copy the contents of the RAM modules 104 to the persistent storage system 108; however, it will be appreciated that due to the asynchronous copying method, some data may be lost in the even to of a loss of power. In another example embodiment, a system can include a single power supply connected to a single uninterruptable power supply (UPS), which includes, for example, its own battery backup. In the case of a power failure, in some embodiments, the UPS may provide sufficient backup power to copy the contents of the RAM modules 104 to the persistent storage device 112. However, it will be appreciated that if the single UPS also fails, data likely will be lost.

Persistent Storage System

As noted above, in some embodiments, the system 100 can include a persistent storage system 108. In some embodiments, the persistent storage system 108 is configured to provide nonvolatile storage of data in the even to of a loss of power to the system 100. In some embodiments, as shown in FIG. 1, the persistent storage system 108 can include two storage devices: storage device 1 and storage device 2. In some embodiments, the persistent storage system 108 include at least two storage devices. Each of the storage devices can be a persistent storage device (i.e., a nonvolatile storage device that retains data even when unpowered). For example, each storage device can be an SSD, HDD, or the like.

In some embodiments, the multiple storage devices of the persistent storage system 108 can be configured in a mirrored or RAID configuration. For example, in some embodiments, the system includes two NVMe SSDs in a dual-write RAID-1 configuration. In this configuration, data can be written identically to two drives, thereby producing a "mirrored set" of drives. In some embodiments, a RAID configuration of the persistent storage system 108 can provide improved fault tolerance for the system 100. For example, if either storage device fails, the data is preserved in the other storage device. In some embodiments, other RAID levels can be used (e.g., RAID 2, RAID 3, RAID 4, RAID 5, RAID 6, etc.).

Although FIG. 1 illustrates the persistent storage system 108 with only two storage devices, in some embodiments more than two can be included, for example, two, three, four, five, six or more. In some embodiments, up to 16 storage devices are included. In some embodiments, up to 32 storage devices are included.

In some embodiments, as noted previously, the persistent storage system 108 can be used to provide an asynchronous backup of the data stored in the RAM modules 104. Thus, in some embodiments, in the event of a power failure, data related to transactions not yet completed can be lost. In general, this amount of data can be minimal. Accordingly, in some embodiments, the persistent storage system 108 provides a nonvolatile method for backing up the data in the RAM modules 104.

In some embodiments, data is continually backed up to the persistent storage device 108. For example, in some embodiments, the initial state of the data in the RAM modules 104 is copied to the persistent storage device 108, and then the system 100 continues to copy any changes in the data (i.e., the deltas) to the persistent storage device 108. In some embodiments, the system may not continuously copy data to the persistent storage device 108. For example, not continuously copying the data can allow the system to run at an even higher performance. In these systems, data may only be copied to the persistent storage device 108 when a power event is detected.

In some embodiments, the system persistent storage system 108 includes sufficient capacity to back up all of the RAM modules 104. Thus, in some embodiments, the size of the persistent storage system 108 is at least as large as the total size of the RAM modules 104. For example, if the system includes 3 TB of RAM, the persistent storage system 108 may include at least 3 TB of space. In RAID configurations, for example, the mirrored RAID 1 configuration described above, if the system includes 3 TB of RAM, each storage device of the persistent storage system 108 may include at least 3 TB of space.

In some embodiments, the persistent storage system 108 is not used for user data in the conventional sense. For example, in some embodiments, a user could not decide to save data to the persistent storage system 108. Rather, in some embodiments, user data is saved and accessed from the RAM modules 104. In some embodiments, a back-up copy of the customer data may be provided in the persistent storage system 108 but may generally not be visible to the user.

Although this disclosure makes reference to the persistent storage system 108 include two storages devices, it will be appreciated that, in some embodiments, a system can include only a storage. For example, a system could include an SSD backup. In such a system, in the event of a failure of the single drive, data may be lost.

Example Specialized Computer Architecture Embodiments of a Dual Node System

In some embodiments, the system comprises a dual node system. In some embodiments, a dual node system may comprise one or more features described above in connection with a single node system architecture. In some embodiments, a dual node system can comprise a non-stop, fault tolerant, RAM-based computer architecture.

Figure 3:
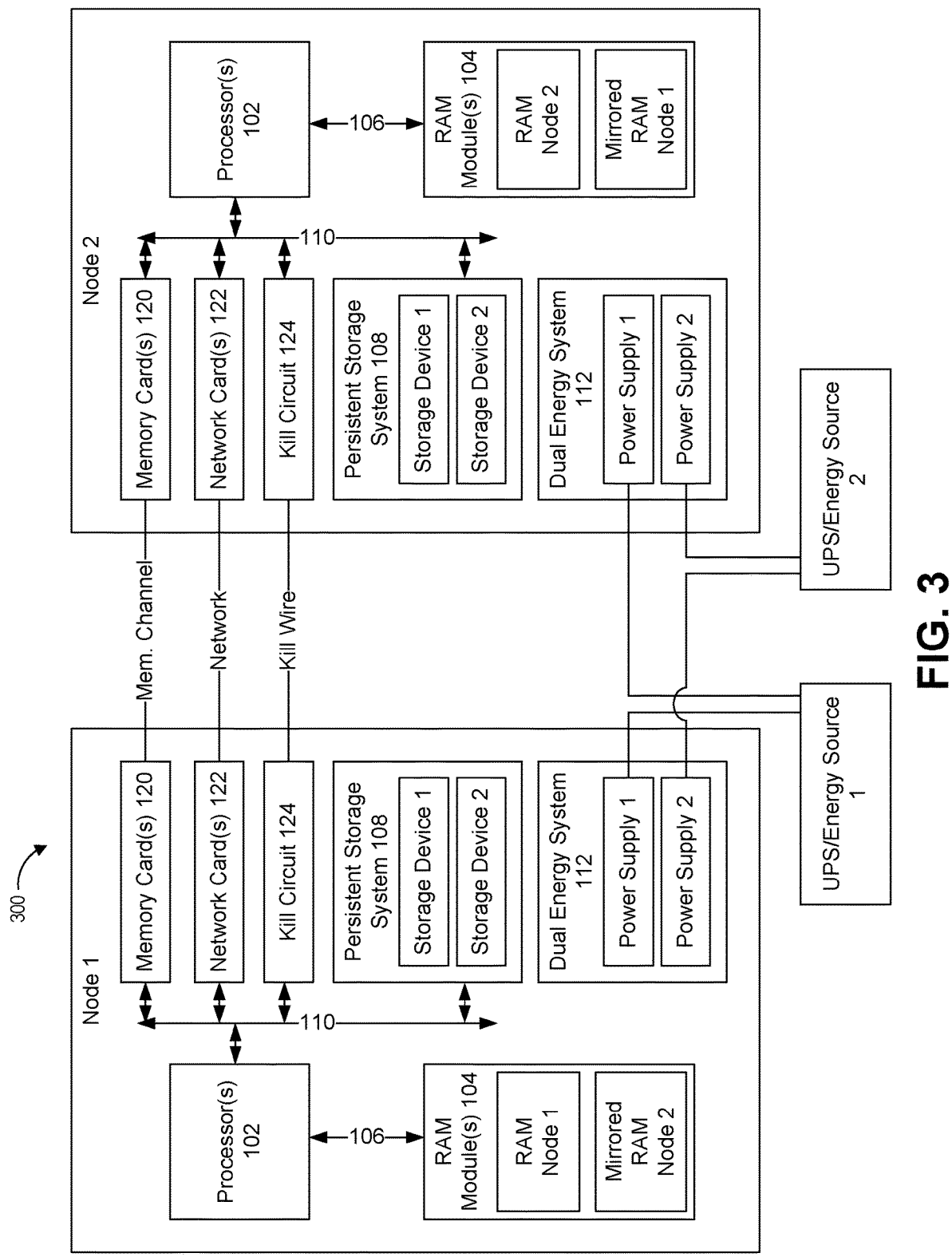
FIG. 3 is a block diagram illustrating an embodiment a dual-node RAM-based computer system configured for data protection, fault tolerance, and high availability.

FIG. 3 is a block diagram of an example dual node RAM-based computer system 300. In some embodiments, the system 300 includes two nodes (node 1 and node 2) that are interconnected to provide a non-stop, fault tolerant RAM-based computer system 300. In some embodiments, the computer system 300 is designed for very high availability, data protection, and fault tolerance and can be used, for example, in environments where both up time and data protection are critical.

In some embodiments, each node (node 1 and node 2) can be similar to the RAM-based computer system 100 described above in connection with FIG. 1. For example, in some embodiments, each node includes one or more processors 102 and one or more RAM modules 104 connected by a high-speed memory bus 106. In some embodiments, each node can also include a persistent storage system 108 and a power supply 112 as described above. For sake of brevity, description of these features will not be repeated with the understanding that the description above of the RAM-based computer system 100 of FIG. 1 is applicable here to each node.

Figure 4:
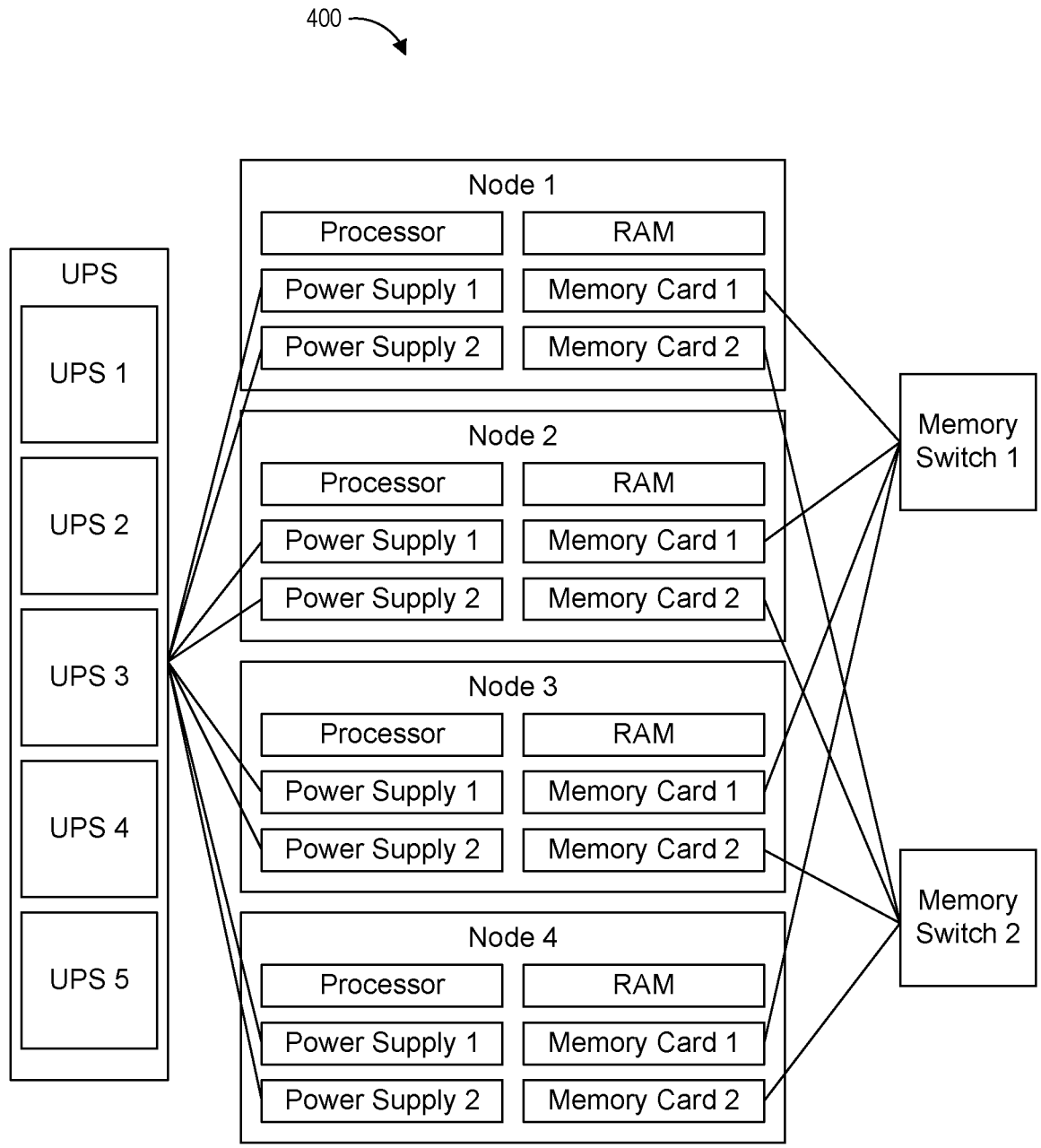
FIG. 4 is a block diagram illustrating a four node RAM-based computer system including an uninterruptable power supply system and two memory switches.

In addition to the features previously described, in some embodiments, each node also includes one or more memory cards 120 (configured to allow communication over a memory channel, tunnel, fabric, or switch), one or more network cards 122, and a one-way kill circuit 124. In some embodiments, these features work together to provide transparent mirroring of memory between the two nodes of the system 300. In some embodiments, for example, as shown in FIG. 4, the RAM modules 104 of the first node include a first portion or RAM dedicated to the RAM of node 1 and a second portion dedicated to the mirrored RAM of node 2. Similarly, in some embodiments, the RAM modules 104 of the second node include a first portion or RAM dedicated to the RAM of node 2 and a second portion dedicated to the mirrored RAM of node 1. In some embodiments, as will be described in greater detail below, because each node includes a mirrored copy of the other node, in the event of a failure of either node, the surviving node can take over the work of both nodes. While the capacity of each node may be reduced (as half of each node must be dedicated to backing up the opposite node) in some embodiments, this arrangement provides a high degree of fault tolerance and availability.

FIG. 3 illustrates an example system in an active-active system configuration. That is, both node 1 and node 2 are actively running VMs and/or applications, and each node contains a mirrored copy of the other node's running RAM. As such, in some embodiments, if either node fails, the surviving node can begin running the VMs or applications that were previously running on the failed node using the mirrored copy of the failed node's RAM.

In some embodiments, the system may be operated in an active-passive configuration. That is, only one node, e.g., node 1, is actively running VMs or applications. In this case, node 2 is running in a passive state. It does not run any VMs or applications and only contains a mirrored copy of node 1's RAM. As such, in some embodiments, if node 1 fails, node 2 can become active, taking over node 1's running applications and VMs using the mirrored copy of node 1's RAM.

In some embodiments, the RAM of each node is mirrored to the opposite node over a memory channel (also referred to as a memory tunnel, fabric, or switch). In some embodiments, the memory channel comprises 32 lanes of PCIe, which in some embodiments is capable of transferring 32 gigabytes of data per second. In some embodiments, the memory channel is capable of transferring 32 gigabytes of data per second per lane. This can provide a connection between the nodes that is much faster than traditional network connections. As compared to traditional networks of today, one can employ 100 gigabit networks switches that can only provide 12 gigabytes per second.

In some embodiments, to access the memory channel, each node includes one or more memory cards 120. In some embodiments, each memory card 120 provides for 16 lines of PCIe (32 gigabytes of data per second). In some embodiments, each node comprises two memory cards 120 allowing for a total of 32 PCIe lanes. In some embodiments, the memory cards 120 are connected to the processors 102 through the peripheral bus 110, which may be a PCIe bus. In the case of intel processors in some embodiments, the memory cards 120 and the memory channel can access the processors 102 via the Non-Transparent Bridge (NTB) of 32 lanes of PCIe on all Intel processors. In some embodiments, the memory cards 120 are configured to allow the computer systems in a multi-computer system to communicate at or substantially at memory BUS speeds thereby introducing only a small amount or no amount of latency between the two computing systems during data mirroring and/or other data transfer between the systems.

In some embodiments, the system 300 comprises one or more specialized communication links between the nodes to transmit heartbeat data between the two nodes. In some embodiments, the heartbeat data provides information to the nodes that each of the computing systems is still functioning properly. In some embodiments, a first heart beat is sent over the memory channel and a second heart beat is sent over the network, for example, by means of network cards 122.

In the event that the system 300 loses both heartbeats, in some embodiments, the system 300 can interpret the loss as meaning that one of the nodes. In which case, in some embodiments, the system 300 can be configured to send a one way kill signal through the kill circuit 124. In some embodiments, kill circuit 124 is configured to guarantee that only one of the nodes is terminated such that both computing systems do not terminate, thereby ensuring that the system is fault tolerant and that no data is lost. In some embodiments, the system is configured to delay sending the one way kill signal to account for the situation wherein the non-responding computing system is in the process of rebooting. In some embodiments, to restart the terminated computing system, the system requires human intervention, for example, the non-responding computing system requires a hardware repair.

In some embodiments, the surviving node is configured to perform a fail over procedure to take over the work of the non-functioning node. In some embodiments, the functioning node can take over the work of the non-functioning node because the functioning node includes a mirrored copy of the RAM from the non-functioning node. In some embodiments, the functioning computing system is configured to instantly take over the work of the non-functioning computing system. In some embodiments, the functioning computing system is configured to fail over or take over after a period of time the work of the non-functioning computing system.

In some embodiments, the functioning computing system is configured to perform a fail back procedure, or in other words transfer the work of the non-functioning computing system back after the non-functioning computing has rebooted. In some embodiments, the functioning computing system is configured to copy or mirror the data related to the work of the non-functioning computing system that is stored in the capacity efficient shared storage in the functioning computing system to the non-functioning computing system. In some embodiments, the functioning computing system is configured to keep track of the changes or the delta or the new data related to the work of the non-functioning computing system that is stored in the capacity efficient shared storage of the functioning computing system since the system taking over the work from the non-functioning computing system. In some embodiments, the functioning computing system is configured to copy or mirror the changes or the delta or the new data to the non-functioning computing system after the non-functioning computing system has rebooted, assuming that the RAM in the non-functioning computing system was not replaced or reformatted or the data in the RAM was not otherwise erased. In some embodiments, the fail back procedure involves copying or mirroring all or some of the data associated with the work of the non-functioning computing system that is stored in the capacity efficient shared storage to the previously non-functioning computing system through the memory tunnel.

Example Systems with More than Two Nodes

In some embodiments, the system can comprise more than two nodes. In particular, FIG. 4 is a block diagram of a RAM-based computer system 400. In the embodiment illustrated in FIG. 4, the computer system 400 includes four nodes. Each node may be similar to the RAM-based computer system 100 described above. Each node may include two memory cards and each memory card can be connected to one of two memory switches. The nodes can communicate with each other through the memory cards and switches in a manner that is much faster than traditional networking (e.g., gigabit ethernet connections).

As shown in FIG. 4, in some embodiments, the system 400 may represent a multi-computing system cluster, wherein paired computing systems within the cluster can electronically communicate with other paired computing systems. In the illustrated example, the system 400 includes four nodes. In some embodiments, the first and second nodes can be paired in an arrangement. Further, the third and fourth nodes can also be provided in a paired arrangement. In this example, the paired nodes can be configured to mirror data between themselves in a manner similar to that described above with reference to FIG. 3. Additionally, in some embodiments, the four nodes are also in electronic communication with each other through the memory switches.

In some embodiments, the system is configured to copy or mirror data between paired computing systems. In some embodiments, such systems configured to copy or mirror data between paired computing systems are ideal for mission critical situations requiring no loss of data and no loss of availability; however, such systems can have system performance decreases due to increased processing power and/or network traffic (for example, increased overhead with the network) required to perform data copying or mirroring. Accordingly, in some embodiments, each computing system can only use a portion, for example, a quarter, a half, three-quarters, of the RAM storage because the non-used portion must be used for data copying or mirroring with the other paired computing system.

In some embodiments, the systems disclosed herein are configured to operate a plurality of virtual machines. In some embodiments, the systems disclosed herein can be configured to operate natively or raw without operating any virtual machines on the system because the entire system is being used to operate a single operating system in order to provide maximum performance to the single operating system and/or the software applications running over the operating system and the system.

Further, FIG. 4 illustrates that, in some embodiments, a UPS system may be provided to supply backup power to the dual energy source systems (e.g., the two power supplies) of each node. In this example, the UPS is illustrated as module and comprises five individual modules. In some embodiments, it may be preferred to have at least one more UPS module than the number of system nodes to provide redundancy in the system. For example, in the illustrated example of four nodes, the UPS comprises five modules.

Real-time Data Reduction and Real-time Memory

In some embodiments, the systems, methods, and devices described herein can comprise and/or be configured to utilize real-time data reduction, encoding, and/or decoding processes. In some embodiments, a system comprising a specialized architecture as described herein can comprise a real-time data reduction engine module for performing one or more data reduction, encoding, and/or decoding processes as described herein. In some embodiments, even a system having conventional computer system architecture can be configured to utilize one or more data reduction, encoding, and/or decoding processes described herein by utilizing one or more computer-implemented methods via computer software. As such, in some embodiments, a conventional computer system can be reconfigured through software to implement one or more features of a real-time data reduction engine module as discussed herein.

Figure 5:
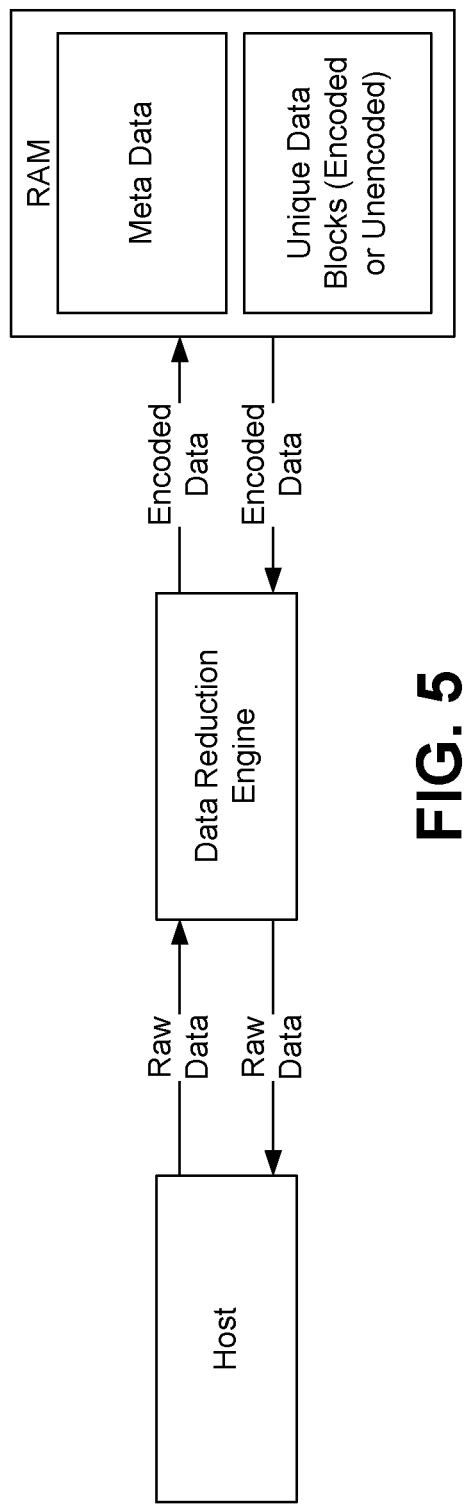
FIG. 5 is a schematic representation of a data reduction engine processing raw data received from a host for storage in RAM.

FIG. 5 is a schematic representation of a data reduction engine processing raw data received from a host for storage in RAM. As shown, in some embodiments, the data reduction engine can receive raw data from a host and encode that data for storage in RAM. Similarly, the data reduction engine can retrieve encoded data from RAM, decode that data, and provide raw data back to the host. In some embodiments, the data reduction engine encodes the data such that the amount of encoded data stored in the RAM is many times smaller than the amount of raw data that the encoded data represents. As discussed above, the data reduction engine can allow a RAM-based computer to operate substantially or entirely using only a processor and RAM, without the need for a conventional storage device because the storage size of the RAM is virtually amplified many times because of the data reduction engine.

In some embodiments, the data reduction engine, module, or software uses bit marker technology as described herein. Bit marker and data reduction technology are also described in U.S. application Ser. No. 13/756921, filed Feb. 1, 2013; U.S. application Ser. No. 13/797093, filed Mar. 12, 2013; U.S. application Ser. No. 14/804175, filed Jul. 20, 2015, now U.S. Pat. No. 9,304,703; U.S. application Ser. No. 15/089658, filed Apr. 4, 2016, now U.S. Pat. No. 9,628,108; U.S. application Ser. No. 15/089837, filed Apr. 4, 2016, now U.S. Pat. No. 9,817,728, International Patent Application No. PCT/US2016/025988, filed Apr. 5, 2016; and International Patent Application No. PCT/US2017/024692, filed Mar. 29, 2017, each of which is incorporated herein by reference in its entirety.

In some embodiments, the data reduction engine, module, or software operates as a low-level system component, e.g., lower than the applications, operating systems, and virtual machines running on the system. Accordingly, in some embodiments, the data reduction engine, module, or software can process data on the system in a manner that is not apparent to the applications, operating systems, and virtual machines running on the system.

In some embodiments, the data reduction engine, module, or software acts a shim between the host and data storage. In some embodiments, the host can send read and write requests as if it were using a conventional storage device. In some embodiments, the data reduction engine, module, or software can intercept these read and write requests and process the data. In some embodiments, the data reduction engine, module, or software can then read or write the data to the RAM. In some embodiments, the host may believe that it has read or written data to a conventional storage device, when in reality the data reduction engine has read or written the data to RAM.

In other embodiments, the data reduction system, module, or software may operate as a higher level component of the system, e.g., as a component of an application, operating system, or virtual machine running on the system. In these embodiments, the application, operating system, or virtual machine running on the system can process the data itself using the data reduction engine, module, or software.

In some embodiments, the data reduction engine, module, or software processes all data received by the system. That is, the data reduction engine, module, or software processes all data received from all applications, operating systems, virtual machines, etc., running on the computer system. In some embodiments, the more data that is processed by the data reduction system, the greater the virtual amplification and improved performance of the computer system.

As shown in FIG. 5, in some embodiments, read/write requests for raw data can be provided by a host and/or intercepted by the data reduction engine, module, or software. The host can represent, for example, an application, an operating system, a VM running on the system, etc.

In some embodiments, a write request may contain a stream of raw data to be stored. In some embodiments, the data reduction engine, module, or software can break the stream of raw data into one or more blocks. The blocks may be analyzed to determine whether they are unique. In some embodiments, only the unique data blocks are stored in the RAM. In some embodiments, the data reduction or virtual amplification can be achieved by only storing one instance of each unique data block. The pool of stored unique data blocks can be referred to as Capacity Efficient Shared Storage Pool (CESSP). The CESSP can include each unique data block stored by the system. In some embodiments, from the CESSP, all the raw data can be reconstructed by combining the various unique data blocks in the proper order.

In some embodiments, the data reduction engine, module, or software also stores meta data. The meta data can contain information that allows the raw data streams to be reconstructed from the stored unique data blocks. In some embodiments, the meta data can include the logical extended memories (LEMs) discussed below. In some embodiments, the meta data can include information about how many times each unique data block has been seen by the system. In some embodiments, the meta data can include pointers to the unique data blocks.

In some embodiments, the data in the RAM can be encoded using bit markers.

Figure 6:
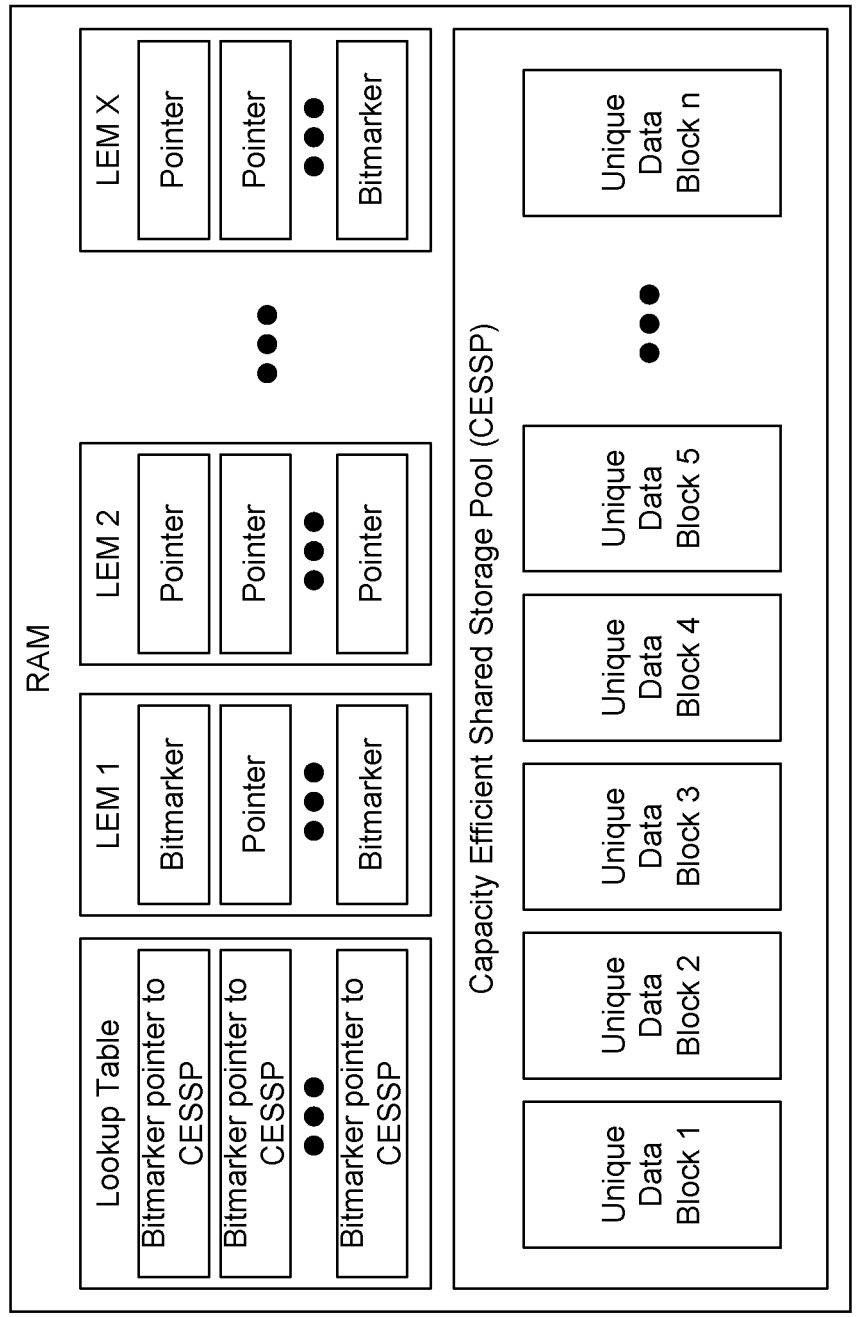
FIG. 6 is a block diagram illustrating a schematic representation of data stored within RAM according to one embodiment.

FIG. 6 is a block diagram illustrating a schematic representation of data stored within RAM according to some embodiments. As illustrated, in some embodiments, the RAM includes a Capacity Efficient Shared Storage Pool (CESSP), which can include one instance of each unique raw data block seen by the system. In some embodiments, the raw data blocks can be encoded using bit markers. In some embodiments, the RAM also include a bit marker table as described in the above-noted application that have been incorporated herein by reference. The RAM may also include one or more logical extended memories (LEMs). LEMs are described in greater detail in the following sections.

Logical Extended Memory (LEM)

In some embodiments, systems, devices, and methods described herein comprise and/or utilize a LEM (logical extended memory), which in general is a virtual disk. In some embodiments, a LEM represents an abstract virtual block, virtual disk, or an encoded RAM disk. In some embodiments, a LEM is a form of meta-data. In some embodiments, a LEM comprises a list of pointers. In some embodiments, the list of pointers in a LEM are pointing to data elements in the overall pool of raw data vectors, which in some cases is called a gene pool or CESSP. In some embodiments, the gene pool comprises data vectors, bit markers, raw data, and/or the like. In some embodiments, the genome, also referred to as all the data element stored in the RAM storage, is stored in real time memory (RTM).

In some embodiment, systems, devices, and methods described herein, utilizing only a processor and RAM, comprises RAM data storage which is configured to store a genome, also referred to as a gene pool, CESSP, or the entire data set, where all the data is stored and is represented, and such representation reflects all the files and blocks that have ever been read into the system. In other words, in some embodiments, the genome represents all the data that the computer system has processed. In some embodiments, the genome comprises raw data. In some embodiments, the genome comprises bit markers. In some embodiments, the genome comprises pointers. In some embodiments, the genome comprises unique data vectors. In some embodiments, the system comprises RAM storage configured to store meta-data. In some embodiments, the meta-data comprises data for deconstructing and reconstructing raw data from bit markers. In some embodiments, the genome comprises a combination of all of the foregoing data types. In some embodiments, the genome refers to the entirety of the RAM storage that is used for storing data versus tables and other pointers that point to other data elements and/or blocks of data within the genome.

In some embodiments, the system comprises RAM storage that is configured to store tables, wherein the tables allow for bit marker data to be stored and accessed for future deconstruction and reconstruction of raw data to and from bit markers. In some embodiments, the system comprises RAM storage that is configured to store LEM data, which can comprise a listing of pointers to data elements stored in the genome. In some embodiments, the LEM data, represents a virtual disk. In some embodiments, the system comprises RAM storage configured to store one or more LEMs, which in some cases can represent one or more virtual disks operating in the computer system.

In some embodiments, systems, devices, and methods described herein, comprising and/or utilizing only a processor and RAM, use statistical modeling and/or statistical predictions to determine what actual storage space in the RAM is necessary to effectuate a virtual disk of a particular storage size to be represented by the LEM. In some embodiments, the system utilizes statistical modeling and/or statistical predictions to determine the maximum virtual storage size that a LEM can represent to a virtual machine.

In some embodiments, systems, devices, and methods described herein, comprising and/or utilizing only a processor and RAM, can utilize LEMs in order to act as virtual disks. In some embodiments, the LEMs can point to data elements in the genome. In some embodiments, the LEMs can point to bit markers stored in a bit marker table, which in turn can point to data elements in the genome.

In some embodiments, systems, devices, and methods described herein, comprising and/or utilizing only a processor and RAM, can be configured so utilize bit marker technology and/or a LEM, wherein both utilize pointers to point to data elements stored in the genome in order to obfuscate and/or encode the raw data. In some embodiments, the data that is stored in the RAM storage of the system is obfuscated to such an extent that without the bit marker technology and/or the LEM, it would be difficult for a third-party to re-create or reconstruct the raw data that is stored in a deconstructed form in the RAM storage. In some embodiments, the system, utilizing only a processor and RAM, can make data stored in the RAM storage secure by obfuscating and/or encoding the raw data through the use of pointers to point to unique data elements stored in the genome.

In some embodiments, the systems disclosed herein comprise a base operating system that is configured to generate a LEM for presenting to a virtual disk to a virtual machine that is running a secondary operating system. In some embodiments, the base operating system comprises an application or interface that is integrated into the secondary operating system or operates on top of the secondary operating system, wherein such application or interface is configured to generate a LEM for presenting a virtual disk to a virtual machine that is running a secondary operating system. In some embodiments, the system comprises a base operating system that is configured to generate a LEM when a virtual disk is requested from a secondary operating system that is operating on the system. In some embodiments, the system comprises a base operating system that is configured to generate a LEM when a user instructs the operating system to create a virtual disk for a secondary operating system that is operating on the system.

In some embodiments, the creation of a LEM by the base operating system represents a virtual disk of a certain size, for example 10 GB, 20 GB, 30 GB, and the like. As discussed herein, in some embodiments, the LEM comprises a listing of pointers, wherein such pointers are pointing to data elements in the genome. Accordingly, in generating a LEM to represent a virtual disk of a certain storage size, in some embodiments, the system is not generating a virtual disk that actually has the particular storage size that is being presented to the virtual machine. Rather, in some embodiments, the system is using statistical modeling and/or statistical predictions to generate the virtual disk that represents a particular storage size. In other words, in some embodiments, the system is creating a LEM to represent a virtual disk by using a listing of pointers to data elements stored within the genome, wherein such data elements are used over and over again by other pointers in the system, thereby avoiding the need to have such data elements be repeatedly stored into RAM. In some embodiments, by avoiding the need to repeatedly store into RAM data elements that are identical, the system need not create a virtual disk of a particular size storage size by allocating actual storage space in the RAM that is equivalent to the particular storage size that is represented by the LEM. Rather, in some embodiments, the system can allocate actual storage space in the RAM that is far less than the particular storage size that is represented by the LEM.

Virtualization of a Virtual or Physical RAM-based Disk(s) in an Operating System (OS)

As illustrated above, in some embodiments, the hierarchy of a system that allows server virtualization can comprise a lower level system, called a hypervisor that runs on an operating system (e.g., Linux or Windows, but could be purpose-written). In some embodiments, this lower level system allows virtual machines (VMs or guests, e.g. operating system instances running one or more applications) to run along with other guests at the same time). In some embodiments, for each operating system instance running under the hypervisor, each operating system creates system and data disks for operating system and application use. Traditionally, these disks are physical disks that are made up of pieces of HDDs or SSDs, but could be virtual (e.g. RAID storage of which a portion of the RAID storage, which is a group of disks set up by the operating system guest system setup software, something within external storage to the box the operating system guest is running in (e.g. array controller) organized to provide data protection and/or performance). However, within operating system's today, a 'physical disk' may be made up of RAM or other block based memory (flash, cross-point RAM, re-RAM, or any other solid state block based memory). This lower level system can be in hardware or run on hardware.

As described herein in some embodiments, with RAM or block-based memory, virtual peripheral storage volumes/partitions can be created, and these can translate to virtual RAM/block based memory, which can then translate to virtual encoded RAM/block based memory. All of this can allow for non-contiguous memory to be used to allow for fault tolerance while still being so much faster than peripheral storage such that peripheral storage is no longer required for random, small block IO, as is typically done with HDDs and SSDs. In some embodiments, this virtualization technique allows for RAM/block based memory based 'disks' to relegate peripheral storage to what it was before DRAM was invented, i.e., sequential large block IO for ingress of input raw data and output/storage of derived information from the application that operated upon the input raw data.

As illustrated above, in some embodiments, the system, at a hardware level and/or at a lower system software level that supports virtual machines (which in some cases can be a hypervisor, or the operating system, or a program running in the system), can be configured to utilize LEMs and/or bit markers to virtualize and/or virtually represent virtual or physical RAM outside of a virtual machine operating system that is running on the system. In particular, LEMs can comprise a bucket of pointers that point to physical addresses in the RAM. As such, in some embodiments, when an operating system in a virtual machine reads or writes seemingly continuous data, the virtual machine's operating system interacts with the system, wherein the system can be configured to utilize LEMs to retrieve one or more pointers to fetch raw data from RAM, which in fact is not contiguous, to present to the virtual machine's operating system.

In some embodiments, a higher level operating system, for example, an operating system for a virtual machine, can be configured to virtualize RAM disk by one or more processes at an operating system level as opposed to at a hardware level and/or at a lower system software level that supports virtual machines. In other words, in some embodiment, a high-level operating system can be configured to process the virtualization as described below. In particular, in some embodiments, an operating system can be configured to access and utilize a translation table between a virtual address and a physical address of a RAM. The translation table can be located inside the operating system or outside, for example in a hypervisor. In some embodiments, when an operating system requests one or more bytes of data that are contiguous or at least seemingly contiguous, the operating system can be configured to access a translation table, which translates such seemingly contiguous data blocks into physical locations or addresses in the RAM. As such, in some embodiments, the operating system can fetch the raw data from the RAM for use by use of such translation table.

In some embodiments, virtualization and/or virtual representation of a virtual or physical RAM disk(s) can encode raw data, for example by use of a translation table. Further, in certain embodiments, virtualization and/or virtual representation of a virtual or physical RAM disk(s) can also provide increased capacity or virtually increased capacity, for example by use of bit markers, and/or increased performance, for example by decreasing the number of read and/or write processes required by a computer system. In some embodiments, virtualization and/or virtual representation of a virtual or physical RAM disk(s) can also be used to duplicate data on bad memory, thereby resolving any related issues.

Virtualization of RAM disk can also be advantageous to allow mixing and matching of different media types, including those that are fast and slow. For example, in certain embodiments, a LEM outside of an operating system or translation table can determine whether one RAM media should be used over another RAM media depending on its characteristic, such as fast or slow.

Generally speaking, certain operating systems are configured to utilize block media, such as for example hard drives or FSBs. At the same time, certain operating systems can be able to tell the difference between a RAM disk, such as volatile RAM, compared to a block disk. Certain operating systems can also allow a user to set up cache, virtual memory, and/or a virtual disk, which can be physical in the sense that it can be based on RAM or another physical disk. In some embodiments, the ability to set up a virtual disk can be thought of as an added feature on top of the base operating system. For example, in some embodiments, an operating system can comprise a volume manager that is configured to set up one or more volumes for physical disks and/or virtual disks, such as RAID volumes.

In other words, generally speaking, certain operating systems, such as Microsoft Windows Linux or any other operating system, can allow 'disks' to be made up of RAM, which can be 'contiguous' segments of memory made for typically small usages, for example possibly to hold an image of an executable program or store something fast for an application without the normal use of peripheral storage. In certain cases, if anything happens with respect to hardware errors in writing or reading of the RAM, the data can be corrupt, as it can be seen as a 'physical' 'disk' to the operating system. Generally speaking, in certain computer systems and/or servers, when such errors occur, the system and/or server can be configured to assume that the data has been stored already persistently within a peripheral storage device or that the data is lost and either has been made to be a 'don't care' as the data was a scratchpad' for intermediate results or used as some sort of cache to sit in front of peripheral storage, all of which can be assumed to be a 'normal' case.

However, in some embodiments described herein, the system can be configured to use RAM disks as mainline disks (system or application disks). In some embodiments in which the system does not periodically use peripheral storage to cover power failures or cell failures, data within the RAM disk can be lost upon error, power failure, cell failure, or the like. In some embodiments, if a UPS is enabled, the RAM disk can still be open to data loss for any double bit ECC error or otherwise uncorrectable error in a byte, word, or block of memory.

Accordingly, in some embodiments described herein, the system can be configured to allow virtualization and/or virtual representation of a virtual or physical RAM-based disk(s) including volatile RAM, non-volatile RAM, ReRAM,)(Point memory, Spin-RAM, dynamic memory, memristor memory, or any other type of memory. As such, in some embodiments, the type of RAM disk can be that which is exactly RAM, meaning random access down to the byte or new, block based 'memory' that can be placed on the CPU RAM bus and treated in a virtual manner as described herein. In particular, in some embodiments, the system can be configured to allow virtualization and/or virtual representation of a virtual or physical RAM-based disk(s) within an operating system and/or outside of an operating system.

In some embodiments, a virtual RAM disk can be a RAM disk that is potentially created by an operating system or other entity underneath an operating system (such as hypervisor, Formulus Black forCE OS, etc) that basically abstracts the access to RAM so that the memory involved within the virtual RAM disk. The operating system can be any operating system, including but not limited to Microsoft Windows, Mac OS, Unix, Ubuntu, BeOS, IRIX, NeXTSTEP, MS-DOS, Linux, or the like. Further, in some embodiments, the system can allow virtualization and/or virtual representation of a virtual or physical RAM disk(s). In some embodiments, virtualization and/or virtual representation of a virtual or physical RAM disk(s) can utilize one or more processes described herein relating to bit markers, LEMs, or the like.

More specifically, in some embodiments, virtualization and/or virtual representation of a virtual or physical RAM disk(s) can comprise translating a physical address on a RAM disk to a virtual address or vice versa. In other words, virtualization and/or virtual representation of a virtual or physical RAM disk(s) can comprise virtualizing what the physical or virtual nature of a particular RAM disk that can involve rerouting. As a non-limiting example, in some embodiments, virtualization of a physical or virtual RAM disk can be thought of as an organizational feature.

In some embodiments, the system can comprise a feature within an operating system, such as a volume manager for example, that allows a user to virtualize RAM disk. In some embodiments, in order to virtualize virtual or physical RAM within an operating system, the system can be configured to utilize one or more different mapping techniques or processes. For example, an operating system can be configured to process in terms of physical addresses, such as outputting a physical address in the kernel of the operating system or the like. In some embodiments, the mapping can comprise a translation table between a virtual address and a physical address or vice versa. In some embodiments, by providing such mapping to virtualize RAM disk, data can be encoded and/or the capacity and/or performance of RAM can be increased. In some embodiments, one or more drivers can be configured to re-route the physical address based on which the operating system is processing to a virtual address or vice versa. In some embodiments, the system can be configured to use LEMs as described herein to conduct a more direct mapping instead of re-routing by use of drivers, for example outside of the operating system.

In some embodiments, the mapping technique or process does not need to be to contiguous memory. While an operating system may view the virtualized RAM disk as a contiguous disk, as is the case with a conventional hard drive, the system, through virtualization and/or mapping, can in fact convert the physical address to a virtual address on the RAM, in which data can be accessed individually in any order or point. In other words, in some embodiments, the system can be configured to present one or more virtual block addresses or virtual byte to the operating system such that the operating system thinks that it is accessing physical block addresses. However, such virtual block addresses or virtual byte addresses may in fact have no linear normal physical relationship to the underlying memory. As such, in some embodiments, while an operating system may know that it is talking to RAM and access bytes by some contiguous state, a translation table and/or virtualization process between the operating system and the RAM can be configured to translate such contiguous bytes into physical addresses in the RAM where the data is stored. Thus, in some embodiments, the system can be configured to represent seemingly contiguous bytes of data that the operating system needs to read, even though the data may not in fact be in linear order but rather stored in random locations on RAM.

In some embodiments, the mapping or rerouting does not need to be contiguous. As such, in some embodiments, a level of indirection is provided to allow for fault tolerance of the RAM disk in order to get around the problem with conventional RAM disks that require contiguous, working RAM. In some embodiments, indirection can allow for bad location re-mapping or re-vectoring. Also, in some embodiments, the access, although with more instructions, may still be on the order of memory access as the additional instructions to get to the actual data for read or write can be small in the number of CPU cycles as compared to any disk made up from peripheral storage.

In some embodiments, the system can be configured to generate and/or utilize an Encoded Virtual RAM Disk(s). In some embodiments, an Encoded Virtual RAM Disk(s) can be a virtual RAM disk(s) that allows encoding and/or decoding of data within the virtual RAM disk(s), for example relying on any one or more features of a base virtual RAM disk as described herein.

In some embodiments, encoding for data reduction, which can also provide security for the data, can allow the overall computer system to operate or run faster without the need for peripheral storage at all, for example in a computer system with dual external power in which power never becomes an issue for volatile RAM. In particular, in some embodiments, data reduction with a virtual RAM disk(s) can allow less writes to occur to the memory as the encoding engine can take substantially less time to encode than to write to external storage and therefore take up less bandwidth of the CPU memory as well as overall space within the fixed RAM size of a given computer system. In some embodiments, encoding can be for use in security, such as encryption, data-reduction, or both in reads and writes to/from the RAM. Furthermore, in some embodiments, an Encoded Virtual RAM Disk(s) can comprise one or more memory types for such uses as 'tiered' performance, in-line upgrade or replacement, and/or for different encoding or security types within the virtual RAM disk, for use by multiple applications at the same time, but at different sections of the virtual RAM disk.

Clustering

The RAM-based computer systems, devices, and methods described throughout this application can be used for a wide variety of purposes. In some embodiments, the RAM-based computer systems can include one or more of the additional features described below, including but not limited to clustering, virtual machine mobility, data security, and/or data backup functionality.

In some embodiments, RAM-based computer systems can be clustered together in various ways to provide additional functionality, high availability, fault tolerance, and/or data protection.

In a first example, two or more RAM-based computer systems can be arranged into a cluster by connecting them communicatively over a network (e.g., Ethernet, fiber, etc.) or over a memory channel as described above. In this arrangement, it is possible to move virtual machines between the clustered RAM-based computers. Moving virtual machines can be achieved using, for example, a software platform. Virtual machine mobility is described in greater detail below.

In another example, two or more RAM-based computers can be clustered together by replicating RAM of a first RAM-based computer to half of another independent RAM-based computer. This may be considered an active-active cluster configuration and is mentioned above. In this case, the first RAM-based computer dedicates a portion of its RAM to running its own virtual machines and applications and another portion of its RAM to backing up another clustered RAM-based computer. If either RAM-based computer goes down, the surviving computer can take over. In another example, the RAM-based computers can be active-passive clustered, with one RAM-based computers actively running guests while another RAM-based computers is used merely to back up the RAM of the first and to take over only in the event that the first fails.

In another example, guests (e.g., virtual machines) on two or more RAM-based computers that can be clustered using their own operating system/guest clustering, while, at the same time, lower level software or hardware running on the RAM-based computers replicates virtual disks of the virtual machines between the RAM-based computers. This can allow for high availability for the OS/guest for its active-passive or active-active application between the RAM-based computers.

In another example, guests (virtual machines) on two or more RAM-based computers, each having their own set of virtual machines in each half of their RAM while replicating their half to their partner (e.g., active-active), can failover to the other RAM-based computers because the 'state' of each guest's RAM is also replicated either in software or hardware to the other RAM-based computers. In some embodiments, this can be accomplished with hardware that automatically replicates any RAM write to another region of memory upon setup.

Virtual Machine Mobility

In some embodiments, the RAM-based computer systems, devices, and methods described herein can allow improved and highly efficient cloning and transfer of virtual machines (VMs).

Figure 7:
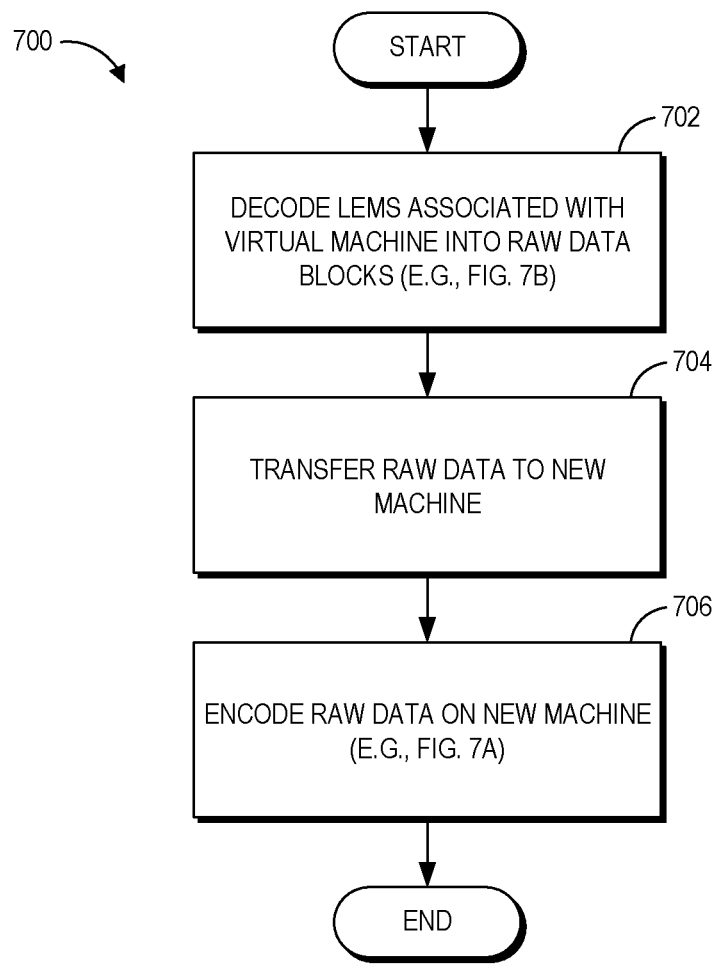
FIG. 7 is a flowchart illustrating an example method for transferring virtual machines between RAM-based computer systems according to one embodiment.

FIG. 7 is a flowchart illustrating an example method 700 for transferring virtual machines between RAM-based computer systems according to some embodiments. In the illustrated example, the method begins at block 702 at which LEMs associated with the VM to be transferred are decoded on the source machine. In some embodiments, this converts the encoded, compressed data associated with the VM into raw data.

In some embodiments, at block 704, the raw data is transferred to the target machine. Transfer can occur, for example, over a memory channel (see, e.g., FIG. 3), if available. This can greatly increase the speed of the transfer. In some testing, it has been determined that the RAM-based computer system efficiently performed virtual machine state and storage movement between in a RAM-based computer system over a memory fabric at 3-10 times the throughput as today's fastest Ethernet networks (40 Gb-100 Gb), in addition to much less latency. In some embodiments, the transfer can also occur over a network connection, such as an ethernet connection or a fiber channel.

In some embodiments, the method continues at block 706 on the target machine. In some embodiments, if the target machine is a RAM-based computer system the received raw data can be encoded on the target machine. In some embodiments, this can involve setting up new LEMs on the target machine.

Notably, in some embodiments, the encoding of the VM data on the target machine may not (and likely will not) match the encoding of the VM data on the source machine. This can be because each machine has its own CESSP and has developed its own bit markers and encoding methods based on the data it is has previously ingested.

In some embodiments, cloning a VM on a RAM-based computer can also be accomplished simply. For example, it may only be necessary to create a copy of the LEMs associated with the VM.

Data Security

Data security is increasingly important. Most security for data is done either by physically separating infrastructure such as networks, using passwords, or more recently and much more widely than before, cryptographic methods for encrypting data.

In some embodiments, the RAM-based computer systems, devices, and methods described herein can provide improved data security because of the data reduction engine used there. In some embodiments, by its nature, the generation of symbols from original data, and the continuous process of ingestion and new bit marker creation provides a natural form of data security.

For example, the data reduction engine, module, or software can reduce data for a given system from all the unique raw data files and data output to an encoded bit marker representation that can be unique for every instance of every server system instantiation. Because of the nature of data and data reduction engine, the more data that is ingested and used by the system, the more obscure the actual data is. Unless the encoded data is reconstructed through the data reduction engine with appropriate access controls through the tools within the server, administered only by customers, the data is generally inaccessible.

In general, all or most cryptography methods have been known to be 'hackable' and have been shown by nation-states to be so in espionage, let alone private individuals or organizations. Physical security breaches are the worst cause data loss or leaks of company data.

In some embodiments, the server systems described herein can provide technology not just with the data reduction engine for data 'in-use', 'in flight' or 'at rest', but also for physical security by nature of the server design and components designed into the server.

Data Backup Functionality

Today, in general, backup and restore are still the key needs for data centers according to many industry analysts. The sheer amount of data, let alone the time it takes to backup or restore data are the problems many companies develop newer and newer products to solve. Backup and restore are generally done in one of two places today, either in a storage array/appliance, or on a server with software built into the operating system or application software that is loaded to run on the server.

The forms of backup generally fit into three categories:

First, Snapshot—a fast, software pointer based replica of the original data volume, referencing the original data when a snapshot is used for read or write. Problems exist here in all implementations because of the performance loss of reading the same data at the same time by applications using the original data on one or more snapshots of the original volume, or worse writes that cause indirection to new storage as well as using the original volume. This performance loss can be noticeable when accessing the storage system or server and is made worse the more a snapshot is used for normal operation with more and more writes.

Second, Clones—A slower process that provides a full copy of the original volume. The problem here can be that the time it takes to perform the clone operation and doubles the storage when a clone operation takes place. When the operation takes place a noticeable degradation of performance within the server or array can occur.

Third, Full Backup—A long process to read all the data and may be the same as a clone, but is typically all of the data volumes associated with a given application. This process does take time and does affect system performance when the backup is performed. This process can take less time when 'incremental backups' are performed after the first, full back up, but, restoration times are longer because the original backup, as well as the incrementals must be used in the restoration process.

In other words, to perform backups (or restores), time, space, and performance are generally always an issue, causing data centers to dedicate more resources to take care of these issues or have 'planned' times to perform such processes. In all cases, however, restoration, in general, after data loss is and has continued to be a large problem for business continuance.

In some embodiments, the systems, devices, and methods disclosed herein are advantageous because of the data reduction engine or module and/or the purpose-built server (specialized architectures) have solved both problems associated with snapshots, clones, and backup, both in the space required, but also with the performance issues encountered when using snapshots or restoring data from a backup. This is because of the drastic data reduction provided by the data reduction engine. This means less data is stored or re-read during any and all of these operations.

In some embodiments, SIS (state independent snapshot), and SIC (state independent clones) are two features that take less than a second to a few seconds and take almost no storage, are state independent from the original volume, and cause no performance degradation when the feature is used or when the snapshot or clone is mounted, either for read only or for read/write, unlike all other implementations of snapshot currently in the industry.

In some embodiments, the RAM-based systems, devices, and methods include and/or utilize a blink feature. Blink is another feature, associated with a 'plug-in' technology module, referred to as the Blink Card, that allows in some embodiments not only full backups for an application, but a full infrastructure backup of all the settings for all OS, virtualization, and applications along with data associated with same. In some embodiments, a Blink takes minutes to perform even on the most fully loaded server system, such as one with hundreds of virtual machines running multiple, different operating systems, with multiple, different data sets and applications. All of this is made possible once again by the data reduction encode/decode engine.

In some embodiments, the Blink card allows many entire infrastructures to be backed up, allowing the customer to re-purpose a server system at any time, but also to remove the Blink card and almost instantly configure a new server system without the time and potential mistakes that happen today with the best of IT managers and data centers.

All of these backup features accelerate IT and allow more to be done faster and with less infrastructure and less OPEX. The ability to configure, re-configure, roll-out additional infrastructure, and all associated with a datacenter is accelerated with the embodiments disclosed herein.

Cloning

In some embodiments, systems, devices, and methods described herein, utilizing only a processor and RAM, is configured to clone apart or all of the system. In some embodiments, the system is configured to perform cloning by copying a LEM, which can comprise a listing of pointers to data stored in various parts of the RAM. In some embodiments, the system can be configured to clone by taking a snapshot of the LEM, in other words copying the listing of pointers existing at a particular point in time. Accordingly, the system can be configured to perform cloning at a rapid pace because the copying of pointers can be quite efficient relative to copying raw data because the byte-size of pointers is only a fraction of the byte-size of raw data. In some embodiments, the system can be configured to store the data for the cloned system onto a removal drive, such as and or a conventional storage device, such as and HDD or SSD. In some embodiments, the removable drive or other conventional storage device having the cloned system stores thereon can be installed and or coupled to a secondary computer system in order to restore the cloned system to the secondary computer system. In some embodiments, the cloned system can be restored to the original computer system hardware, for example, in the case that the original computer system hardware was fixed and/or altered.

In some embodiments, the restoring of a cloned system to a new or original computer system hardware can occur at a rapid pace relative to traditional restoration of a cloned system because in order to restore the cloned system all that is needed is to copy the LEM, which can be a listing of pointers, when the cloned system is being restored onto the original computer system hardware comprising the genome. In instances where the LEM and the genome must be copied onto new computer system hardware in order to restore a cloned system, the time it takes to copy such data onto the new computer system hardware is reduced relative to traditional restoration of cloned systems where all the raw data from the system to be cloned is copied from because by only copying the LEM and the genome, the system is only required to copy a fraction of the amount of the raw data. For example, in some instances, the restoration of a cloned system only requires the copying of 2 gigabytes of data, wherein such data represents 20 to 40 gigabytes of raw data that has been encoded or deconstructed using the bit marker technology disclosed herein.

In some embodiments, the cloning of a system requires not only the copying of the listing of pointers but also the copying of the genome data set, also referred to as the entire data set comprising the raw data, bit markers, data vectors, and the like. In a sense, the entire data set is the dictionary that is needed to reconstruct the raw data from the listing of pointers, also known as the LEM. In some embodiments, the entire genome data set is required when the clone system is being restored to a new computer system hardware. In some embodiments, the restoring of a cloned system does not require the copying of the entire genome data set because the cloned system is being restored to the original computer system hardware, which already comprises the genome data set.

In some embodiments, the cloning of a system involves making a copy of application data such that the cloned data can be used in a different virtual machine. In some embodiments, the cloned data that is to be restored and/or used on a different virtual machine can involve a different virtual machine operating on the same computer system hardware or a different virtual machine operating on an entirely separate computer system hardware.

Power and Failure Mechanism

In some embodiments, the system comprises a power source to serve as a backup power supply in the event that the main power supply fails to provide power or adequate power to the system. In some embodiments, a backup power supply is necessary for the system because a system that only uses a processor and RAM, without the need of a conventional storage device, primarily stores data to RAM, which does not store memory permanently, and therefore the system does not have a permanent memory storage mechanism. In some embodiments, to enable permanent memory storage in such a system that only uses a processor and RAM, without the need of a conventional storage device, the system is configured to continuously and constantly supply power to RAM in order to make sure the memory stored in the RAM is maintained even when there is a disruption of power from the main power supply. In some embodiments, the system is configured to ensure continuous and constant power supply to the system through a backup power supply. In some embodiments, the backup power supply is configured to supply power to the motherboard of the system in order to ensure that the entire motherboard remains powered in the event that the main power supply is unavailable. In some embodiments, a system operating primarily using a processor and RAM with a backup power supply can be configured to act as a server and an array controller. In some embodiments, the system primarily using a processor and RAM without the need of a conventional storage device and operating with a backup power supply can be configured to act as a non-stop fault tolerant fully DRAM (or NVDRAM) based computing system.

In some embodiments, the system, device, or method, utilizing only a processor and RAM, comprises and/or utilizes one or two or more energy sources that are integrated in or are coupled to the system, for example, the motherboard. In some embodiments, the two or more energy sources comprise a UPS (uninterruptible power supply) battery backup system. In some embodiments, the one or more energy sources comprise a supercap, also known as a supercapacitor or electric double-layer capacitor (EDLC) or ultracapacitor or Goldcap. Such supercaps are generally a high-capacity capacitor with capacitance values much higher than other capacitors but with lower voltage limits. Supercaps can store 10 to 100 times more energy per unit volume or mass than electrolytic capacitors, and in some cases, can accept and deliver charge faster than batteries. In some embodiments, supercaps can go through more charge and discharge cycles than rechargeable batteries. In some embodiments, the system cannot be configured with a supercap because such supercaps do not store enough energy necessary for the system to keep data stored in RAM long enough and/or for copying all the memory from RAM to a convention storage device for permanent memory storage.

In some embodiments, the system comprises a UPS, which can provide enough energy for the system to persistently store data in RAM for extended periods of time and/or for copying all the data in RAM to a conventional persistent memory storage device for permanent storage. For example, where the system is acting as an array controller with a large memory store, then the system can be configured to comprise a UPS in order to provide sufficient energy to the system for the system to persistently store data in RAM for extended periods of time and/or for copying all the data in RAM to a conventional persistent memory storage device for permanent storage (which is done in most cases when power is removed from the system for more than a few minutes, as most power failures are less than a few minutes and the system is intelligent to know the difference). In some embodiments, the system comprises at least two energy resources in order to ensure that the system has redundancy, for example, in case one of the back up energy sources fails.

In some embodiments, the systems disclosed herein comprises dual back up energy sources. In some embodiments, the system, using primarily a processor and RAM to process data without the need of a conventional storage device, comprises two backup energy sources in order to allow one of the energy sources to remain online (for high availability) for supplying backup energy in case of a power failure, and to allow the other backup energy source to go offline and remanufacture itself. In some embodiments, the system is configured to be able to remanufacture periodically one of the dual back up energy sources while the other back up energy source remains engaged to protect the system from power loss. In some embodiments, the ability to re-manufacture a back up energy source, which in some cases is a battery, allows the energy source to last longer and/or be more accurate in the information that provides the system as to its charge level. In some embodiments, the two or more backup energy sources, for example, UPS's, that covering two or more computing systems, are configured to allow and/or instruct one or more of the backup energy sources, but not all, to go through the remanufacture process and be taken offline. In some embodiments, the remanufacture process can comprise discharging the backup energy source (for example a lead acid battery) to a threshold level, for example, 10%, 15%, 20%, 21%, 22%, 23%, 24%, 25% or the like. In some embodiments, the remanufacture process can comprise performing a recalibrate of the energy source such that when device comes back online, it not only extends the life of the backup energy source, for example the UPS, but also it guarantees that the backup energy source's, for example a battery, health meter about how much percent of energy there is in the device is accurate. This is as opposed to traditional use of UPS because most systems only use one UPS and therefore, trying to re-manufacture or re-calibrate while the UPS is 'online' severely limits the utility of such a re-manufacture/re-calibration process with a UPS or other power source.

This can be particular advantageous because if a backup energy source inaccurate informs the system that it has a higher percentage of available energy in the system than it actually has, then the system could be in danger of not having enough energy to copy or mirror data from the RAM into a conventional storage device and/or other computing system during a power supply failure situation.

In some embodiments, the system is configured to send an electronic communications signal to the backup energy source device to perform the remanufacture process. In some embodiments, the system, using primarily a processor and RAM to process data without the need for a conventional storage device, is configured to send an electronic communications signal to the backup energy source device on a periodic basis (for example, every several hours, every several days, every several months, or every several years), and/or whenever a threshold level is reached (for example, number of days since last remanufacture, or a low percentage of available energy in the energy source device, or any other threshold level) and/or after any power failure event has been detected. In some embodiments, the backup energy source device itself is configured to perform the remanufacture process on a periodic basis (for example, every several hours, every several days, every several months, or every several years), and/or whenever a threshold level is reached (for example, number of days since last remanufacture, or a low percentage of available energy in the energy source device, or any other threshold level) and/or after any power failure event is detected. In such cases, the backup energy source device can be configured to send an electronic communications signal to the system and/or other backup energy source devices connected to the system in order to inform such systems and/or devices that the backup energy source device is undergoing remanufacture and not to rely on the backup energy source for energy in case of a power failure and/or to ensure that at least other backup energy source device is available to supply backup energy in case of a power supply failure.

In some embodiments, the electronic communications signal is transmitted over an ethernet connection, specialized serial connection, BUS connection, memory tunnel connection, or any other type of communications channel. In some embodiments, the system and the backup energy source devices are in electronic communication in order to coordinate the remanufacture of all the energy source devices one after another. In some embodiments, a multi-computing system cluster comprises 2, 3, 4 or more backup energy source devices to cover all the computing systems in the cluster. In some embodiments, the system and/or the backup energy source device is configured to send an alert signal to a user in the event that the energy source device fails the remanufacture process and/or fails to meet a threshold level of energy capacity after a remanufacture process, wherein such alert signal can cause in certain embodiments the replacement or repair of the energy source device at issue. In some embodiments, the computing systems disclosed herein are configured with a command function that is part of the operating system and/or is part of a separate application running on the computing system, wherein the command function allows the system to cause the backup energy source devices to perform the remanufacture process.

In some embodiments, the system, device, or method comprises and/or utilizes a central fault tolerant manager, which is configured to coordinate and/or generate the command function for backup energy source devices to perform the remanufacture process. In some embodiments, the central fault tolerant manager is configured to analyze, in real-time, substantially real-time, periodic basis, batch basis, or the like, the RAM and/or the system to determine if bit errors arise in reading and/or storing data from and to RAM. In some embodiments, the central fault tolerant manager reads (in real-time, substantially real-time, periodically, and/or on a batch basis) every available location in the RAM storage to identify locations returning bit errors, introducing latency, or other failures. In some embodiments, the central fault tolerant manager operates in the background. In some embodiments, the central fault tolerant manager operates continuously.

In some embodiments, the system is configured to comprise a central shut off mechanism for turning off the power for all hardware devices operating in the system. In some embodiments, the foregoing central shut off mechanism is necessary because all hardware devices comprise some software to operate the hardware device, and in many cases, such software can hang or become unresponsive or fail.

In some embodiments, the system is configured to be able to shut power off to any component operating in the system in the event that the system detects that a specific component is not operating properly. For example, the system can be configured to shut power off to a convention storage device, such as an SSD, in the event that the conventional storage device is not functioning. In some embodiments, the system is configured to turn power back on to the component in order to reboot the component. In some embodiments, the act of returning power to the component can resolve any malfunctioning of the component. For example, in rebooting an SSD, the storage device could return to normal function, thereby requiring that the system mirror and/or synchronize the new data onto the storage device, wherein in the new data was generated when the SSD was rebooting.

In some embodiments, a system comprises a single physical box having two processors and two RAM storages, wherein one of the RAM storages serves one of the processors and the other RAM storage serves the other processor. In some embodiments, such a system does not have a single point of failure and no common mode failure. In some embodiments, such a system is the safest system from a loss data and loss availability protection viewpoint. This example of two processors and two RAM storages is just one example, among many. Systems can, in some embodiments, include, one, two, three, four, five, six, or more CPUs and RAM storages.

In some embodiments, the systems disclosed herein have one, two, three, four, five or more backup energy sources coupled to the computing systems. For example, in a system comprising two computing systems, the system can comprise three backup energy sources wherein the first backup energy source is the primary backup for the first computing system and the second backup energy source is the primary backup for the second computing system, and the third backup energy source is the backup for the first and second energy sources. In some embodiments, a system comprising paired computing systems comprise two backup energy sources wherein the first backup energy source is coupled to the first computing system, and the second backup energy source is coupled to the second computing system. In some embodiments, a system comprising paired computing systems comprise two backup energy sources wherein the first backup energy source is coupled to the first and second computing systems, and the second backup energy source is coupled to the first and second computing systems. One of ordinary skill of the art can imagine other similar setups, configurations, and/or combinations for coupling a plurality of backup energy sources to a plurality of computing systems of a cluster system in order to ensure no power loss occurs to any of the computing systems of the cluster thereby preventing data loss in the RAM storages.

In some embodiments, the system comprises RAM that is subject to alpha particles and/or beta particles, which can cause transient single bit errors when reading and/or storing data to the RAM. In some embodiments, the system comprises RAM that has transistors that can periodically die or fail, resulting in a hard single bit error. In either of the foregoing instances of RAM failure, in some embodiments, the system can be configured to identify such RAM failures and cause the system not to use such areas of the RAM memory.

In some embodiments, the system is configured to identify locations in the RAM where there is a single bit error or whether the system is identifying a number of transient single bit errors at a particular location in the RAM that exceeds a threshold. In either of the foregoing instances, the system can be configured to avoid using the identified locations in the ram, essentially mapping out the locations in the RAM that are producing failures. In some embodiments, the avoidance of identified locations in the RAM that produce bit error failures allows the system to become a fault tolerant system that does not lose any data. In some embodiments, it is important that the system not lose any data because any loss of data would prevent the system from reconstructing raw data from the capacity efficient shared storage pool. In some embodiments, the identified locations in the RAM that produce failures are avoided and in some embodiments, the system is configured to replace or remap or revector such memory locations with spare locations in the RAM. In some embodiments, the system is configured to move or copy the data stored in the identified locations of the RAM that are producing bit error failures into the spare memory locations in the RAM that have been used to replace or remap or revector the identified memory locations that are failing.

Fractal Algorithm

In some embodiments, the system can be configured to utilize a fractal algorithm to implement bit markers in a computer system. In some embodiments, a fractal algorithm requires more overhead processing (which can be overcome by using a slightly faster CPU, but the ROI of cost/performance by using this algorithm method is about 10-1, which makes it not only viable, but obvious to move towards), but a fractal algorithm can provide more storage capacity on a RAM device than other bit marker implementations. In some embodiments, the system is configured to comprise a processor with an integrated FPGA, ASIC, or integrated into a CPU chip that can be configured to process the fractal algorithm, which in some embodiments, can reduce the overhead processing times and/or processing work that a fractal algorithm can require. In some embodiments, an FPGA chip, or additional hardware integrated into the processor (CPU) of the system can improve processing speeds to account for increase computational processing thereby yielding high performance with increased storage capacity made possible using a fractal algorithm.

In some embodiments, the system implements bit marker technology by utilizing fractal algorithms to compute pointers and/or where the data is located in memory. In some embodiments, the computing of pointers and/or where the data is located in memory allows the system to re-create the raw data that has been deconstructed and stored in RAM as various data vectors based on bit marker technology. In some embodiments, the use of fractal algorithms to implement bit marker technology can result in a 30×, 40×, 50×, 60×, 70×, 80×, 90×, or 100× improvement in the storage capacity of RAM. In some of the embodiments, the use of fractal algorithms to implement bit marker technology can require additional overhead processing which can be accounted for using hardware accelerator technology, such as FPGA chips with in a processor. In some embodiments, the system uses hardware acceleration to account for increased overhead processing due to the use of fractal algorithm(s). In some embodiments, the system is configured speed up processing to account for using fractal algorithm(s) by using an optimized memory block size, also referred to as grain size, that does not have as much overhead to make use the fractal algorithms more efficient.

Disk Array Controller

In some embodiments, the system, device, or method, utilizing only a processor and RAM, is configured to become a disk array controller. In some embodiments, the system acting as a disk array controller comprises a server front end portion and a disk controller backend portion, wherein the front-end server portion interfaces and communicates with other systems to present the storage devices as one or more logical units.

In some embodiments, the system, using only a processor and RAM in combination with a backup energy source, is a merge of a server and a redundant storage array controller and comprises data protection, high availability, error recovery, data recovery, and/or fault tolerance. In some embodiments, the system disclosed herein are a new computer design that fuses computing and storage. In some embodiments, the systems disclosed herein act as a server and a front end of an array controller. In some embodiments, the systems disclosed herein reduce the need for external storage performance to only be that of sequential IO or transfers with high bandwidth. In some embodiments, the system, utilizing only a processor and RAM, is configured to make RAM the only storage media for data storage and applications and other systems. In other words, in some embodiments, the data remains in a memory BUS in the systems disclosed herein.

In some embodiments, the system is a RAID controller and/or an array controller. In some embodiments, the system cannot lose data because if any data is lost the system may not have the necessary pointers and/or data vectors and/or bit markers and/or raw data and/or the like to reconstruct the raw data that has been deconstructed and stored in RAM. Accordingly, in some embodiments, the system is configured to remove from usage any data lines and/or integrated circuits of the RAM that return a single bit error out because the system does not want to lose data stored in the RAM. In some embodiments, the system is configured to track and monitor any data lines and/or integrated circuits of the RAM that return a single bit error out because such data lines and/or integrated circuits of the RAM are deemed suspect because the system does not want to lose data stored in the RAM. In some embodiments, the system can be configured to remove from usage any data line and/or integrated circuit that returns a number of bit error out that exceeds a threshold level based on the tracking and monitoring. In some embodiments, they system is configured to replace data lines and/or integrated circuits of the RAM that have been removed from usage with spare data lines and/or integrated circuits of the RAM that have been set aside to replace bad RAM elements. In certain embodiments, the system is configured to set a pre-determined percentage of spare RAM space for re-vectoring of bad locations in RAM and because accessing RAM is based on random access, there is no processing penalty for re-vectoring bad locations in RAM. In contrast, the re-vectoring of hard disk drives incurs a large penalty because extra cylinder seat time is required to perform the re-vectoring.

Read/Write

In some embodiments, the system, device, or method is configured to read and/write between the processor and the RAM in 4 k memory blocks. In some embodiments, the system is configured to read and/write between the processor and the RAM in 1 k memory blocks. In some embodiments, the system is configured to read and/write between the processor and the RAM in 64 byte memory blocks. In some embodiments, the system is configured to read and/write between the processor and the RAM using adjustable or variable memory block sizes. In some embodiments, the system is configured to dynamically adjust or vary the memory block size being used based on the system environment and/or the processing environment, for example, at the moment of processing.

In an embodiment, the system, device, or method, utilizing only a processor and RAM, is configured to interface between various virtual machines and/or other systems operating on the computing system in order to allow such virtual machines and/or other systems to read and write data to the RAM storage by utilizing the meta-data, pointers, LEM, and/or other data structures disclosed herein. In some embodiments, the process described above can occur at the kernel level of the system.

In some embodiments, the system, device, or method, utilizing only a processor and RAM, comprises an operating system and/or an application or other interface, where in such operating system, application, or other interface is configured to read in raw data and determine whether the raw data element is unique or whether the raw data element has been identified previously from reading other raw data. In the event that the raw data element is unique, the system can be configured to convert such raw data into a new bit marker and/or store such raw data in the genome and make such unique raw data element a part of the dictionary of data elements that can be recycled or reused or pointed to in the future by other applications, systems or the like. In some embodiments, the process described above can occur at the kernel level of the system.

In some embodiments, the system, utilizing only a processor and RAM, is configured to read in raw data and have such raw data be analyzed by the operating system, and some environments, at the kernel level, where in the operating system is configured to determine whether the right data is unique or non-unique. In the event that the data is unique, the system in some embodiments is configured to convert or encode the unique data as a bit marker and/or store the unique data in the genome and/or encode the data in some other fashion for storage in the RAM storage. In the event that the raw data is non-unique, the system in some embodiments is configured to determine the location of where the non-unique data is stored in the RAM storage and generate a pointer to the location of the non-unique data. In some embodiments, the pointer is configured to point to a bit marker, a raw data element, a data vector, a data element, a pointer, encoded data, a virtual disk, a LEM, or some other data, all of which can in some embodiments be stored in the RAM storage.

For example, the system can be configured to receive three blocks of raw data elements. In analyzing the first block, the system can be configured to identify the first block as a unique data element that the system has never received before, in which case, the system can be configured to store the first block into RAM storage. In analyzing the second block, the system can be configured to identify the second block is the same as the first block, and other words the second block is non-unique data, in which case the system can be configured to generate a second pointer to the location in which the first block is stored in RAM storage. In some embodiments, the system can be configured to identify the third block is the same as some other previously read block of data, in which case the system can be configured to generate a third pointer to the location in which the previously read block is stored in RAM storage. In some embodiments, the system can generate a first pointer to the location in which the first block of data is stored in the RAM storage.

In some embodiments, the system can be configured to store in a LEM the first pointer, the second pointer, and the third pointer in order to create a representation of and/or an encoding of the three data blocks. In some embodiments, the system is configured to receive a request, for example, from an application and/or a virtual system and/or other entity operating on the system, to read the three data blocks. In some embodiments, the system is configured to intercept such requests, for example, at the kernel level, and identify the pointers, which can for example be stored in the LEM, that are associated with the three data blocks. In some embodiments, the system is configured to utilize the three pointers in order to identify the location of the raw data elements stored within the genome. In some embodiments, the system is configured to retrieve the raw data elements stored in the genome and return the raw data elements to the entity that requested to read the three data blocks. In some embodiments, the pointers can be configured to point to raw data elements, other pointers, bit markers, data vectors, encoded data, and the like. In the event that the pointer is pointing a bit marker, then in some embodiments, the pointer is pointing to another pointer and/or an element in a bit marker table (as known as a bit marker translation table), which in turn is pointing to a raw data element.

In some embodiments, when the system writes the first data block to the RAM storage, the system need not write that first data block to the RAM storage again because any time a new data block is read and matches the first data block, the system can simply refer, through generating and storing a pointer, to the location where the first data block is stored in RAM storage. By generating and/or storing and/or reading a pointer as opposed to raw data that is stored in RAM whether or not such data is unique or non-unique, the system, device, or method, utilizing only a processor and RAM, can minimize accesses to the RAM storage, resulting in maximizing processing performance of the system because the system is analyzing raw data for real differences across the entirety of the data. By generating and storing a pointer, the system can make more efficient use of the RAM storage because the byte size of a pointer is far less than the byte size of the first data block. For example, a pointer can comprise 4 bytes in a 32 bit machine or 8 bytes in a 64 bit machine, whereas a data block can comprise 64 bytes, 1k bytes, or 4 k bytes or more. Further, by not needing to write certain data blocks to the RAM storage, the processing speeds of the system can be improved because the system need not waste processing time in writing relatively large blocks of data.

In some embodiments, the genome or the entire data set stored in the RAM storage is referred to as a capacity efficient shared storage pool (CESSP) because by only storing unique raw data elements in the RAM, the system has made the storage capacity of the RAM efficient because storage space in the RAM is not wasted by storing a non-unique data element. Further, in some embodiments, the system requires that all the applications, operating systems, virtual machines, user data, and any other entity operating within the system to use the entire data set as a dictionary for accessing and storing raw data elements, thereby resulting in the system creating a shared storage pool of data that any applications, operating systems, virtual machines, user data, and any other entity operating within the system can access. In some embodiments, all of the data, in every file, disk, partition or the like, which is stored in the system lives in the capacity efficient shared storage pool. In some embodiments, the capacity efficient shared storage pool is the sum of all data stored in the system. In some embodiments, every unique block that the system has read is stored in the capacity efficient shared storage pool. In some embodiments, it can be said that every unique block that the system has read is merged into the capacity efficient shared storage pool. In some embodiments, any entity operating on the system must utilize a set of pointers in conjunction with the capacity efficient shared storage pool to determine and reconstruct the raw data being requested to read. In some embodiments, the system requires to the use of hash tables, assumptions and predictions for determining and/or reconstructing the raw data from a set of pointers pointing to various data elements in the capacity efficient shared storage pool.

In some embodiments, the system is configured to receive a request to generate a disk partition of a certain size with a certain file system type. In some embodiments, the system is configured to generate a LEM, when a 'disk' is created by the user on the system with computer/ram/storage, which in some embodiments is a list of pointers, that is configured to return data in response to the request, wherein the data indicates to the requesting entity, for example a virtual machine, that there exists a disk partition of the requested size with the requested file system type. In some embodiments, the data returned is the data that was read into to the machine from external sources either by file transfer from another computer/server or from an external storage device to fill the memory with raw data and thereby the virtual disk, and thereby the LEM. In some embodiments, the generated LEM is configured to be transparent to the requesting entity, in other words, the requesting entity only sees a disk partition of the requested size with the requested file system type, and does not see a LEM and/or a listing of pointers.

Memory Tunnel

In some embodiments, the system, device, or method, using only a processor and RAM to primarily process data, can be configured to connect to other similar systems, which are also only using a processor and RAM to primarily process data, through a memory channel/interface, which can also be referred to as a memory switch or memory tunnel. In some embodiments, a memory channel comprises 32 lanes of PCIE, which in some embodiments is capable of transferring 32 gigabytes of data per second. Many more options may exists with more lanes, faster lanes, or other types of memory sharing interfaces.

As compared to traditional networks of today, one can employ 100 gigabit networks switches that can only provide 12 gigabytes per second. Accordingly, by the system using a memory tunnel, the system can move data at a much more rapid pace and, in some embodiments, there is some additional latency in using a memory tunnel; however, in some embodiments, the system is able to become more fault tolerant and/or can ensure greater data protection for the system by allowing the system to move at great speeds virtual machines and/or mirroring data of the RAM storage. In some embodiments, the systems disclosed herein that utilize a memory tunnel can move virtual machines and/or RAM mirroring data in real time, batch mode, near real-time, and/or on a delayed basis.

In some embodiments, the system comprises two memory tunnel cards, which provides for 32 lanes of communication allowing the system to communicate at 64 gigabytes per second. In some embodiments, each memory tunnel card is operating at full duplex. In some embodiment, system comprises a first memory tunnel card operating at full duplex and a second memory card that is transferring data at 32 gigabytes per second in one direction. In some embodiments, the multi-computing system comprises a bit PCI switch to allow each of the computing systems within the multi-computing system to communicate with each other. For example, in a six node multi-computing system, each of the six nodes (specifically, each computing system) can be connected to a six node PCI switch to allow each node to communicate with every other node. In this example, the multi-computing system can be configured to perform pair-wise mirroring of the data stored in the capacity efficient shared storage of the RAM in each of the paired computing systems. This can be advantageous for data protection and high availability of a multi-computing system.

Multi-Computing System

In some embodiments, the system comprises two or more computing systems, wherein the computing systems primarily uses a processor and RAM to process data, and communicate via a memory tunnel connection. In some embodiments, the foregoing multi-computing system can run into situations where one or more of the computing systems in the multi-computing cluster fails. In some embodiments, the system is configured to be able to send a kill message to one or more of the computing system in the multi computing cluster when there is a detection of a failure.

In some embodiments, the multi computing cluster is subject to a common mode failure (CMF), where in one issue can kill all of the computing systems in the multi computing cluster. In some embodiments, the multi computing cluster is subject to a no single point of failure (NSPF), wherein only one or some of the computing systems in the multi-computing cluster fails. In some embodiments, the multi-computing cluster is subject to a no common mode failure (NCMF), wherein multiple issues cause all the computing systems in the multi-computing system to fail.

Whenever a failure in a multi-computing system is detected, it can be advantageous to be able to send a kill signal to the failing computing system(s) in the multi computing system in order to maintain data integrity and/or data protection at all times even when faults are occurring in the system.

In some embodiments, a multi-computing system is configured such that the computing systems are paired with one other computing system. In some embodiments, the pairing of two computing systems in a multi computing system allows for data protection, high availability, and fault tolerance. In some computing environments, such as, on a ship or a trading floor, the computing systems must be available at all times and no data can be lost. In order to achieve the highest availability and fault tolerance in a multi computing system, it can be advantageous to have the data in the paired computing systems mirrored between the two computers. It can be more advantageous to mirror such data over the memory tunnel in order to have rapid mirroring of data between the two computing systems, which could occur much faster over a memory tunnel than over a standard network connection.

In some embodiments, the computing systems can comprise memory tunnel adapter or interface that can be configured to transmit data across a memory tunnel at 64 gigabytes per second, or 128 gigabytes per second, or higher. In some embodiments, the memory tunnel adapter or interface is configured to communicate at half duplex or full duplex. In some embodiments, the memory tunnel adapter or interface is configured to allow the computer systems in a multi-computer system to communicate at or substantially at memory BUS speeds thereby introducing only a small amount or no amount of latency between the two computing systems during data mirroring and/or other data transfer between the systems.

In some embodiments, the computing systems paired in a multi-computing system are configured to copy or mirror the capacity efficient shared storage pool (CESSP) data in each of the computing systems into the other computing systems. In other words, in some embodiments, the data stored in CESSP of a first computing system is copied or mirrored to the paired second computing system, and the data stored in CESSP of the second computing system is copied or mirrored to the paired first computing system. By copying or mirroring the data stored in the CESSP between computing systems, the combined system can be fault tolerant because if one of the two computing systems malfunctions or fails, then the failing computing system can rapid transfer all its virtual machines and/or data to the other functioning machine without significant or any downtime. In some embodiments, the moving of virtual machines and/or data only requires the moving of LEMs and/or bit markers and/or other pointers because all of the necessary data in the CESSP has been mirrored or copied to the functioning machine. In other words, all of the raw data is already stored in the other functioning machine because the data in the CESSP had been previously mirrored or copied from the failing computer system to the functioning computer system and only LEMs, bit markers, and/other pointers, which are significantly smaller in byte size than the raw data.

Accordingly, moving and restarting virtual machines and other data between paired machines can occur rapidly to achieve a fault tolerant system without data loss. In some embodiments, the mirroring or copying of data between the paired computing systems is performed in real-time, substantially real-time, periodically, batch mode, or other timed basis. In some embodiments, each paired computing system is configured only to make half of the memory available to the virtual machines, applications, and the like operating on the first computing system because the other half the memory of the first computing system is allocated to store the mirrored data from the second computing system as well as any other data from the second computing system that is needed to operate the virtual machines, applications, and the like. In some embodiments, when one of the paired computing systems fails, and the other computing system takes over the work of the failing computing system, the process can be known as fail over. In some embodiments, when the failing computing system recovers from a previous failure and is takes back the work previously transferred to the non-failing computing system, the process is called fail back.

For example, in some embodiments, a system can comprise two computing systems, both primarily using a processor and RAM to process data without the need of a convention storage device, wherein the two computing systems are electronically coupled to each other through a memory tunnel to allow for communication speeds that are equivalent or are substantially near the data transfer speeds of a BUS channel. In this example, the system can be configured to operate 400 virtual machines, wherein virtual machines 1-199 operate on the first computer system and virtual machines 200-399 operate on the second computer system. The first computing system can be configured to store unique raw data elements and other data in a first CESSP stored in the RAM of the first computing system. The second computing system can be configured to store unique raw data elements and other data in a second CESSP stored in the RAM of the second computing system. The first and second computing systems can be configured to generate LEMs for the virtual machines.

In the event that the second computing system malfunctions, for example, due to a hardware and/or software failure, the system can be configured to move virtual machines 200-399 that are operating on the second computing system to the first computing system by copying the LEMs associated with the virtual machines to the first computing system such that the LEMs, which in some embodiments are a listing of pointers, are pointing to the data in the second CESSP that is stored in the first computing system, wherein such data was mirrored from the second computing system. The process of the first computing system taking over all the work of the second computing system is in some embodiments known as fail over. While the first computing system is operating virtual machines 200-399, the first computing system, in some embodiments, is also running virtual machines 1-199, wherein the LEMs associated with virtual machine 1-199 are pointing to the data in the first CESSP that is stored in the first computing system. In some embodiments, when the second computing system has recovered from the previous failure, then the LEMs that are stored in the first computing system and that are associated with virtual machines 200-399 are moved, copied, or migrated to the second computing system, and the second CESSP that is stored in the first computing system are copied or mirrored to the second computing system in order for the second computing system to resume the work of operating virtual machines 200-399. In some embodiments, the process is called fail back.

In some embodiments, the two computer systems are running their guest OS's and applications in simple clustered methods where there is only one set of virtual machines (or guest OS's running applications), and in this case, the second system is there mainly for high availability, not to add additional virtual machines or applications. This can be based on the fact that many applications are not 'highly available' aware to be failed over. In some cases, depending on applications and environment, the system can include a clustered set of guests and data will be mirrored, but only one side will run the VMs and applications. When the side running the applications or VMs fails, the other side can take over. Thus, in some embodiments, the system may have an active-passive operation mode. Or, in some embodiments, the system may have an active-active mode for different VMs on both computers simultaneously that can failover as noted above (e.g., FIG. 3).

In some embodiments, a paired computing system comprises a specialized communication link between the paired computing systems in order to transmit heartbeat data between the two computing systems. In some embodiments, the heartbeat data provides information to the two computing systems that each of the computing systems is still functioning properly. In some embodiments, the specialized communications link between the two computing systems is separate from the memory tunnel communications channel between the two computing systems. In some embodiments, the specialized communications channel for transmitting heartbeat data is different from the memory tunnel channel in order to ensure that the heartbeat data is transmitted in the case of a failure in the memory tunnel channel communications link. In some embodiments, the first computing system is configured to generate a first heartbeat data, which is transmitted over the specialized communication channel, and the second computing system is configured to generate a second heartbeat data, which is also transmitted over the specialized communications channel. In some embodiments, the generating and transmission of the first and second heartbeat data helps to ensure that the two computing systems are aware that each computing system is communicating with another computing system that is alive and functioning in order to ensure that the data being transmitted by a first computing system is being processed by a second computing system.

In some embodiments, the system is configured to transmit a first heartbeat data over a specialized communications channel between the first and second computing systems, and the system is configured to transmit a second heartbeat data between the first and second computing systems over the memory tunnel communications channel. In the event that the system loses both heartbeats, in some embodiments, then the system can interpret the loss as being both communication channels have failed, which is a low probability event in view of the fact that the two heartbeats are communicating over two different interfaces and channels. Alternatively, in some embodiments, the system can be configured to interpret the loss of both heartbeats as meaning that one of the two computing systems has malfunctioned and/or is no longer responding and/or is no longer processing data. In which case, the system can be configured to send a one way kill signal. In some embodiments, the system is configured with a mechanism to generate a one way kill signal that guarantees to only terminate one of the two computing systems such that both computing systems do not terminate thereby ensuring that the system is fault tolerant and that no data is lost. In some embodiments, the system is configured to delay sending the one way kill signal to account for the situation wherein the non-responding computing system is in the process of rebooting. In some embodiments, to restart the terminated computing system, the system requires human intervention, for example, the non-responding computing system requires a hardware repair.

In some embodiments, where the non-responding computing system did not require a new RAM storage, then the functioning computing system need only synchronize the new data from the CESSP stored in the functioning computing system with the old data in the CESSP stored in the previously non-responding computing system. In some embodiments, where the non-responding computing system did require a new RAM storage or the entire computing system needed to be replaced, then the functioning computing system must copy or mirror the entire CESSP stored in the functioning computing system into the CESSP stored in the previously non-responding computing system. In some embodiments, the foregoing process is known as fail back.

In some embodiments, the system is not configured to automatically invoke a fail back process but rather requires a user to invoke the fail back procedure. In some embodiments, the system is configured to automatically invoke a fail back process when the system detects that the previous unresponsive paired computing system has become functional, for example, by detecting heartbeat signals from the previously non-responsive paired computing system.

In some embodiments, the system comprises a mother board having a one way kill circuit or other mechanism for generating a signal to terminate and/or reboot and/or shutdown the system. In some embodiments, the one way kill circuit can be invoked when paired computing systems cannot communicate between each other, which in some circumstances can create a split-brain situation wherein the paired computing systems that supposed to be working together are now working independently, and/or wherein the data mirroring is no longer occurring between the paired computing systems, which can lead to data corruption between the paired computing systems. In some embodiments, the system can be configured to use the one way kill circuit to stop a split-brain situation (a situation where two systems are up and running but cannot communicate as they must to maintain coherent data, which can and does lead in many cases to customer data corruption).

In some embodiments, the one way kill circuit is configured to only terminate one of the paired computing systems when both of the paired computing systems invokes the one way kill circuit available in each of the computing systems. In some embodiments, the one way kill circuits in the paired computing systems are configured to communicate with each other in determining which of the paired computing systems should be terminated. In some embodiments, the one way kill circuits are configured to determine which of the paired computing systems has more stored data in the RAM, and is configured to terminate, shutdown, and/or reboot the computing system that has less stored data in the RAM. In some embodiments, the one way kill circuits in each of the computing systems is configured to determine whether the computing system in which the one way kill circuit is embedded in has malfunctioned and/or is non-responsive. In the event that the one way kill circuit has determined that its host computing system has malfunctioned and/or is non-responsive, then in some embodiments the one way kill circuit is configured to communicate data to the one way kill circuit in the other paired computing system, wherein such data comprises information that one way kill circuit's host computing system has malfunctioned and/or is non-responsive, and/or data that indicates that one way kill circuit's host computing system should be terminated.

In response to receiving such data, the one way kill circuit in the other paired computing system can be configured to generate a one way kill signal to the other computing system thereby causing the other computing system to terminate, shutdown and/or reboot. In some embodiments, the one way kill circuit determines which of the paired computing systems is terminated based on whichever computing system can initiate and send the one way kill signal to the other computing system. In this scenario, both of the paired computing systems are operating but they are not communicating properly and accordingly it is only necessary to shut down one of the systems and it may not matter which one is shutdown.

In some embodiments, if only one of the computing systems is functioning, then the other computer system may not able to send off a one way kill signal, therefore resulting in the functioning computing system automatically sending a one way kill signal to the non-functioning system, which forcibly powers down or shuts down the non-functioning system. In some embodiments, the functioning computing system is configured to wait for a period of time, also referred to as a timeout, before automatically sending a one way kill signal to the other computing system in order for the non-functioning computing system to reboot in the event that the non-functioning system is in the process of rebooting.

In some embodiments, the functioning computing system is configured to perform a fail over procedure, or in other words take over the work of the non-functioning computing system which received a one way kill signal from the functioning computing system. In some embodiments, the functioning computing system can take over the work of the non-functioning computing system because the data stored in each of the RAMs in each of the paired computing systems is synchronized, in some embodiments, constantly, intermittently, periodically, in batch mode or by some other means, thereby each computing system has a coherent cache of the other computing system's data. In some embodiments, the functioning computing system is configured to instantly take over the work of the non-functioning computing system. In some embodiments, the functioning computing system is configured to fail over or take over after a period of time the work of the non-functioning computing system.

In some embodiments, the functioning computing system is configured to perform a fail back procedure, or in other words transfer the work of the non-functioning computing system back after the non-functioning computing has rebooted. In some embodiments, the functioning computing system is configured to copy or mirror the data related to the work of the non-functioning computing system that is stored in the capacity efficient shared storage in the functioning computing system to the non-functioning computing system. In some embodiments, the functioning computing system is configured to keep track of the changes or the delta or the new data related to the work of the non-functioning computing system that is stored in the capacity efficient shared storage of the functioning computing system since the system taking over the work from the non-functioning computing system. In some embodiments, the functioning computing system is configured to copy or mirror the changes or the delta or the new data to the non-functioning computing system after the non-functioning computing system has rebooted, assuming that the RAM in the non-functioning computing system was not replaced or reformatted or the data in the RAM was not otherwise erased. In some embodiments, the fail back procedure involves copying or mirroring all or some of the data associated with the work of the non-functioning computing system that is stored in the capacity efficient shared storage to the previously non-functioning computing system through the memory tunnel.

In some embodiments, paired computing systems comprise three channels of communication between each other. In some embodiments, paired computing systems comprise a memory tunnel channel for communicating data between each other. In some embodiments, paired computing systems comprise an ethernet network channel for communicating data between each other. In some embodiments, paired computing systems comprise a one way kill channel for communicating data between each other.

In some embodiments, the system is configured to perform load balancing by moving one or more virtual machines from a first computing system by copying or mirroring LEMs and in some embodiments the data referenced by the LEMs to a second computing system, which may be existing in the cluster of computing systems or may be new to the cluster of computing systems, through a memory tunnel, wherein the data referenced by the LEMs is stored in the capacity efficient shared storage of the first computing system. In some embodiments, the system in moving one or more virtual machines from a first computing system to a second system is configured to copy or mirror the all or a part of the capacity efficient shared storage of the first computing system to the second computing system. In copying or mirroring a part of the capacity efficient shared storage of the first computing system to the second computing system only the data referenced by the LEMs associated with the virtual machines being moved are copied from the capacity efficient shared storage of the first computing system to the capacity efficient shared storage of the second computing system. This can be advantageous because less data is being copied from the first to the second computing systems, and therefore less time and/or less computer processing is required. By requiring less time and/or less computer processing, the migration of virtual machines can occur rapidly, thereby reducing the amount of down time in restarting the virtual machine on the second computing system and increasing the availability of the virtual machine to users.

In some embodiments, where the first and second computing systems are paired such that the capacity efficient shared storages in the first and second computing systems are mirrored, the system is configured to perform load balancing through the migration of one or more virtual machines from the first to the second computing system by only copying the LEMs associated with the one or more virtual machines from the first to the second computing systems without copying the data referenced by the LEMs because such data already exists in the capacity efficient shared storage of the second computing system due to the mirroring configuration. The foregoing can be especially advantageous because only a relatively small amount of data is being copied from the first to the second computing systems (because in some embodiments, only copying pointers, which are small in size), and therefore less time and/or less computer processing is required. By requiring less time and/or less computer processing, the migration of virtual machines can occur rapidly thereby reducing the amount of down time in restarting the virtual machine on the second computing system and increasing the availability of the virtual machine to users.

In some embodiments, the system comprises a multi-computing system cluster, wherein paired computing systems within the cluster can electronically communicate with other paired computing systems within the cluster to transfer data and/or signals and/or migrate virtual machines to perform load balancing of tasks operating on the multi-computing system cluster. For example, the system can comprise four computing systems, wherein the first and second computing systems are paired and the third and fourth computing systems are paired. In this example, the paired computing systems are configured to mirror data between the two computing systems, specifically the first and second computing systems are configured to mirror data between each other, and the third and fourth computing systems are configured to mirror data between each other. The four computing systems can also be in electronic communication with each other. In some embodiments, the first pair of computing systems, specifically the first and second, can move virtual machines to the second pair of computing systems, specifically the third and fourth, in order to achieve load balancing within the cluster, which in such migration of virtual machines is performed using the methods disclosed herein, for example, utilizing a memory tunnel.

In some embodiments, the system is configured to copy or mirror data between paired computing systems. In some embodiments, such systems configured to copy or mirror data between paired computing systems are ideal for mission critical situations requiring no loss of data and no loss of availability; however, such systems can have system performance decreases due to increased processing power and/or network traffic (for example, increased overhead with the network) required to perform data copying or mirroring. Additionally, in some embodiments, each computing system can only use a portion, for example, a quarter, a half, three-quarters, of the RAM storage because the non-used portion must be used for data copying or mirroring with the other paired computing system.

In some embodiments, the system is configured to be able to dynamically change from a copying or mirroring data configuration to a non-mirroring configuration where all the data in the RAM is copied to a conventional storage device in real-time, substantially real-time, periodic basis or in batch mode, or the like.

In some embodiments, the systems, devices, and methods disclosed herein are configured to operate a plurality of virtual machines. In some embodiments, the systems disclosed herein can be configured to operate natively or raw without operating any virtual machines on the system because the entire system is being used to operate a single operating system in order to provide maximum performance to the single operating system and/or the software applications running over the operating system and the system.

In some embodiments, the systems disclosed herein have one, two, three, four, or more network communications channels. For example, in a paired confirmation, where the system comprises two computing systems that are paired together, the system comprises first network communications channel in the form of a memory tunnel connection, which in some embodiments is a 32 bit PCI connection implemented in one or two or three or more network cards embedded or coupled to the motherboard of the computing systems. The system can also comprise a second network communications channel in the form of a standard ethernet communications channel to communication over a traditional network with other computing systems, including the paired computing system, and in some embodiments, heartbeat data is transmitted between the two paired computing systems over the ethernet connection (which in some cases is secondary heartbeat data), and in some embodiments communications to and from the backup energy sources and the system are transmitted over the ethernet connection. The system can also comprise a third network communications channel in the form of a serial connection between the paired computing systems, wherein the serial connection is coupled to the one way kill circuit or card or interface that is coupled to the motherboard of each of the paired computing systems. In some embodiments, the serial connection between the two computing systems is configured to transmit one way kill signals between the paired computing systems, and in some embodiments, heartbeat data is transmitted over the serial connection between the two computing systems.

Processor, RAM, and Conventional Memory Storage Drive

In some embodiments, the system, device, or method operates by using a processor and RAM only without the need for a conventional memory storage drive, and in some embodiments, it can comprise a conventional storage drive, such as and HDD or SSD, which could be used as a memory back up system and/or to mirror the data stored in the RAM.

In some embodiments, the system, device, or method is configured to perform computer processing of data by using only a processor and random access memory (RAM) without the need for a conventional peripheral storage device, but in some embodiments, the system can use a conventional peripheral storage device to store data more permanently and read data, which, in some cases, that does not need to processed all the time. In certain embodiments, the conventional peripheral storage device is an HDD or an SDD, for example, an SSD using 3D lithography. In some embodiments, the system can configured to utilize a conventional peripheral storage device for non-essential or non-mission critical data storage and reading to realize more efficiency in the system on a dollars per megabyte per second basis. The foregoing can be especially true for data that is not often read or stored to a memory device, in which case storing and reading such data to and from a conventional data storage device would not add much latency to the computer processing even though the data must be sent over a BUS channel to a relatively slow storage device. However, in certain embodiments, such as in real time transactions, for example, in the stock market transactions, the data must be stored in a relatively faster storage device, such as, RAM, in order to have such data processed at faster processing speeds. In which case, such data is stored in RAM and would not be stored in a conventional storage device.

In some embodiments, the system is configured to preserve data stored in RAM to a persistent storage device such as in an HDD, SSD, and/or NVME SSD. In some embodiments, the systems disclosed herein are configured to constantly mirror and copy the data stored in the RAM into a persistent storage device. Systems with the constant mirroring configuration are well suited for environments where the no data can ever be lost in the system, for example, in stock market transactions. In some embodiments, the mirroring configuration is not well suited for certain situations where maximum processing speed is required and/or where if data is lost, then the data can be regenerated.

In some embodiments, the systems, devices, or methods disclosed herein are configured to mirror and copy the data stored in the RAM into a persistent storage device only when the system detects that a primary energy source has a power failure. In some embodiments, systems with the configuration of mirroring based on power failure detection are well-suited for situations where maximum processing speeds are required and/or where if data is lost, then the data can be regenerated without issue, for example, in the animation graphics processing context.

In some embodiments, the system comprises a conventional storage device, such as and SSD, only for the purposes of storing or backing-up the data during any energy source disruption and/or for the purposes of mirroring the data that is stored in the RAM. In some embodiments, the use of a conventional storage device for backing-up and/or mirroring of the data in the RAM ensures that no data will ever be lost.

In some embodiments, the system, using only a processor and RAM to primarily process data, can comprise a convention storage device, such as a SSD, wherein the system is configured to constantly copy data from the RAM to the conventional storage device to ensure there is no data loss in the even there is a power failure to the system. In some embodiments, the constant copying of data from the RAM to the conventional storage device is completed in real-time, substantially in real-time, in batch mode, periodically, in a delayed mode, or the client. In some embodiments, the constant copying of data from the RAM to the conventional storage device is asynchronous replication of the data from the RAM to the conventional storage device. In some embodiments, there is latency because the data in the conventional storage device is behind the data in the RAM in the sense that the conventional storage device does not have all the data stored in the RAM. In some embodiments, a system with the foregoing latency provides high performance to users who can accept the worst case scenario where there is data loss because such users can recreate or regenerate the data, for example, in laboratories or scientific analysis, or in movie or graphics rendering situations.

In some embodiments, the systems disclosed herein comprise a computer processor, for example an Intel processing chip, a RAM storage, a conventional storage device, for example an SSD, and two backup energy sources, for example lead-acid batteries, wherein the system primarily uses the computer processor and the RAM storage for processing data and uses the conventional storage device primarily for backup storage. In some embodiments, the foregoing system can be substantially fault tolerant because it comprises the backup energy sources and the conventional storage device; however, in some embodiments, the system is not non-stop or completely fault tolerant because the system only comprises one processor and one RAM storage system. In other words, in some embodiments, if the one processor and/or the one RAM storage system and/or other critical component (for example, a timer chip or regulator) of the system fails, malfunctions, and/or is non-responsive, then the system will cease to operate.

In some embodiments, a system that ceases to operate may require repair and/or replacement. In some embodiments, in the event of a system repair where the RAM storage remains the same, then the system can continue operating where the system stopped. In some embodiments, in the event of a system repair involving the replacement of the RAM storage, or in the event of an entire system replacement, then the data backed up and stored in the conventional storage device must be copied to the new RAM storage of the system in order for the system to continue functioning where the previous system stopped. In some embodiments, the foregoing system is known as a single system, and in some embodiments, a user can operate a plurality of single systems that can be networked using a memory tunnel connection or using a conventional network connection, such as Ethernet.

In order to configure the system to be completely fault tolerant, the system in some embodiments can be configured to be paired with another similar system comprising a computer processor, a RAM storage, a conventional storage device, and two backup energy sources, wherein the data of the paired systems is copied or mirrored between the two systems. In some embodiments, in the event that one of the paired systems fails, malfunctions, and/or becomes non-responsive, then the functioning system, as disclosed herein, can be configured to take over the work of the non-functioning system as part of a fail over process, and in some embodiments, the system is configured to automatically invoke a fail over process when the system detects that one of the paired computing systems has failed, malfunctions, and/or has become non-responsive. In some embodiments, the system is configured to invoke a fail over process within several seconds, several minutes, or several hours after detecting that one of the paired computing systems has failed, malfunctioned, and/or has become non-responsive. In some embodiments, the system is configured to invoke a fail over process within 1 second, 2 seconds, 3 seconds, 4 seconds, 5 seconds, 6 seconds, 7 seconds, 8 seconds, 9 seconds, 10 seconds, 15 seconds, 20 seconds, 25 seconds, 30 seconds, 40 seconds, 50 seconds, 1 minute, 2 minutes, 3 minutes, 4 minutes, 5 minutes, 6 minutes, 7 minutes, 8 minutes, 9 minutes, 10 minutes after detecting that one of the paired computing systems has failed, malfunctioned, and/or has become non-responsive.

Computer-Implemented Methods

As discussed herein, in some embodiments, RAM-based computer systems, devices, and methods comprise a computer-implemented method or software that operates or causes to operate one or more processes described herein. For example, in some embodiments, a computer-implemented method or software can operate on a specialized architecture computer system comprising or utilizing only a processor and RAM, without conventional storage or without using conventional storage to regularly read/write data for processing, to facilitate reading and/or writing of data between the processor and RAM.

Additionally, in some embodiments, a computer-implemented method or software can operate on a conventional or unspecialized architecture computer system, comprising a processor, RAM, and conventional storage. However, in some embodiments, a computer-implemented method or software operating on such conventional or unspecialized architecture computer system can manipulate or change usage of RAM and/or conventional storage, such that only or substantially only RAM is used for regular reading and writing of data by the processor without using the conventional storage for such purposes. Rather, in some embodiments, a computer-implemented method or software operating on such conventional or unspecialized architecture computer system can be configured to utilize conventional storage only as back-up or for other secondary uses as described herein.

In some embodiments, a computer-implemented method or software, operating either on a specialized or unspecialized architecture computer system, can be part of the computer system's regular operating system. In such instances, a computer-implemented method or software that is part of the operating system can be configured to manage, translate, encode, and/or decode data and read/write requests of data by the processor as described herein. For example, the computer-implemented method or software can receive a read/write request from the operating system and retrieve, encode, decode, and/or manage such requests by accessing and/or processing the data, bit markers, pointers, and/or the like stored in RAM.

In some embodiments, a computer-implemented method or software, operating either on a specialized or unspecialized architecture computer system, operates on a level lower than the operating system. In such instances, the operating system can simply request a read and/or write process as it would normally do. However, in some embodiments, the computer-implemented method or software can intercept such read/write request from the operating system and facilitate translation, retrieval, encoding, decoding, and/or management of data by accessing and/or processing the data, bit markers, pointers, and/or the like stored in RAM. In some embodiments, as all read/write requests by the operating system is intercepted and/or facilitated by the computer-implemented method or software operating at a level below the operating system, the operating system may have no knowledge of the data reduction, encoding, decoding, and/or management processes. Rather, in some embodiments, the operating system may believe that it is simply reading and/or writing data in a conventional sense, for example to contiguous blocks of data either in RAM or conventional storage, while actually the data may be read and/or written onto non-contiguous blocks of RAM.

In some embodiments, a computer-implemented method or software for implementing one or more RAM-based processes and data reduction, encoding, decoding, and/or management processes described herein may be installed on a computer system before or after installation of the operating system.

In some embodiments, a computer-implemented method or software, operating either on a specialized or unspecialized architecture computer system, operates as an add-on or application at a higher level than the operating system. In such instances, the operating system can simply request a read and/or write process, which can trigger translation of the same by the computer-implemented method or software. The computer-implemented method or software can then facilitate translation, retrieval, encoding, decoding, and/or management of data by accessing and/or processing the data, bit markers, pointers, and/or the like stored in RAM.

Figure 8A:
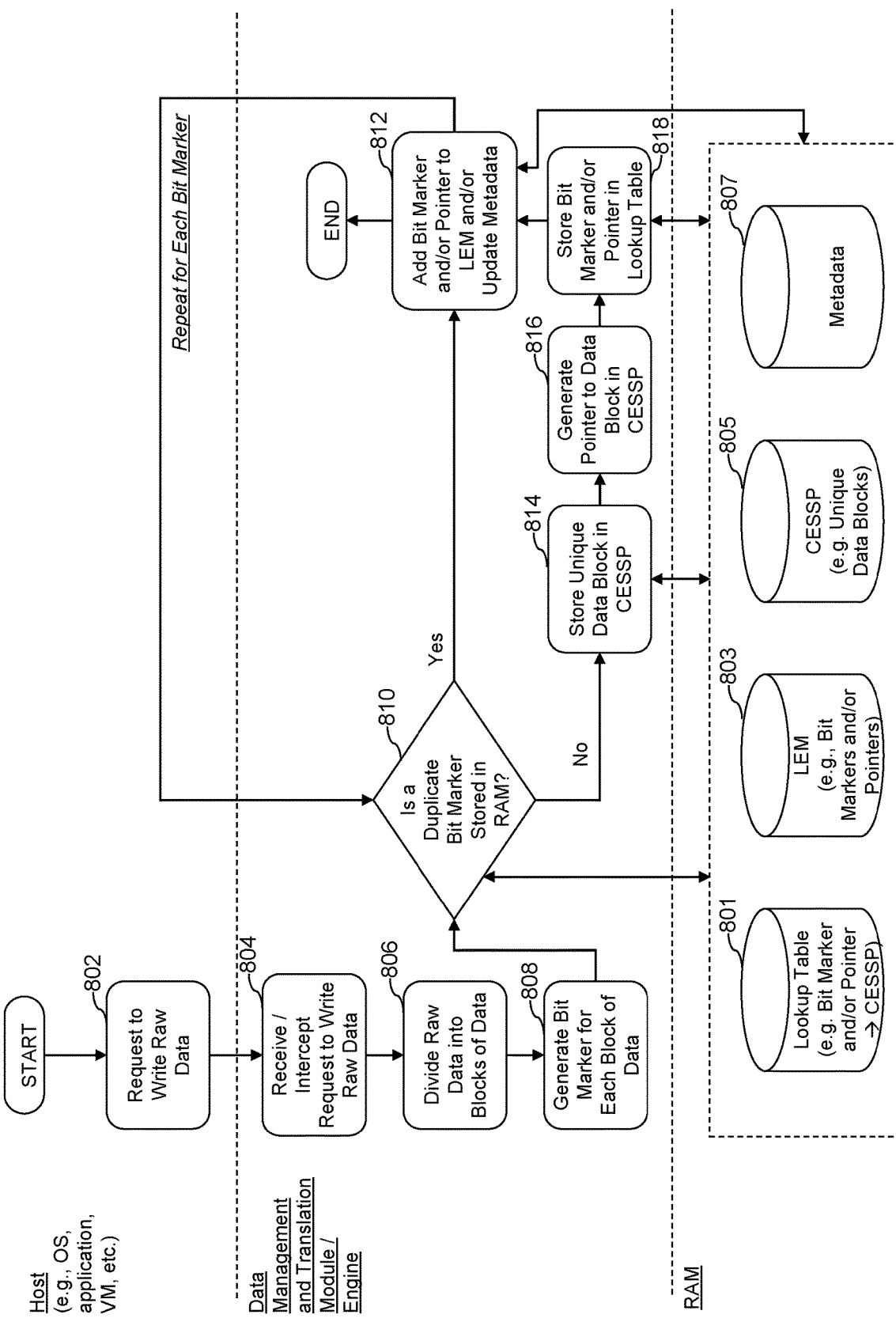
FIG. 8A is a flowchart illustrating an example method(s) for writing data utilizing RAM-based computer systems, devices, and methods.

FIG. 8A is a flowchart illustrating an example method(s) for writing data utilizing RAM-based computer systems, devices, and methods. As illustrated in FIG. 8A, in some embodiments, the host can request to write raw data at block 802. The host can be an operating system, application, virtual machine, and/or the like.

In some embodiments, a data management and translation module or engine can receive and/or intercept the request to write raw data at block 804. As described above, in some embodiments, the data management and translation module or engine can, in some embodiments, be part of the host or be a separate operating system or program running below or on top of the main operating system. In some embodiments, the data management and translation module or engine can comprise the data reduction module as discussed herein and/or be configured to conduct one or more processes described herein as being performed by the data reduction module. In some embodiments, the data management and translation module can be computer software program configured to perform one or more RAM-based computer system processes as described herein. In some embodiments, the data management and translation module can be implemented and/or installed on a specialized computer architecture system. In some embodiments, the data management and translation module can be implemented and/or installed on a conventional, unspecialized computer architecture system previously configured to utilize RAM and conventional storage in a conventional way, thereby effective transforming the conventional computer architecture system into a RAM-based computer system that utilizes only a processor and RAM for regular data read/write processes without using conventional storage.

In some embodiments, the data management and translation module or engine is configured to divide the raw data into one or more blocks of data at block 806. For example, the data management and translation module or engine can be configured to divide the raw data into blocks of equal or varying lengths. In some embodiments, the data management and translation module or engine can be configured to divide the raw data in multiple ways, for example by dividing up the raw data at different points, thereby obtaining different blocks of data from the same initial raw data.

In some embodiments, the data management and translation module or engine is configured to generate a bit marker for each divided block of data at block 808. For example, in some embodiments, the data management and translation module or engine is configured to input each block of raw data into a hash function or other transformation that translates the same into a bit marker. In some embodiments, the transformation or hash function is configured such that the same block of raw data inputted into the transformation will result in the same bit marker.

In some embodiments, for each bit marker that is generated, the data management and translation module or engine is configured to determine at block 810 whether the generated bit marker is already stored in RAM. In order to do so, in some embodiments, the data management and translation module or engine is configured to communicate with one or more databases (or other data structures) stored within RAM.

For example, in some embodiments, the RAM can comprise one or more look-up tables 801, one or more LEMs 803, a CESSP or gene pool 805, and/or one or more metadata databases 807. In some embodiments, one or more of the foregoing databases or data structures can be combined. In some embodiments, a look-up table 801 can comprise data that matches one or more bit markers and/or pointers to a unique block of data stored in the CESSP. In some embodiments, a LEM 803 can comprise one or more bit markers and/or pointers. In some embodiments, the CESSP 805 can comprise a collection of all unique blocks of data stored in RAM. The CESSP 805 can also include bit markers and/or pointers in some embodiments. In some embodiments, a metadata database 807 can comprise metadata relating to the one or more bit markers and/or pointers, such as number of uses, order, and/or the like.

Referring back to block 810, in some embodiments, the data management and translation module or engine can be configured to determine whether each bit marker generated from the raw data to be written is already stored in RAM by comparing each generated bit marker to one or more bit markers stored in one or more look-up tables 801, LEMs 803, CESSP 805, and/or metadata databases 807.

In some embodiments, if the data management and translation module or engine determines that a bit marker generated from the raw data to be written is already stored in RAM, then the data management and translation module or engine can be configured to simply add the bit marker to the LEM at block 812. In addition, in some embodiments, the data management and translation module or engine can also be configured to retrieve from the RAM a pointer to the corresponding block of data and add the pointer in the LEM at block 812. Further, in some embodiments, the data management and translation module or engine can be configured to update the metadata accordingly at block 812 to account for the additional instance of this bit marker and/or unique block of data.

In some embodiments, if the data management and translation module or engine determines that a bit marker generated from the raw data to be written was not previously stored in RAM, then the data management and translation module or engine can be configured to store this new unique data block in the CESSP at block 814. Further, in some embodiments, the data management and translation module or engine can be configured to generate a pointer to the new unique data block in the CESSP at block 816. In addition, in some embodiments, the data management and translation module or engine can be configured to store the newly generated bit marker and/or pointer in a look-up table in the RAM at block 818. In some embodiments, the newly generated bit marker and/or pointer can be added to the LEM at block 812. In some embodiments, the data management and translation module or engine can be further configured to update the metadata accordingly at block 812 to account for the new bit marker and/or unique block of data.

In some embodiments, the data management and translation module or engine can be configured to repeat one or more processes described herein in connection with FIG. 8A for each bit marker that was generated in block 808. In particular, in some embodiments, the data management and translation module or engine can be configured to repeat one or more processes described in blocks 810, 812, 814, 816, and/or 818 for each bit marker generated for each block of data in block 808. In some embodiments, once one or more such processes have been completed for each bit marker that was generated from the raw data, the write process can be completed.

FIG. 8B is a flowchart illustrating another example method(s) for writing data utilizing RAM-based computer systems, devices, and methods. One or more processes illustrated in FIG. 8B comprise similar or the same processes as those described above in connection with FIG. 8A. In particular, those processes with the same reference numbers can include the same or similar features and/or processes.

As with certain processes described above in connection with FIG. 8A, in the embodiment(s) illustrated in FIG. 8B, in some embodiments, the host requests raw data to be written at block 802. In some embodiments, the data management and translation module or engine receives and/or intercepts such write request at block 804. In some embodiments, the data management and translation module or engine further divides the raw data into one or more blocks of data in block 806.

Unlike in those embodiments illustrated in FIG. 8A, in some embodiments such as those illustrated in FIG. 8B, the data management and translation module or engine can be configured to compare the one or more blocks of data directly with one or more unique blocks of data stored in the RAM at block 820. That is, in some embodiments, rather than first generating bit markers from the divided blocks of raw data for comparison with bit markers already stored in RAM, the data management and translation module or engine can be configured to compare the divided blocks of raw data directly with unique blocks of data stored in the RAM at block 820. To do so, in some embodiments, the data management and translation module or engine can be configured to compare each divided block of raw data with those unique data blocks stored in a look-up table 801, LEM 803, CESSP 805, or anywhere else in RAM.

In some embodiments, if the data management and translation module or engine determines in block 820 that a duplicate block of data is already stored in RAM, then the data management and translation module or engine then determines or identifies a bit marker corresponding to this block of data at block 822. In particular, in some embodiments, if a block of data is already stored in RAM, then a corresponding bit marker can be already stored in RAM as well. As such, in some embodiments, the data management and translation module or engine identifies and/or retrieves the corresponding bit marker from RAM, for example from a look-up table 801, in block 822.

In some embodiments, then the data management and translation module or engine can be configured to simply add the bit marker to the LEM at block 812. In addition, in some embodiments, the data management and translation module or engine can also be configured to retrieve from the RAM a pointer to the block of data and add the pointer in the LEM at block 812. Further, in some embodiments, the data management and translation module or engine can be configured to update the metadata accordingly at block 812 to account for the additional instance of this bit marker and/or unique block of data.

In some embodiments, if the data management and translation module or engine determines that a block of data derived from the raw data to be written was not previously stored in RAM, then the data management and translation module or engine can be configured to generate a new bit marker for this block of data at block 808. In some embodiments, this new unique data block can be stored in the CESSP at block 814. Further, in some embodiments, the data management and translation module or engine can be configured to generate a pointer to the new unique data block in the CESSP at block 816. In addition, in some embodiments, the data management and translation module or engine can be configured to store the newly generated bit marker and/or pointer in a look-up table in the RAM at block 818. In some embodiments, the newly generated bit marker and/or pointer can be added to the LEM at block 812. In some embodiments, the data management and translation module or engine can be further configured to update the metadata accordingly at block 812 to account for the new bit marker and/or unique block of data.

In some embodiments, the data management and translation module or engine can be configured to repeat one or more processes described herein in connection with FIG. 8B for each block of data that was derived from the raw data at block 806. In particular, in some embodiments, the data management and translation module or engine can be configured to repeat one or more processes described in blocks 820, 822, 808, 814, 816, 818, and/or 812 for each bit marker generated for each block of data in block 808. In some embodiments, once one or more such processes have been completed for each bit marker that was generated from the raw data, the write process can be completed.

Figure 9:
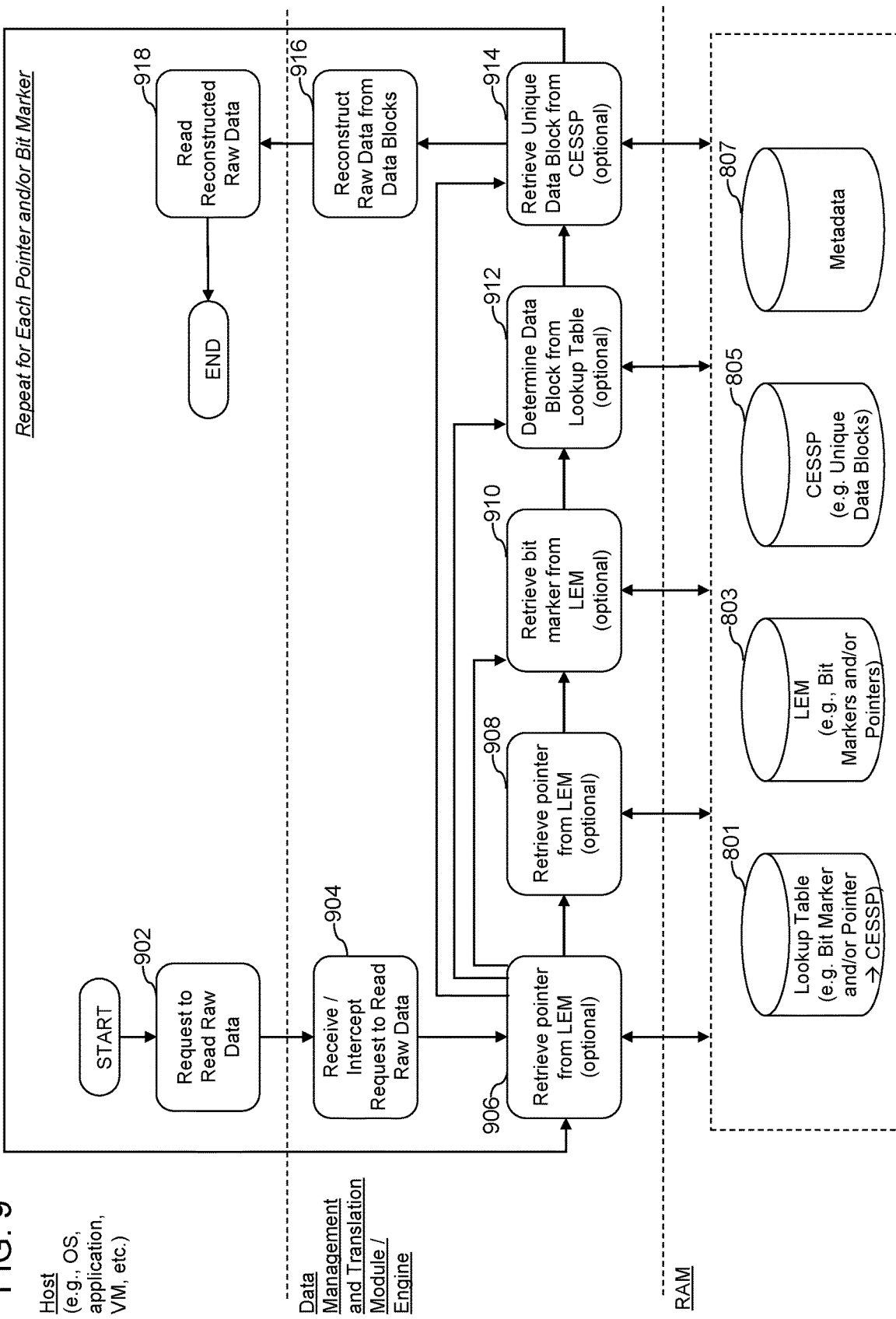
FIG. 9 is a flowchart illustrating an example method(s) for reading data utilizing RAM-based computer systems, devices, and methods.

FIG. 9 is a flowchart illustrating an example method(s) for reading data utilizing RAM-based computer systems, devices, and methods. As illustrated in FIG. 9, in some embodiments, the host can request to read raw data at block 902. The host can be an operating system, application, virtual machine, and/or the like.

In some embodiments, the data management and translation module or engine can be configured to receive and/or intercept the request to read raw data at block 904. In some embodiments, the data management and translation module or engine can be configured to fulfill the read request from the host by communicating with the RAM and/or one or more databases or data stored in the RAM.

In particular, in some embodiments, the data management and translation module or engine can be configured to retrieve one or more pointers from the LEM 803 at block 906, wherein the one or more pointers can correspond to the location of stored unique data blocks that form the raw data that was requested to be read by the host. As discussed above, in some embodiments, a pointer can point to another pointer. As such, in some embodiments, the data management and translation module or engine can be configured to retrieve a second pointer from the LEM 803 at block 908.

Also, as discussed above, in some embodiments, a pointer can point to a bit marker. As such, in some embodiments, the data management and translation module or engine can be configured to retrieve a bit marker from the LEM 803 that the pointer pointed to at block 910. In some embodiments, a pointer itself can be stored within a look-up table 801. As such, in some embodiments, the data management and translation module or engine can be configured to access a look-up table 801 to determine the corresponding block of data at block 912. Further, in some embodiments, the data management and translation module or engine can be configured retrieve a corresponding unique data block from the CESSP 805 at block 914.

In some embodiments, one or more processes illustrated in blocks 906, 908, 910, 912, and 914 can be optional. For example, in some embodiments, once the data management and translation module or engine retrieves a first pointer from the LEM 803 at block 906, the data management and translation module or engine can then directly go to the CESSP 805 to retrieve the corresponding unique block of data at block 914. In some embodiments, once the data management and translation module or engine retrieves the first pointer from the LEM 803 at block 906, the data management and translation module or engine can use the first pointer to determine a data block corresponding to that pointer from a look-up table 801 at block 912.

In some embodiments, once the data management and translation module or engine retrieves the first pointer from the LEM 803 at block 906, the data management and translation module or engine can retrieve a corresponding bit marker at block 910, which can then be used to further retrieve the corresponding block of data. Also, in some embodiments, once the data management and translation module or engine retrieves the first pointer from the LEM 803 at block 906, the data management and translation module or engine can retrieve another pointer at block 908 that can be used to subsequently retrieve the corresponding block of raw data. In some embodiments, the data management and translation module or engine can be configured to directly use a bit marker to retrieve a corresponding raw data block, for example from look-up table as in block 912 or from the CESSP at block 914, without using or retrieving any pointers at all.

In some embodiments, one or more processes illustrated in and described in connection with blocks 906, 908, 910, 912, and 914 can be repeated for each bit marker and/or pointer for the raw data that was requested. In some embodiments, at block 916, the data management and translation module or engine reconstructs the requested raw data by combining the raw data blocks that were retrieved from the RAM, for example by utilizing one or more processes illustrated in and described in connection with blocks 906, 908, 910, 912, and 914. In some embodiments, the reconstructed raw data is then read by the host at block 918.

Example Embodiments

In some embodiments, a computer system comprises: a processor; a random access memory storage; a first and second backup energy source devices electrically connected to the processor and the random access memory storage; the processor electrically connected to the random access memory storage; the processor is configured to store data in the random access memory, wherein the stored data in the random access memory is lost when power is not supplied to the random access memory storage; the processor and the random access memory storage are configured to process data without accessing a conventional storage device; the first backup energy source device configured provide power to the processor and the random access memory storage based on determining that power from a main energy source has been interrupted; the second backup energy source device configured provide power to the processor and the random access memory storage based on determining that power from the first backup energy source device has been interrupted; and the first and second backup energy source devices configured to provide power to the processor and the random access memory storage to allow the processor to continue processing data and to prevent data lost in the random access memory storage when power from the main energy source has been interrupted.

In some embodiments, the processor is configured to store data in the random access memory using bit markers. In some embodiments, the first and second backup energy sources are lead acid batteries. In some embodiments, the first and second backup energy sources are uninterruptible power supplies. In some embodiments, the first and second backup energy sources are supercapacitors. In some embodiments, the first and second backup energy sources are configured to supply sufficient power to the processor and the random access memory to continue working until power from the main energy source is restored. In some embodiments, the first and second backup energy sources are configured to supply sufficient power to the processor and the random access memory in order for the processor to copy all data stored on the random access memory to the conventional storage device. In some embodiments, the conventional storage device is a hard disk drive or solid state drive. In some embodiments, the first and second backup energy sources are configured to supply sufficient power to the processor and the random access memory for a period of time.

In some embodiments, a specialized computer architecture computing system comprises: a processor; a random access memory storage; the processor electrically connected to the random access memory storage; the specialized computer architecture computing system configured to enable an equivalent storage capacity in the random access memory similar to that of a conventional storage device in a conventional computing system to allow the computing system to operate and process data using only the processor and the random access memory while not requiring use of a conventional storage device.

In some embodiments of the specialized computer architecture computing system, the equivalent storage capacity is at least 300 gigabytes and wherein the random access memory is configured to actually store less than 300 gigabytes. In some embodiments of the specialized computer architecture computing system, the equivalent storage capacity is at least 600 gigabytes and wherein the random access memory is configured to actually store less than 600 gigabytes. In some embodiments of the specialized computer architecture computing system, the equivalent storage capacity is at least 1 terabyte and wherein the random access memory is configured to actually store less than 1 terabyte.

In some embodiments, a computing system comprises: a processor; a random access memory storage; a conventional storage device, wherein the conventional storage device is hard disk drive or a solid state disk; the processor electrically connected to the random access memory storage and the conventional storage device; the processor configured to primarily store data in the random access memory using bit markers, wherein the stored data in the random access memory is lost when power is not supplied to the random access memory storage; the processor configured to process data by only reading and writing data from and to the random access memory; the processor configured to only copy data from the random access memory storage to store as a backup in the conventional storage device, the bit markers configured to enable storage of more data in the random access memory than storage of data in the random access memory without the use of bit markers.

In some embodiments, a computing system comprises: a first computing system having: a first processor; a first random access memory storage; the first processor electrically connected to the first random access memory storage; the first processor configured to primarily store data in the first random access memory, the first processor configured to use bit markers to store data in the first random access memory, wherein the stored data in the first random access memory is lost when power is not supplied to the first random access memory storage; the first processor and the first random access memory storage are configured to process data without accessing conventional storage, wherein conventional storage is a hard disk drive or solid state drive; and a second computing system having: a second processor; a second random access memory storage; the second processor electrically connected to the second random access memory storage; the second processor configured to primarily store data in the second random access memory, the second processor configured to use bit markers to store data in the second random access memory, wherein the stored data in the second random access memory is lost when power is not supplied to the second random access memory storage; the second processor and the second random access memory storage are configured to process data without accessing conventional storage; the first and second computing systems in electrical communication through a memory channel and an ethernet connection and a serial connection; the first computing system configured to mirror first data stored in the first random access memory storage into the second random access memory storage by transmitting data through the memory channel; the second computing system configured to mirror second data stored in the second random access memory storage into the first random access memory storage by transmitting data through the memory channel; the first computing system to take over the work of the second computing system by using the mirrored second data stored in the first random access memory storage when the second computing system malfunctions or is non-responsive; the first computer, before taking over the work of the second computer asserting a 'Kill' signal to the second computer system after it has been determined the second computer system is down or is not able to communicate over any of the redundant communications paths between the first computer and the second computer; the second computing system to take over the work of the first computing system by using the mirrored first data stored in the second random access memory storage when the first computing system malfunctions or is non-responsive.

In some embodiments of the foregoing computing system, the first computing system and the second computing system are configured to communicate with each other over a memory channel, Ethernet connection, or other data connection. In some embodiments of the foregoing computing system, the Kill function or signal removes all power from the second computer system and ensures the first computer can safely continue operating while taking on the work of the second computer system.

In some embodiments, a computing system comprises: a processor; a random access memory storage configured to store unique data vectors and not store non-unique data vectors; the processor electrically connected to the random access memory storage; the processor configured to receive a request for generating a disk partition (a physical disk to most OS), the request comprising a size of the disk partition and a file system type of the disk partition; the processor configured to determine whether the random access memory storage has capacity to create the requested disk partition, the determining based on a predicted available storage capacity of the random access memory storage, wherein the predicted available storage capacity is based at least in part on historical data and remaining free storage in the random access memory storage; the processor configured to generate a logical extended memory within the random access memory based on determining that the random access memory storage has capacity to create the requested disk partition, wherein the logical extended memory comprises a plurality of pointers that point to the unique data vectors stored in the random access memory, wherein the stored plurality of pointers represents encoded raw data stored in the disk partition.

In some embodiments, a computing system comprises: a processor; a random access memory storage; the processor electrically connected to the random access memory storage; the processor configured to access raw data and generate a plurality of data vectors from the raw data; the processor configured to determine that a first data vector is a unique data vector not stored in the random access memory storage; the processor, based on the determination that the first data vector is unique, configured to store the first data vector at a first memory location in the random access memory storage; the processor configured to generate a first memory pointer to the first memory location in the random access memory storage, and to store in the random access memory storage the first memory pointer to represent the first data vector in the raw data; the processor configured to determine that a second data vector is a non-unique data vector that is stored at a second memory location in the random access memory storage; the processor configured to generate a second memory pointer to the second memory location in the random access memory storage, and to store in the random access memory storage the second memory pointer to represent the second data vector in the raw data; the processor configured to determine that a third data vector is a non-unique data vector that is stored at the first memory location in the random access memory storage; the processor configured to generate a third memory pointer to the first memory location in the random access memory storage, and to store in the random access memory storage the third memory pointer to represent the third data vector in the raw data; the processor configured to access the first and second and third data vectors of the raw data by accessing the first and second and third memory pointers, wherein the processor is configured to access raw data entirely from the random access memory and without accessing a conventional storage device, wherein the conventional storage device is configured to only store a backup of data stored in the random access memory, wherein each data vector in the plurality of data vectors is only stored in the random access memory once.

In some embodiments of the foregoing computing system, the larger the memory, the larger the CESSP and therefore the larger the opportunity to house more applications in the same memory with greater and greater data reduction.

Computer System

Figure 10:
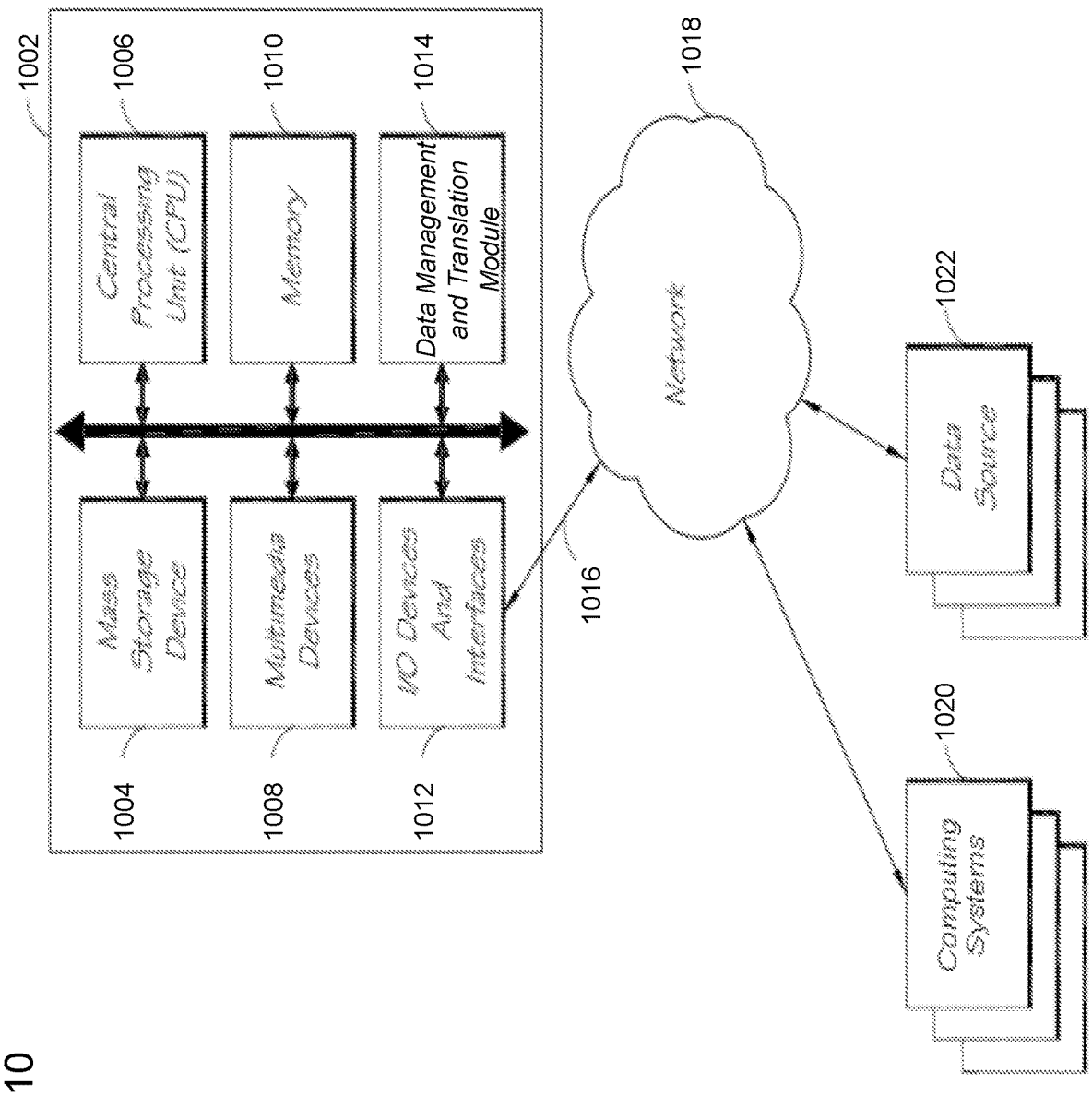
FIG. 10 is a schematic diagram depicting an embodiment(s) of a computer hardware system configured to run software for implementing one or more embodiments of RAM-based computer systems, devices, and methods.

In some embodiments, the systems, processes, and methods described herein are implemented using one or more computing systems, such as the one illustrated in FIG. 10. FIG. 10 is a schematic diagram depicting an embodiment(s) of a computer hardware system configured to run software for implementing one or more embodiments of RAM-based computer systems, devices, and methods. However, it is to be noted that some systems, processes, and methods described herein are implemented using one or more computing systems with a specialized computer system architecture as those described herein. In some embodiments, certain systems, processes, and methods described herein are implemented using a combination of one or more computing systems as those illustrated and described in connection with FIG. 10 and one or more computing systems with a specialized computer system architecture as those described herein. Furthermore, in some embodiments, certain systems, processes, and methods described herein are implemented using a computer system that comprises one or more features described in connection with FIG. 10 and one or more features of a specialized computing system architecture as described above.

Referring back to FIG. 10, the example computer system 1002 is in communication with one or more computing systems 1020 and/or one or more data sources 1022 via one or more networks 1018. While FIG. 10 illustrates an embodiment of a computing system 1002, it is recognized that the functionality provided for in the components and modules of computer system 1002 may be combined into fewer components and modules, or further separated into additional components and modules.

The computer system 1002 can comprise a data management and translation module 1014 that carries out the functions, methods, acts, and/or processes described herein. The data management and translation module 1014 is executed on the computer system 1002 by a central processing unit 1006 discussed further below.

In general the word "module," as used herein, refers to logic embodied in hardware or firmware or to a collection of software instructions, having entry and exit points. Modules are written in a program language, such as JAVA, C or C++, PYPHON or the like. Software modules may be compiled or linked into an executable program, installed in a dynamic link library, or may be written in an interpreted language such as BASIC, PERL, LUA, or Python. Software modules may be called from other modules or from themselves, and/or may be invoked in response to detected events or interruptions. Modules implemented in hardware include connected logic units such as gates and flip-flops, and/or may include programmable units, such as programmable gate arrays or processors.

Generally, the modules described herein refer to logical modules that may be combined with other modules or divided into sub-modules despite their physical organization or storage. The modules are executed by one or more computing systems, and may be stored on or within any suitable computer readable medium, or implemented in-whole or in-part within special designed hardware or firmware. Not all calculations, analysis, and/or optimization require the use of computer systems, though any of the above-described methods, calculations, processes, or analyses may be facilitated through the use of computers. Further, in some embodiments, process blocks described herein may be altered, rearranged, combined, and/or omitted.

The computer system 1002 includes one or more processing units (CPU) 1006, which may comprise a microprocessor. The computer system 1002 can further include one or more of a physical memory 1010, such as random access memory (RAM), a read only memory (ROM) for permanent storage of information, and a mass storage device 1004, such as a backing store, hard drive, rotating magnetic disks, solid state disks (SSD), flash memory, phase-change memory (PCM), 3D)(Point memory, diskette, or optical media storage device. Alternatively, the mass storage device may be implemented in an array of servers. Typically, the components of the computer system 1002 can be connected to the computer using a standards based bus system. The bus system can be implemented using various protocols, such as Peripheral Component Interconnect (PCI), Micro Channel, SCSI, Industrial Standard Architecture (ISA) and Extended ISA (EISA) architectures.

The computer system 1002 can include one or more input/output (I/O) devices and interfaces 1012, such as a keyboard, mouse, touch pad, and printer. The I/O devices and interfaces 1012 can include one or more display devices, such as a monitor, that allows the visual presentation of data to a participant. More particularly, a display device provides for the presentation of GUIs as application software data, and multi-media presentations, for example. The I/O devices and interfaces 1012 can also provide a communications interface to various external devices. The computer system 1002 may comprise one or more multi-media devices 1008, such as speakers, video cards, graphics accelerators, and microphones, for example.

The computer system 1002 may run on a variety of computing devices, such as a server, a Windows server, a Structure Query Language server, a Unix Server, a personal computer, a laptop computer, and so forth. In other embodiments, the computer system 1002 may run on a cluster computer system, a mainframe computer system and/or other computing system suitable for controlling and/or communicating with large databases, performing high volume transaction processing, and generating reports from large databases. The computing system 1002 is generally controlled and coordinated by an operating system software, such as z/OS, Windows, Linux, UNIX, BSD, SunOS, Solaris, MacOS, or other compatible operating systems, including proprietary operating systems. Operating systems control and schedule computer processes for execution, perform memory management, provide file system, networking, and I/O services, and provide a user interface, such as a graphical user interface (GUI), among other things.

The computer system 1002 illustrated in FIG. 10 is coupled to a network 1018, such as a LAN, WAN, or the Internet via a communication link 1016 (wired, wireless, or a combination thereof). Network 1018 communicates with various computing devices and/or other electronic devices. Network 1018 is communicating with one or more computing systems 1020 and one or more data sources 1022. The data management and translation module 1014 may access or may be accessed by computing systems 1020 and/or data sources 1022 through a web-enabled user access point. Connections may be a direct physical connection, a virtual connection, and other connection type. The web-enabled user access point may comprise a browser module that uses text, graphics, audio, video, and other media to present data and to allow interaction with data via the network 1018.

Access to the data management and translation module 1014 of the computer system 1002 by computing systems 1020 and/or by data sources 1022 may be through a web-enabled user access point such as the computing systems' 1020 or data source's 1022 personal computer, cellular phone, smartphone, laptop, tablet computer, e-reader device, audio player, or other device capable of connecting to the network 1018. Such a device may have a browser module that is implemented as a module that uses text, graphics, audio, video, and other media to present data and to allow interaction with data via the network 1018.

The output module may be implemented as a combination of an all-points addressable display such as a cathode ray tube (CRT), a liquid crystal display (LCD), a plasma display, or other types and/or combinations of displays. The output module may be implemented to communicate with input devices 1012 and they also include software with the appropriate interfaces which allow a user to access data through the use of stylized screen elements, such as menus, windows, dialogue boxes, toolbars, and controls (for example, radio buttons, check boxes, sliding scales, and so forth). Furthermore, the output module may communicate with a set of input and output devices to receive signals from the user.

The input device(s) may comprise a keyboard, roller ball, pen and stylus, mouse, trackball, voice recognition system, or pre-designated switches or buttons. The output device(s) may comprise a speaker, a display screen, a printer, or a voice synthesizer. In addition, a touch screen may act as a hybrid input/output device. In another embodiment, a user may interact with the system more directly such as through a system terminal connected to the score generator without communications over the Internet, a WAN, or LAN, or similar network.

In some embodiments, the system 1002 may comprise a physical or logical connection established between a remote microprocessor and a mainframe host computer for the express purpose of uploading, downloading, or viewing interactive data and databases on-line in real time. The remote microprocessor may be operated by an entity operating the computer system 1002, including the client server systems or the main server system, and/or may be operated by one or more of the data sources 1022 and/or one or more of the computing systems 1020. In some embodiments, terminal emulation software may be used on the microprocessor for participating in the micro-mainframe link.

In some embodiments, computing systems 1020 who are internal to an entity operating the computer system 1002 may access the data management and translation module 1014 internally as an application or process run by the CPU 1006.

The computing system 1002 may include one or more internal and/or external data sources (for example, data sources 1022). In some embodiments, one or more of the data repositories and the data sources described above may be implemented using a relational database, such as DB2, Sybase, Oracle, CodeBase, and Microsoft® SQL Server as well as other types of databases such as a flat-file database, an entity relationship database, and object-oriented database, and/or a record-based database.

The computer system 1002 may also access one or more databases 1022. The databases 1022 may be stored in a database or data repository. The computer system 1002 may access the one or more databases 1022 through a network 1018 or may directly access the database or data repository through I/O devices and interfaces 1012. The data repository storing the one or more databases 1022 may reside within the computer system 1002.

In some embodiments, one or more features of the systems, methods, and devices described herein can utilize a URL and/or cookies, for example for storing and/or transmitting data or user information. A Uniform Resource Locator (URL) can include a web address and/or a reference to a web resource that is stored on a database and/or a server. The URL can specify the location of the resource on a computer and/or a computer network. The URL can include a mechanism to retrieve the network resource. The source of the network resource can receive a URL, identify the location of the web resource, and transmit the web resource back to the requestor. A URL can be converted to an IP address, and a Domain Name System (DNS) can look up the URL and its corresponding IP address. URLs can be references to web pages, file transfers, emails, database accesses, and other applications. The URLs can include a sequence of characters that identify a path, domain name, a file extension, a host name, a query, a fragment, scheme, a protocol identifier, a port number, a username, a password, a flag, an object, a resource name and/or the like. The systems disclosed herein can generate, receive, transmit, apply, parse, serialize, render, and/or perform an action on a URL.

A cookie, also referred to as an HTTP cookie, a web cookie, an internet cookie, and a browser cookie, can include data sent from a website and/or stored on a user's computer. This data can be stored by a user's web browser while the user is browsing. The cookies can include useful information for web sites to remember prior browsing information, such as a shopping cart on an online store, clicking of buttons, login information, and/or records of web pages or network resources visited in the past. Cookies can also include information that the user enters, such as names, addresses, passwords, credit card information, etc. Cookies can also perform computer functions. For example, authentication cookies can be used by applications (for example, a web browser) to identify whether the user is already logged in (for example, to a web site). The cookie data can be encrypted to provide security for the consumer. Tracking cookies can be used to compile historical browsing histories of individuals. Systems disclosed herein can generate and use cookies to access data of an individual. Systems can also generate and use JSON web tokens to store authenticity information, HTTP authentication as authentication protocols, IP addresses to track session or identity information, URLs, and the like.

Although this invention has been disclosed in the context of some embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

Conditional language, such as, among others, "can," "could," "might," or "may," unless specifically stated otherwise, or otherwise understood within the context as used, is generally intended to convey that some embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. The headings used herein are for the convenience of the reader only and are not meant to limit the scope of the inventions or claims.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of a list of" items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present.

What is claimed is:

1. A computer-implemented method for writing data onto a random access memory of a computer system, the method comprising:
    intercepting, by a data management module of the computer system, a request to write raw data onto a conventional storage device from a host operating on the computer system;
    receiving, by the data management module of the computer system, the raw data of the request to write data onto the conventional storage device from the host operating on the computer system;
    dividing, by the data management module of the computer system, the raw data into a plurality of blocks of divided raw data, wherein the plurality of blocks of divided raw data comprises a first block of divided raw data and a second block of divided raw data;
    generating, by the data management module of the computer system, a plurality of bit markers corresponding to the plurality of blocks of divided raw data, wherein each of the plurality of bit markers are smaller in data size compared to each of the corresponding plurality of blocks of divided raw data, where the plurality of bit markers comprises a first bit marker corresponding to the first block of divided raw data and a second bit marker corresponding to the second block of divided raw data;
    determining, by the data management module of the computer system, whether the first bit marker and the second bit marker is pre-stored on a random access memory storage of the computer system;
    updating, by the data management module of the computer system, meta data of the first bit marker, wherein the first bit marker is determined to be pre-stored on the random access memory storage of the computer system;
    storing, by the data management module of the computer system, the second bit marker and the second block of divided raw data in the random access memory storage of the computer system, wherein the second bit marker is determined not to be pre-stored on the random access memory storage of the computer system; and
    generating, by the data management module of the computer system, a pointer comprising location data of where the second block of divided raw data is stored in the random access memory storage,
    wherein the computer system comprises the processor, the random access memory storage, and the conventional storage device,
    wherein the conventional storage device comprises a hard disk drive or a solid state drive, and
    wherein the conventional storage device is used by the computer system only to store back-up data of data stored in the random access memory storage.

2. The computer-implemented method of claim 1, wherein the host comprises a virtual machine operating on the computer system.

3. The computer-implemented method of claim 2, wherein the data management module is configured to intercept the request to write raw data onto the conventional storage device from the host without knowledge of an operating system of the host.

4. The computer-implemented method of claim 2, wherein the data management module is part of an operating system operating on the computing system.

5. The computer-implemented method of claim 2, wherein the data management module is separate from an operating system operating on the computing system.

6. The computer-implemented method of claim 1, wherein the second bit marker and the second block of divided raw data are stored in a capacity efficient shared storage pool (CESSP) of the random access memory storage, wherein the CESSP comprises all unique blocks of divided raw data stored on the random access memory storage.

7. The computer-implemented method of claim 1, wherein the second bit marker and the second block of divided raw data are stored in a table of the random access memory storage, wherein the table comprises mapping data of all bit markers and all corresponding unique blocks of divided raw data stored on the random access memory storage.

8. The computer-implemented method of claim 1, wherein the pointer comprising location data of where the second block of divided raw data is stored in a logical extended memory (LEM) of the random access memory storage, wherein the LEM comprises a plurality of pointers representing a storage location of all unique blocks of divided raw data stored on the random access memory storage.

9. A computing system comprising:
a processor;
a random access memory storage;
a conventional storage device, wherein the conventional storage device is a hard disk drive or a solid state drive;
the processor electrically connected to the random access memory storage and the conventional storage device;
the processor configured to primarily store data in the random access memory storage using a plurality of bit markers stored in the random access memory storage;
the processor configured to process data by only reading and writing data from and to the random access memory storage;
the processor configured to only copy data from the random access memory storage to store as a backup in the conventional storage device,
the plurality of bit markers configured to enable storage of more data in the random access memory storage than storage of data in the random access memory storage without the use of the plurality of bit markers.

10. The computing system of claim 9, wherein the random access memory storage is further configured to store a plurality of unique blocks of data corresponding to the plurality of bit markers stored in the random access memory storage.

11. The computing system of claim 10, wherein the random access memory storage comprises a capacity efficient shared storage pool (CESSP) for storing the plurality of unique blocks of data corresponding to the plurality of bit markers stored in the random access memory storage.

12. The computing system of claim 10, wherein the random access memory storage comprises a table comprising mapping data of the plurality of unique blocks of data to the corresponding plurality of bit markers stored in the random access memory storage.

13. The computing system of claim 10, wherein the random access memory storage comprises a logical extended memory (LEM) comprising the plurality of bit markers and a plurality of pointers, wherein the plurality of pointers comprise location data of the plurality of unique blocks of data stored in the random access memory storage.

14. The computing system of claim 9, further comprising a data management module, wherein the data management module is configured to intercept and process read and write requests from the processor.

15. The computing system of claim 14, wherein the data management module is configured to divide raw data of a write request into a plurality of blocks of raw data and determine whether each of the plurality of blocks of raw data are pre-stored in the random access memory storage.

16. The computing system of claim 15, wherein the data management module is further configured to store in the random access memory a first block of raw data that was determined not to be pre-stored in the random access memory and assign a first bit marker corresponding to the first block of raw data.

17. The computing system of claim 16, wherein the data management module is further configured to retrieve a second bit marker from the random access memory corresponding to a second block of raw data that was determined to be pre-stored in the random access memory, wherein the second bit marker corresponds to the second block of raw data.

18. The computing system of claim 14, wherein the data management module is configured to intercept and process read and write requests without knowledge of an operating system operating on the computing system.

19. The computing system of claim 14, wherein the data management module is part of an operating system operating on the computing system.

20. The computing system of claim 14, wherein the data management module is separate from an operating system operating on the computing system.

* * * * *